US010438992B2

(12) United States Patent
Kim et al.

(10) Patent No.: US 10,438,992 B2
(45) Date of Patent: Oct. 8, 2019

(54) LIGHT-EMITTING ELEMENT AND LIGHT-EMITTING DIODE

(71) Applicant: SEOUL VIOSYS CO., LTD., Ansan-si (KR)

(72) Inventors: Jong Kyu Kim, Ansan-si (KR); So Ra Lee, Ansan-si (KR); Yeo Jin Yoon, Ansan-si (KR); Jae Kwon Kim, Ansan-si (KR); Joon Sup Lee, Ansan-si (KR); Min Woo Kang, Ansan-si (KR); Se Hee Oh, Ansan-si (KR); Hyun A Kim, Ansan-si (KR); Hyoung Jin Lim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/409,306

(22) Filed: Jan. 18, 2017

(65) Prior Publication Data
US 2017/0154921 A1 Jun. 1, 2017
US 2017/0365638 A9 Dec. 21, 2017

Related U.S. Application Data

(63) Continuation-in-part of application No. PCT/KR2016/001255, filed on Feb. 4, 2016.

(30) Foreign Application Priority Data

Feb. 13, 2015 (KR) .................... 10-2015-0022603
Feb. 17, 2015 (KR) .................... 10-2015-0023752
(Continued)

(51) Int. Cl.
*H01L 21/00* (2006.01)
*H01L 27/15* (2006.01)
(Continued)

(52) U.S. Cl.
CPC ............ *H01L 27/156* (2013.01); *H01L 33/08* (2013.01); *H01L 33/36* (2013.01); *H01L 33/38* (2013.01);
(Continued)

(58) Field of Classification Search
CPC ....... H01L 33/54; H01L 33/62; H01L 33/642; H01L 25/0753; H01L 2933/0075;
(Continued)

(56) References Cited

U.S. PATENT DOCUMENTS

2007/0138500 A1* 6/2007 Sakai .................. H01L 33/38
257/103
2008/0258156 A1* 10/2008 Hata .................. H01L 33/20
257/88
(Continued)

FOREIGN PATENT DOCUMENTS

JP 2002-094122 A 3/2002
KR 10-2013-0049896 A 5/2013
(Continued)

OTHER PUBLICATIONS

Park, H. L., Authorized Officer, Korean Intellectual Property Office, Written Opinion, International Application No. PCT/KR2016/001255, dated Jul. 22, 2016, 11 pages.
(Continued)

*Primary Examiner* — Charles D Garber
*Assistant Examiner* — Abdulfattah B Mustapha
(74) *Attorney, Agent, or Firm* — Perkins Coie LLP

(57) ABSTRACT

A light-emitting element includes a light-emitting structure including a first conductive semiconductor layer, a second conductive semiconductor layer, and an active layer interposed between the first conductive semiconductor layer and the second conductive semiconductor layer; a first contact electrode and a second contact electrode located on the
(Continued)

light-emitting structure, and respectively making ohmic contact with the first conductive semiconductor layer and the second conductive semiconductor layer; an insulation layer for covering a part of the first contact electrode and the second contact electrode so as to insulate the first contact electrode and the second contact electrode; a first electrode pad and a second electrode pad electrically connected to each of the first contact electrode and the second contact electrode; and a radiation pad formed on the insulation layer, and radiating heat generated from the light-emitting structure.

12 Claims, 35 Drawing Sheets

(30) Foreign Application Priority Data

| | | |
|---|---|---|
| Mar. 18, 2015 | (KR) | 10-2015-0037560 |
| May 27, 2015 | (KR) | 10-2015-0073596 |
| May 27, 2015 | (KR) | 10-2015-0073598 |
| Nov. 27, 2015 | (KR) | 10-2015-0167920 |

(51) Int. Cl.

| | |
|---|---|
| *H01L 33/08* | (2010.01) |
| *H01L 33/38* | (2010.01) |
| *H01L 33/58* | (2010.01) |
| *H01L 33/60* | (2010.01) |
| *H01L 33/64* | (2010.01) |
| *H01L 33/36* | (2010.01) |
| *H01L 33/62* | (2010.01) |

(52) U.S. Cl.
CPC ............ *H01L 33/58* (2013.01); *H01L 33/60* (2013.01); *H01L 33/62* (2013.01); *H01L 33/64* (2013.01); *H01L 2224/16225* (2013.01); *H01L 2224/32245* (2013.01); *H01L 2924/181* (2013.01); *H01L 2924/19107* (2013.01); *H01L 2933/0016* (2013.01)

(58) Field of Classification Search
CPC ..... H01L 2924/0002; H01L 2933/0066; H01L 2933/005; H01L 2924/00
See application file for complete search history.

(56) References Cited

U.S. PATENT DOCUMENTS

| | | | | |
|---|---|---|---|---|
| 2012/0074441 | A1* | 3/2012 | Seo | H01L 27/153 257/91 |
| 2014/0131657 | A1* | 5/2014 | Kim | H01L 33/06 257/13 |
| 2014/0183572 | A1* | 7/2014 | Kim | H01L 25/0753 257/88 |
| 2015/0041845 | A1 | 2/2015 | Schwarz et al. | |

FOREIGN PATENT DOCUMENTS

| | | |
|---|---|---|
| KR | 10-2014-0031729 A | 3/2014 |
| KR | 10-2014-0146354 A | 12/2014 |
| KR | 10-2015-0016830 A | 2/2015 |

OTHER PUBLICATIONS

Office Action in Korean Patent Application No. 10-2015-0167920, dated Nov. 4, 2016 (English translation only).

* cited by examiner

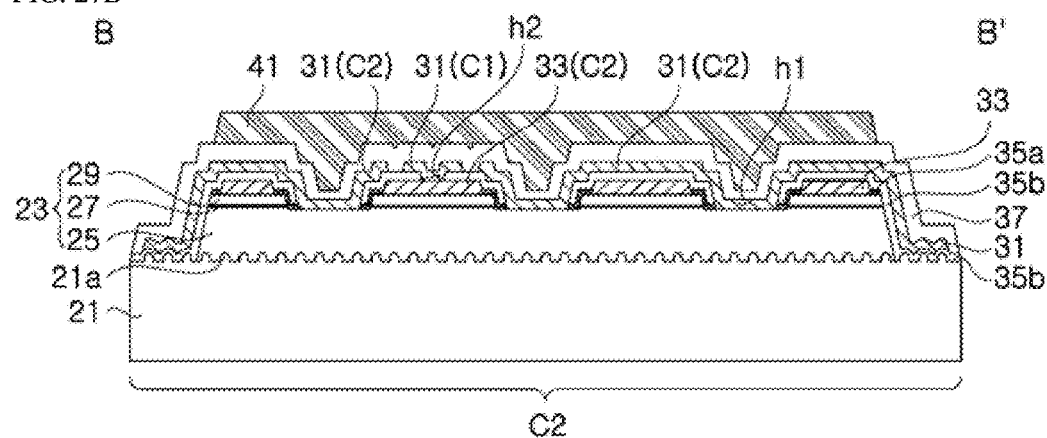
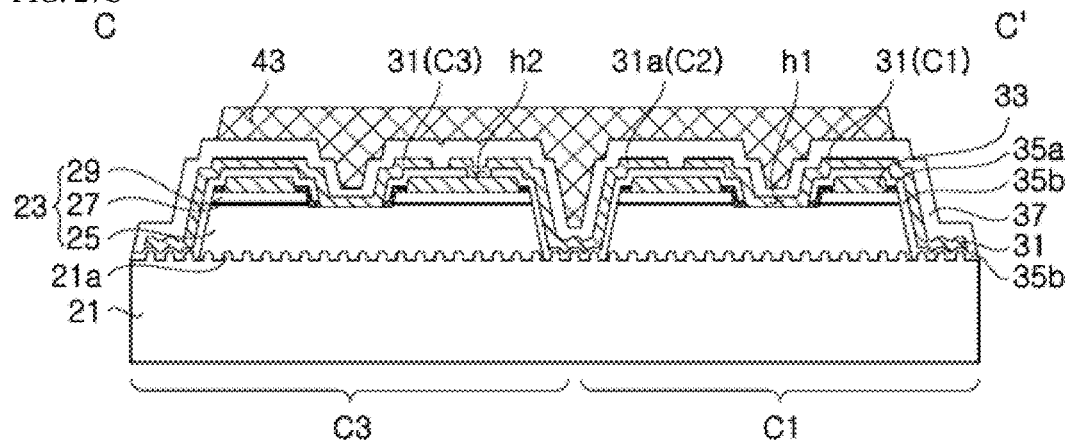

US 10,438,992 B2

LIGHT-EMITTING ELEMENT AND LIGHT-EMITTING DIODE

PRIORITY CLAIMS AND CROSS-REFERENCE TO RELATED APPLICATION

This patent document is a continuation-in-part of and claims priorities to, and benefits of, International Patent Application No. PCT/KR2016/001255, filed on Feb. 4, 2016, which claims priorities to, and benefits of, Korean Patent Application No. 10-2015-0022603, filed on Feb. 13, 2015, Korean Patent Application No. 10-2015-0023752, filed on Feb. 17, 2015, Korean Patent Application No. 10-2015-0037560, filed on Mar. 18, 2015, Korean Patent Application No. 10-2015-0073596, filed on May 27, 2015, Korean Patent Application No. 10-2015-0073598, filed on May 27, 2015, and Korean Patent Application No. 10-2015-0167920, filed on Nov. 27, 2015, which are hereby incorporated by reference for all purposes as if fully set forth herein.

TECHNICAL FIELD

Exemplary embodiments of the present document relate to a light emitting element or a light emitting diode. For example, some embodiments of the present document relate to a light emitting element having improved luminous efficacy and a light emitting diode.

BACKGROUND

With increasing demand for small, high-power light emitting elements, demand for flip-chip type large-area light emitting elements having good heat dissipation efficiency is also increasing. In a flip-chip type light emitting element, since electrodes are directly bonded to a secondary substrate, a wire for supply of external power source is not used, thereby providing better heat dissipation efficiency than a lateral type light emitting element. That is, since heat is transferred to the secondary substrate side even upon application of high density current to the flip-chip type light emitting element, the flip-chip type light emitting element can be used as a high power light source.

On the other hand, for miniaturization of light emitting elements, there is increasing demand for a chip-scale package which allows a light emitting element to be used as a package by eliminating a separate process of packaging the light emitting element in a housing. For the flip-chip type light emitting element, the electrodes act like leads of the package and thus can be advantageously applied to the chip-scale package.

In fabrication of a light emitting element using a chip-scale package, high density current can be applied to the chip-scale package. Recently, with increasing demand for high power products, drive current applied to the chip-scale package is also increasing. As the drive current applied to the chip-scale package increases, heat generated from a light emitting diode chip also increases, thereby causing thermal stress to the light emitting element. Moreover, junction temperature is also increased due to the increased heat, thereby causing deterioration in reliability of the light emitting element.

In addition, a light emitting element can be manufactured by disposing a plurality of chip-scale package type light emitting cells connected to each other in series or in parallel on a substrate. In the structure of the light emitting cell realized using the plurality of light emitting cells, a non-luminous region is formed between the light emitting cells, thereby causing poor luminous efficacy at the center of the light emitting element.

To fulfill recent demand for high power products, various studies for increasing luminous efficacy of the chip-scale package have been carried out. Even in the case of fabricating a light emitting element using plural light emitting cells, technology for maximizing luminous efficacy of the light emitting element is required.

In application of a plurality of light emitting elements connected to each other in series to a headlight of an automobile, relatively high voltage can be applied to opposite ends of the plurality of light emitting elements connected to each other in series. When the light emitting elements connected in series do not have forward voltage characteristics, an excessively high voltage can be applied to a light emitting diode having low forward voltage, whereby the light emitting element can exhibit low stability, thereby causing deterioration in product reliability.

SUMMARY

Exemplary embodiments disclosed in the present document provide a light emitting element, which is fabricated using a plurality of light emitting structures and secures good reliability and high luminous efficacy upon application of high power.

Exemplary embodiments disclosed in the present document provide a light emitting element, which includes a plurality of light emitting structures connected to each other in series and secures high intensity of light emitted from the center thereof, and a light emitting diode.

Exemplary embodiments disclosed in the present document provide a light emitting element which has improved current spreading performance.

In accordance with one exemplary embodiment of the present disclosure, a light emitting element includes: a light emitting structure including a first conductive type semiconductor layer, a second conductive type semiconductor layer, and an active layer interposed between the first conductive type semiconductor layer and the second conductive type semiconductor layer; a first contact electrode and a second contact electrode disposed on the light emitting structure and forming ohmic contact with the first conductive type semiconductor layer and the second conductive type semiconductor layer, respectively; an insulation layer partially covering the first contact electrode and the second contact electrode to insulate the first contact electrode and the second contact electrode; a first electrode pad and a second electrode pad electrically connected to the first contact electrode and the second contact electrode, respectively; and a heat dissipation pad formed on the insulation layer and dissipating heat from the light emitting structure, the heat dissipation pad having at least three planes exposed to the outside.

In some implementations, at least one of the first electrode pad and the second electrode pad may be formed on the insulation layer and disposed at one side on a surface of the insulation layer.

In some implementations, the first electrode pad and the second electrode pad may be separated from each other on the insulation layer, and the heat dissipation pad may be formed on the insulation layer to be disposed between the first and second electrode pads.

In some implementations, the light emitting element may include at least two first electrode pads and at least two second electrode pads, and the at least two first electrode pads and the at least two second electrode pads may be formed on the insulation layer to be separated from each other thereon.

In some implementations, the heat dissipation pad may be formed on the insulation layer to be disposed between the first electrode pad and the second electrode pad. Alternatively, the light emitting element may include at least two heat dissipation pads having at least three planes exposed to the outside. The at least two heat dissipation pads may be separated from each other.

In some implementations, the insulation layer may include a first insulation layer formed between the first and second contact electrodes to cover a portion of the second contact electrode, and having a first opening and a second opening partially exposing the first conductive type semiconductor layer and the second contact electrode, respectively; and a second insulation layer covering a portion of the first contact electrode partially covering the first insulation layer, and having a third opening and a fourth opening partially exposing the first contact electrode and the second contact electrode, respectively.

In some implementations, the first electrode pad may be electrically connected to the first contact electrode through the third opening and the second electrode pad may be electrically connected to the second contact electrode through the fourth opening.

In some implementations, the light emitting structure may include a plurality of holes partially exposing the first conductive type semiconductor layer and the first contact electrode may be electrically connected to the first conductive type semiconductor layer through the plurality of holes.

In some implementations, each of the first electrode pad and the second electrode pad may include at least one of Cu, Pt, Au, Ti, Ni, Al or Ag, and the heat dissipation pad may include at least one of Cu, Pt, Au, Ti, Ni, Al or Ag.

In accordance with one exemplary embodiment of the present disclosure, a light emitting element includes: a plurality of light emitting structures electrically connected to each other; a first electrode pad electrically connected to one of the light emitting structures; a second electrode pad electrically connected to another light emitting structure among the plurality of light emitting structures; and a heat dissipation pad formed on the plurality of light emitting structures and dissipating heat from the plurality of light emitting structures, the heat dissipation pad having at least three surfaces exposed to the outside.

In some implementations, the light emitting structure may include: a first conductive type semiconductor layer; a second conductive type semiconductor layer; an active layer interposed between the first conductive type semiconductor layer and the second conductive type semiconductor layer; a first contact electrode and a second contact electrode disposed on the second conductive type semiconductor layer and forming ohmic contact with the first conductive type semiconductor layer and the second conductive type semiconductor layer, respectively; and an insulation layer partially covering the first contact electrode and the second contact electrode to insulate the first contact electrode and the second contact electrode.

In some implementations, the first electrode pad and the second electrode pad may be electrically connected to the first contact electrode and the second contact electrode, respectively, and the first and second electrode pads and the heat dissipation pad may be formed on the insulation layer. The plurality of light emitting structures may be connected to each other in series.

In some implementations, a cross-sectional area of the heat dissipation pad may be 50% or more the cross-sectional area of the light emitting element in a plan view.

In accordance with one exemplary embodiment of the present disclosure, a light emitting element includes: a first light emitting cell; one or more second light emitting cells disposed coplanar with the first light emitting cell; a first electrode pad formed on the first light emitting cell or on the second light emitting cells, and electrically connected to the first light emitting cell and one of the second light emitting cells; and a second electrode pad formed on the first light emitting cell or on the second light emitting cells, and electrically connected to the first light emitting cell and the other second light emitting cell, wherein the first light emitting cell is disposed at a center of the light emitting element and the second light emitting cells are disposed to surround the first light emitting cell.

In some implementations, the first light emitting cell and the second light emitting cells may be electrically connected to each other. The first light emitting cell and the second light emitting cells may be electrically connected to each other in series.

In some implementations, each of the first light emitting cell and the second light emitting cells may include: a light emitting structure including a first conductive type semiconductor layer, a second conductive type semiconductor layer and an active layer interposed between the first conductive type semiconductor layer and the second conductive type semiconductor layer; a first contact electrode and a second contact electrode disposed on the light emitting structure and forming ohmic contact with the first conductive type semiconductor layer and the second conductive type semiconductor layer, respectively; and an insulation layer partially covering the first contact electrode and the second contact electrode to insulate the first contact electrode and the second contact electrode, the first electrode pad and the second electrode pad being electrically connected to the first contact electrode and the second contact electrode, respectively.

In some implementations, at least one of the first electrode pad and the second electrode pad may be formed on the insulation layer. The insulation layer may include a first insulation layer formed between the first and second contact electrodes to cover a portion of the second contact electrode, and having a first opening and a second opening partially exposing the first conductive type semiconductor layer and the second contact electrode, respectively; and a second insulation layer covering a portion of the first contact electrode partially covering the first insulation layer, and having a third opening and a fourth opening partially exposing the first contact electrode and the second contact electrode, respectively.

In some implementations, the first electrode pad may be electrically connected to the first contact electrode through the third opening and the second electrode pad may be electrically connected to the second contact electrode through the fourth opening.

In some implementations, the light emitting structure may include a plurality of holes partially exposing the first conductive type semiconductor layer and the first contact electrode may be electrically connected to the first conductive type semiconductor layer through the plurality of holes.

In some implementations, each of the first electrode pad and the second electrode pad may include at least one of Cu, Pt, Au, Ti, Ni, Al and Ag. The first light emitting cell may have a circular shape or a polygonal shape having at least four angles.

In accordance with one exemplary embodiment of the present disclosure, a light emitting diode includes: a light emitting element including a first light emitting cell, one or more second light emitting cells disposed coplanar with the first light emitting cell, and first and second electrode pads electrically connected to the first light emitting cell and one and another light emitting cells among the second light emitting cells, respectively; and a lens dispersing light emitted from the light emitting element, wherein the first light emitting cell is disposed at the center of the light emitting element and the second light emitting cells are disposed to surround the first light emitting cell.

In some implementations, the lens may include a lower surface defining a light incidence plane on which light is incident; and an upper surface having a circular or modified circular cross-sectional curvature and defining a light exit plane. The lens may include a lower surface defining a light incidence plane on which light is incident; an upper surface reflecting the incident light; and a side surface formed between the lower surface and the upper surface and allowing the light reflected by the upper surface to exit therethrough.

In some implementations, the first light emitting cell and the second light emitting cells may be electrically connected to each other and the first light emitting cell may have a circular shape or a polygonal shape having at least four angles.

In accordance with one exemplary embodiment of the present disclosure, a light emitting element includes: a first light emitting cell; one or more second light emitting cells disposed coplanar with the first light emitting cell and electrically connected to the first light emitting cell; a first electrode pad formed on the first light emitting cell or the second light emitting cells and electrically connected to the first light emitting cell and one of the second light emitting cells; a second electrode pad formed on the first light emitting cell or the second light emitting cells and electrically connected to the first light emitting cell and another second light emitting cell among the second light emitting cells; and a heat dissipation pad formed on the first light emitting cell and the second light emitting cells and dissipating heat from the first light emitting cell and the second light emitting cells, wherein the first light emitting cell is disposed at the center of the light emitting element and the second light emitting cells are disposed to surround the first light emitting cell.

In some implementations, the heat dissipation pad may have at least three planes exposed to the outside.

In some implementations, each of the first light emitting cell and the second light emitting cells may include: a light emitting structure including a first conductive type semiconductor layer, a second conductive type semiconductor layer and an active layer interposed between the first conductive type semiconductor layer and the second conductive type semiconductor layer; a first contact electrode and a second contact electrode disposed on the light emitting structure and forming ohmic contact with the first conductive type semiconductor layer and the second conductive type semiconductor layer, respectively; and an insulation layer partially covering the first contact electrode and the second contact electrode to insulate the first contact electrode and the second contact electrode, the first electrode pad and the second electrode pad being electrically connected to the first contact electrode and the second contact electrode, respectively.

In some implementations, the insulation layer may include a first insulation layer formed between the first and second contact electrodes to cover a portion of the second contact electrode, and having a first opening and a second opening partially exposing the first conductive type semiconductor layer and the second contact electrode, respectively; and a second insulation layer covering a portion of the first contact electrode partially covering the first insulation layer, and having a third opening and a fourth opening partially exposing the first contact electrode and the second contact electrode, respectively.

In some implementations, at least one of the first electrode pad, the second electrode pad and the heat dissipation pad may be formed on the second insulation layer, the first electrode pad may be electrically connected to the first contact electrode through the third opening, and the second electrode pad may be electrically connected to the second contact electrode through the fourth opening.

In some implementations, each of the first electrode pad, the second electrode pad and the heat dissipation pad may include at least one of Cu, Pt, Au, Ti, Ni, Al and Ag.

In some implementations, the first electrode pad, the second electrode pad and the heat dissipation pad may be separated from one another, and the first light emitting cell may have a circular shape or a polygonal shape having at least four angles.

In accordance with one exemplary embodiment of the present disclosure, a light emitting diode includes: a light emitting element including a first light emitting cell, one or more second light emitting cells disposed coplanar with the first light emitting cell, and first and second electrode pads electrically connected to the first light emitting cell and one and another light emitting cell among the second light emitting cells, respectively, and a heat dissipation pad formed on the first light emitting cell and the second light emitting cells to dissipate heat from the light emitting cells; and a printed circuit board on which the light emitting element is mounted, the printed circuit board including a board body dissipating heat transferred through the heat dissipation pad; and a lead portion formed on the board body and electrically connected to the first and second electrode pads.

In some implementations, the board body may contact the heat dissipation pad and the printed circuit board may further include a dissipation portion formed on the board body and contacting the heat dissipation pad.

In some implementations, the lead portion and the dissipation portion may be insulated from each other.

In some implementations, the printed circuit board may further include an insulation portion interposed between the board body and the lead part.

In some implementations, the light emitting diode may further include a lens disposed above the light emitting element and dispersing light emitted from the light emitting element, wherein the lens may include a phosphor converting a wavelength of the light emitted from the light emitting element.

In accordance with one exemplary embodiment of the present disclosure, a light emitting element includes: a first light emitting cell; a second light emitting cell disposed coplanar with the first light emitting cell and electrically connected to the first light emitting cell; a third light emitting cell disposed coplanar with the first and second light emitting cells and electrically connected to the second light emitting cell; a first electrode connection electrically connecting the first light emitting cell to the second light emitting cell; and a second electrode connection electrically connecting the second light emitting cell to the third light emitting cell, wherein the first electrode connection and the second electrode connection are disposed in a diagonal direction with reference to the second light emitting cell, are disposed on the second light emitting cell and the third light emitting cell, respectively, and cover side surfaces of the second and third light emitting cells.

In some implementations, the first electrode connection and the second electrode connection may be disposed on different sides with reference to the second light emitting cell, respectively.

In some implementations, the first electrode connection may be placed at a corner of one surface of the second light emitting cell and the second electrode connection may be placed at a corner of a surface adjacent to the one surface of the second light emitting cell.

In some implementations, the first electrode connection may be disposed on the second light emitting cell and the second electrode connection may be disposed on the third light emitting cell.

In some implementations, each of the first to third light emitting cells may include: a light emitting structure including a first conductive type semiconductor layer, a second conductive type semiconductor layer, and an active layer interposed between the first conductive type semiconductor layer and the second conductive type semiconductor layer; a first contact electrode and a second contact electrode disposed on the light emitting structure and forming ohmic contact with the first conductive type semiconductor layer and the second conductive type semiconductor layer, respectively; and an insulation layer partially covering the first contact electrode and the second contact electrode to insulate the first contact electrode and the second contact electrode.

In some implementations, the insulation layer may include a first insulation layer covering the second contact electrode and having a first opening and a second opening partially exposing the first conductive type semiconductor layer and the second contact electrode, respectively; and a second insulation layer covering the first contact electrode covering the first insulation layer, and having a third opening and a fourth opening partially exposing the first contact electrode and the second contact electrode, respectively.

In some implementations, the first opening may be provided in plural so as to allow the first contact electrode to form ohmic contact with the first conductive type semiconductor layer through a plurality of first openings, and each of the first and second electrodes connection may be formed between the plurality of first openings of the second and third light emitting cells.

In some implementations, the first insulation layer may include a pre-insulation layer partially covering an upper surface or a side surface of the light emitting structure; and a main insulation layer covering the pre-insulation layer and the second contact electrode.

In some implementations, the first contact electrode of the first light emitting cell may extend to an upper surface of the light emitting structure of the second light emitting cell to form ohmic contact with the second contact electrode.

In some implementations, the light emitting diode may further include a mesa including the second conductive type semiconductor layer and the active layer; and a third insulation layer partially covering an upper surface of the mesa.

In some implementations, the second contact electrode may form ohmic contact with the second conductive type semiconductor layer on the mesa.

In some implementations, the light emitting diode may further include a substrate disposed under the light emitting structure, and the substrate may include a plurality of patterns formed on an upper surface thereof.

In some implementations, the first contact electrode of the first light emitting cell may extend to an upper surface of the second light emitting cell to cover one side of the second light emitting cell, and the first contact electrode of the second light emitting cell may extend to an upper surface of the third light emitting cell to cover one side of the third light emitting cell.

In accordance with one exemplary embodiment of the present disclosure, a light emitting element includes: a first light emitting cell; a second light emitting cell disposed coplanar with the first light emitting cell and electrically connected to the first light emitting cell; and a plurality of electrode connections electrically connecting the first light emitting cell to the second light emitting cell, wherein the plurality of electrode connections extends from the first light emitting cell and is disposed on the second light emitting cell to cover a portion of an upper surface of the second light emitting cell, the plurality of electrode connections being disposed along one side of the second light emitting cell in a plan view.

In some implementations, the first and second light emitting cells may be disposed such that one side of the first light emitting cell is adjacent to one side of the second light emitting cell in the plan view.

In some implementations, the electrode connections may be arranged at the one side of the second light emitting cell facing the one side of the first light emitting cell.

In some implementations, the first light emitting cell and the second light emitting cell may be disposed such that one corner of the first light emitting cell is adjacent to one corner of the second light emitting cell in a plan view, and the electrode connections may extend from the first light emitting cell along the one side of the second light emitting cell.

In some implementations, each of the first and second light emitting cells may include a light emitting structure including a first conductive type semiconductor layer, a second conductive type semiconductor layer, and an active layer interposed between the first conductive type semiconductor layer and the second conductive type semiconductor layer; a first contact electrode and a second contact electrode disposed on the light emitting structure and forming ohmic contact with the first conductive type semiconductor layer and the second conductive type semiconductor layer, respectively; and an insulation layer partially covering the first contact electrode and the second contact electrode to insulate the first contact electrode and the second contact electrode.

In some implementations, the insulation layer may include a first insulation layer covering the second contact electrode and having a first opening and a second opening partially exposing the first conductive type semiconductor layer and the second contact electrode, respectively; and a second insulation layer covering the first contact electrode covering the first insulation layer, and having a third opening and a fourth opening partially exposing the first contact electrode and the second contact electrode, respectively.

In some implementations, the first insulation layer may include a pre-insulation layer partially covering an upper surface or a side surface of the light emitting structure; and a main insulation layer covering the pre-insulation layer and the second contact electrode.

In some implementations, the first contact electrode of the first light emitting cell may extend to an upper surface of the light emitting structure of the second light emitting cell and form ohmic contact with the second contact electrode.

In some implementations, each of the first and second light emitting cells may further include a mesa including the second conductive type semiconductor layer and the active layer, and the first insulation layer may include a pre-insulation layer partially covering an upper surface of the mesa.

In some implementations, the second contact electrode may form ohmic contact with the second conductive type semiconductor layer on the mesa.

In some implementations, the light emitting element may further include a substrate disposed under the light emitting structure, and the substrate may include a plurality of patterns formed on an upper surface thereof.

In some implementations, some patterns formed on the substrate and exposed instead of being covered by the light emitting structure may have a smaller size than the remaining patterns covered by the light emitting structure.

In accordance with one exemplary embodiment of the present disclosure, a light emitting element includes: a first light emitting cell; a second light emitting cell disposed coplanar with the first light emitting cell and adjacent thereto in a first direction; a plurality of contact holes disposed on the first light emitting cell and the second light emitting cell to be separated from each other; and a first electrode connection electrically connecting the first light emitting cell to the second light emitting cell, wherein the first electrode connection includes a first-1 electrode connection disposed on the first light emitting cell; a first-2 electrode connection disposed on the second light emitting cell; and a first intermediate connection interposed between the first light emitting cell and the second light emitting cell and connecting the first-1 electrode connection to the first-2 electrode connection, and wherein the first-1 electrode connection includes first-1 edge portions placed on an edge of a first side surface of the first light emitting cell adjacent to the second light emitting cell and on an edge of another side surface of the first light emitting cell adjacent to the first side surface thereof.

In some implementations, the first light emitting cell includes a first side surface adjacent to the second light emitting cell, a second side surface facing the first side surface, and a third side surface and a fourth side surface disposed between the first side surface and the second side surface and facing each other, and the first-1 edge portions may be restrictively placed on edges of the first side surface and the third side surface.

In some implementations, the first-1 electrode connection may include a plurality of first-1 branches extending from the first-1 edge portions, and the plurality of first-1 branches may include branches extending from the first-1 edge portion disposed at the third side surface towards the second side surface, branches extending from the first-1 edge portion disposed at the first side surface towards the second side surface, and first-1 branches extending from the first-1 edge portion disposed at the first side surface towards the fourth side surface.

In some implementations, the first-1 branches may be disposed parallel to each other and may be disposed between the contact holes on the first light emitting cell.

In some implementations, the light emitting element may further include a contact-hole connection connecting the contact holes arranged on the first light emitting cell to each other, and the contact-hole connection may include branches disposed between the first-1 branches and parallel to the first-1 branches.

In some implementations, the second light emitting cell may include a first side surface adjacent to the first light emitting cell, a second side surface facing the first side surface, a third side surface disposed between the first side surface and the second side surface and adjacent to the third side surface of the first light emitting cell, and a fourth side surface facing the third side surface, and the first-2 electrode connection may include first-2 edge portions disposed on edges at the first side surface of the second light emitting cell adjacent to the first light emitting cell and at the fourth side surface of the second light emitting cell.

In some implementations, the first-2 electrode connection may include a plurality of first-2 branches extending from the first-2 edge portions and the plurality of first-2 branches may be parallel to the plurality of first-1 branches.

In some implementations, each of the first-2 branches may connect the contact holes on the second light emitting cell to each other.

In some implementations, the light emitting element may further include: a third light emitting cell disposed coplanar with the second light emitting cell and adjacent thereto in a first direction; a plurality of contact holes disposed on the third light emitting cell to be separated from each other; and a second electrode connection electrically connecting the second light emitting cell to the third light emitting cell, wherein the second electrode connection includes a second-1 electrode connection disposed on the second light emitting cell; a second-2 electrode connection disposed on the third light emitting cell; and a second intermediate connection interposed between the second light emitting cell and the third light emitting cell and connecting the second-1 electrode connection to the second-2 electrode connection, and wherein the second-1 electrode connection includes second-1 edge portions placed on edges of the second side surface of the second light emitting cell adjacent to the third light emitting cell and of the third side surface of the second light emitting cell.

In some implementations, the second-1 electrode connection may include a plurality of second-1 branches extending from the second-1 edge portions and the second-1 branches may be parallel to the first-2 branches.

In some implementations, the third light emitting cell may include a first side surface adjacent to the second light emitting cell, a second side surface facing the first side surface, a third side surface disposed between the first side surface and the second side surface and adjacent to the third side surface of the second light emitting cell, and a fourth side surface facing the third side surface thereof, and the second-2 electrode connection may include second-2 edge portions placed on edges of the first side surface of the third light emitting cell adjacent to the second light emitting cell and of the fourth side surface of the third light emitting cell.

In some implementations, the second-2 electrode connection may include a plurality of second-2 branches extending from the second-2 edge portions and the plurality of second-2 branches may be parallel to the plurality of second-1 branches.

In some implementations, each of the second-2 branches may connect the contact holes on the third light emitting cell to each other.

In some implementations, the light emitting element may further include: a fourth light emitting cell including a lower semiconductor layer and an upper semiconductor layer, the fourth light emitting cell being disposed coplanar with the third light emitting cell and adjacent thereto in a first direction; a plurality of contact holes disposed on the fourth light emitting cell to be separated from each other; and a third electrode connection electrically connecting the third light emitting cell to the fourth light emitting cell, wherein the third electrode connection includes a third-1 electrode connection disposed on the third light emitting cell; a third-2 electrode connection disposed on the fourth light emitting cell; and a third intermediate connection interposed between the third light emitting cell and the fourth light emitting cell and connecting the third-1 electrode connection to the third-2 electrode connection, and wherein the third-1 electrode connection includes third-1 edge portions placed on edge of the second side surface of the third light emitting cell adjacent to the fourth light emitting cell and of the third side surface of the third light emitting cell.

In some implementations, the third-1 electrode connection may include a plurality of third-1 branches extending from the third-1 edge portions and disposed parallel to the second-2 branches, and the third-2 electrode connection may connect the contact holes on the fourth light emitting cell to each other while exposing the openings.

In some implementations, the light emitting element may further include: a first electrode pad and a second electrode pad, wherein the first electrode pad is electrically connected to the first conductive type semiconductor layer of the first light emitting cell and is disposed over the first and second light emitting cells, and the second electrode pad is electrically connected to the second conductive type semiconductor layer of the fourth light emitting cell and is disposed over the third and fourth light emitting cells.

In accordance with one exemplary embodiment of the present disclosure, a light emitting element includes: a first light emitting cell; a second light emitting cell disposed coplanar with the first light emitting cell and adjacent thereto in a first direction; a plurality of contact holes disposed on the first light emitting cell and the second light emitting cell and separated from each other; and a first electrode connection electrically connecting the first light emitting cell to the second light emitting cell, wherein the first electrode connection includes a first-1 electrode connection disposed on the first light emitting cell; a first-2 electrode connection disposed on the second light emitting cell; and a first intermediate connection interposed between the first light emitting cell and the second light emitting cell and connecting the first-1 electrode connection to the first-2 electrode connection, and wherein the first-1 electrode connection includes a plurality of first-1 branches parallel to each other and the first-2 electrode connection includes a plurality of first-2 branches parallel to each other, the first-1 branches being parallel to the first-2 branches, the first-1 branches and the first-2 branches being inclined with respect to the first direction and a direction perpendicular to the first direction.

In some implementations, the light emitting element may further include: a third light emitting cell disposed coplanar with the second light emitting cell and adjacent thereto in the first direction; a plurality of contact holes disposed on the third light emitting cell to be separated from each other; and a second electrode connection electrically connecting the second light emitting cell to the third light emitting cell, wherein the second electrode connection includes a second-1 electrode connection disposed on the second light emitting cell; a second-2 electrode connection disposed on the third light emitting cell; and a second intermediate connection interposed between the second light emitting cell and the third light emitting cell and connecting the second-1 electrode connection to the second-2 electrode connection, and wherein the second-1 electrode connection includes a plurality of second-1 branches parallel to each other and the second-2 electrode connection includes a plurality of second-2 branches parallel to each other, the second-1 branches are parallel to the second-2 branches, and the second-1 branches and the second-2 branches are parallel to the first-1 branches and the first-2 branches, respectively.

In some implementations, the light emitting element may further include: a fourth light emitting cell disposed coplanar with the third light emitting cell and adjacent thereto in the first direction; a plurality of contact holes disposed on the fourth light emitting cell to be separated from each other; and a third electrode connection electrically connecting the third light emitting cell to the fourth light emitting cell, wherein the third electrode connection includes a third-1 electrode connection disposed on the third light emitting cell; a third-2 electrode connection disposed on the fourth light emitting cell; and a third intermediate connection interposed between the third light emitting cell and the fourth light emitting cell and connecting the third-1 electrode connection to the third-2 electrode connection, and wherein the third-1 electrode connection includes a plurality of third-1 branches parallel to each other, and the third-1 branches are parallel to the second-1 branches and the second-2 branches.

In some implementations, the light emitting element may further include: a first electrode pad and a second electrode pad, wherein the first electrode pad is disposed over the first and second light emitting cells and the second electrode pad is disposed over the third and fourth light emitting cells.

According to exemplary embodiments, the light emitting element includes a heat dissipation pad configured to dissipate heat from a light emitting structure in addition to electrodes for supplying electric power to the light emitting structure, thereby enabling efficient heat dissipation from the light emitting element.

According to exemplary embodiments, the light emitting elements includes a plurality of light emitting structures, in which one light emitting structure is disposed at the center of the light emitting element and other light emitting structures are disposed around the light emitting structure disposed at the center of the light emitting element, thereby improving the intensity of light emitted from the center of the light emitting element.

According to exemplary embodiments, the light emitting element includes a plurality of light emitting cells electrically connected to each other through electrode connections disposed at different sides of the light emitting cells so as to allow electric current applied to the light emitting element to be uniformly distributed to the entirety of the light emitting cells, thereby maximizing luminous efficacy of the light emitting element.

According to exemplary embodiments, the light emitting element includes a first contact electrode electrically connecting the light emitting cells and extending towards a light emitting cell adjacent to the first contact electrode to be electrically connected to a second contact electrode of the adjacent light emitting cell so as to reflect light emitted from a space between the light emitting cells to the outside of the light emitting element, thereby maximizing luminous efficacy of the light emitting element.

According to exemplary embodiments, the light emitting element includes a plurality of light emitting cells electrically connected to each other through electrode connections, which include edge portions disposed on edges of two side surfaces of a first light emitting cell, thereby enabling uniform distribution of electric current over a wide area of the first light emitting cell.

In addition, branches of the electrode connections are parallel to each other on the first light emitting cell and the second light emitting cell while being inclined with respect to an arrangement direction of the light emitting cells, thereby improving current dispersion.

Furthermore, adjacent light emitting cells are connected to each other in series, whereby light emitting cells exhibiting similar luminous characteristics can be used in one light emitting element, thereby maintaining a constant forward voltage, and the edge portions and/or the branches are formed to achieve uniform dispersion of electric current to a plurality of light emitting cells, whereby the light emitting cells can have a constant forward voltage, thereby improving reliability of the light emitting element.

BRIEF DESCRIPTION OF DRAWINGS

FIGS. 27A-27C show cross-sectional views taken along lines A-A', B-B' and C-C' of FIG. 26.

DETAILED DESCRIPTION OF THE EXEMPLARY EMBODIMENTS

Figure 1:
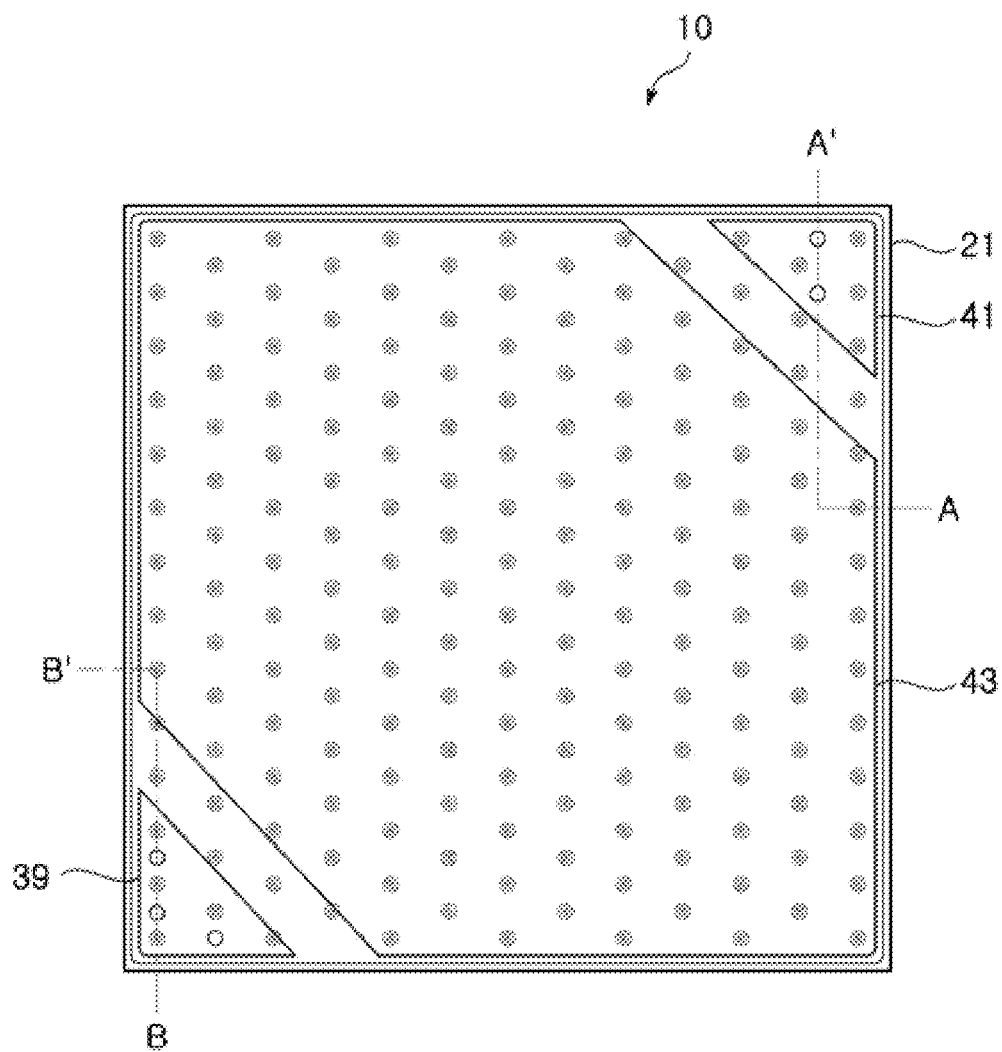
FIG. 1 is a bottom view of a light emitting element according to a first exemplary embodiment of the present document.

Hereinafter, exemplary embodiments of the present disclosure will be described in detail with reference to the accompanying drawings. The following embodiments are provided by way of example so as to facilitate the understanding of various embodiments of the present disclosure. Accordingly, the present disclosure is not limited to the embodiments disclosed herein and can also be implemented in different forms. When an element is referred to as being "disposed above" or "disposed on" another element, it can be directly "disposed above" or "disposed on" the other element, or intervening elements can be present. Throughout the specification, like reference numerals denote like elements having the same or similar functions. The term "exemplary" is used to mean "an example of" and does not necessarily mean an ideal or a best implementation.

Exemplary embodiments of the present disclosure will be described in detail with reference to the accompanying drawings.

Figure 2A:
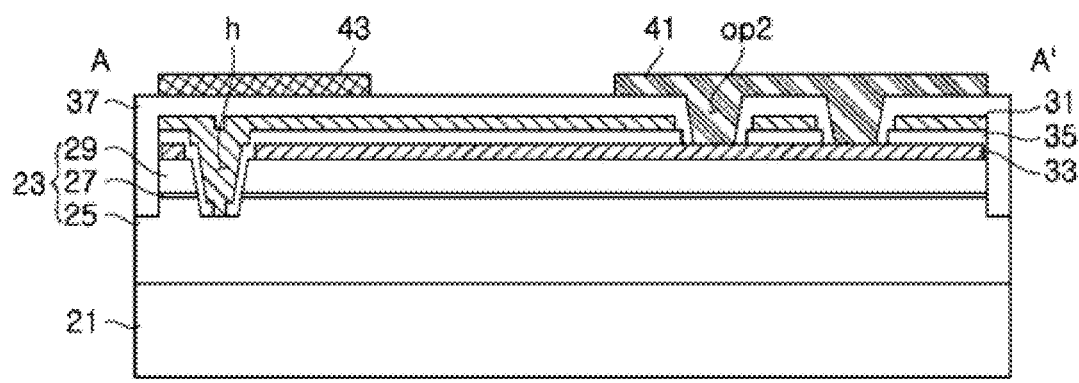
FIGS. 2A and 2B show cross-sectional views taken along lines A-A' and B-B' of FIG. 1.
Figure 2B:
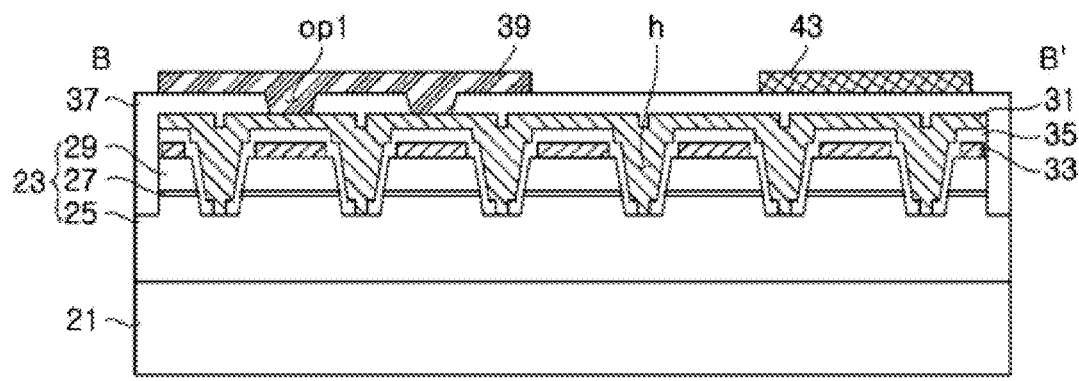

FIG. 1 is a bottom view of a light emitting element according to a first exemplary embodiment of the present disclosure, FIG. 2A is a cross-sectional view taken along line A-A' of FIG. 1, and FIG. 2B is a cross-sectional view taken along line B-B' of FIG. 1.

Referring to FIG. 1 and FIGS. 2A and 2B, the light emitting element 10 according to the first exemplary embodiment includes a light emitting structure 23, a first contact electrode 31, a second contact electrode 33, a first insulation layer 35, a second insulation layer 37, a first electrode pad 39, a second electrode pad 41, and a heat dissipation pad 43.

The light emitting structure 23 includes a first conductive type semiconductor layer 25, an active layer 27 disposed on the first conductive type semiconductor layer 25, and a second conductive type semiconductor layer 29 disposed on the active layer 27. The first conductive type semiconductor layer 25, the active layer 27 and the second conductive type semiconductor layer 29 may include a III-V based compound semiconductor, for example, a nitride semiconductor such as (Al, Ga, In)N.

The first conductive type semiconductor layer 25 may include an n-type dopant (for example, Si) and the second conductive type semiconductor layer 29 may include a p-type dopant (for example, Mg), or vice versa. The active layer 27 may include a multi-quantum well (MQW) structure and the composition ratio of the active layer may be determined so as to emit light in a desired wavelength range.

The light emitting structure 23 may include a partially exposed region of the first conductive type semiconductor layer 25 formed by partially removing the second conductive type semiconductor layer 29 and the active layer 27. That is, as shown in FIGS. 2A and 2B, a plurality of holes h may be formed through the second conductive type semiconductor layer 29 and the active layer 27 to expose the first conductive type semiconductor layer 25. Here, the shape and arrangement of the holes h may be modified in various ways. In the partially exposed region of the first conductive type semiconductor layer 25, a mesa including the second conductive type semiconductor layer 29 and the active layer 27 may be formed by partially removing the second conductive type semiconductor layer 29 and the active layer 27.

A growth substrate may be disposed under the first conductive type semiconductor layer 25 of the light emitting structure 23. The growth substrate may be any substrate which allows growth of the light emitting structure 23 thereon, and may include, for example, a sapphire substrate, a silicon carbide substrate, a silicon substrate, a gallium nitride substrate, or an aluminum nitride substrate. The growth substrate may be removed from the light emitting structure 23 using a technique known in the art, as needed. Although not shown in the drawings, the light emitting structure 23 may have a rough region formed on a lower surface thereof.

The first contact electrode 31 and the second contact electrode 33 may form ohmic contact with the first conductive type semiconductor layer 25 and the second conductive type semiconductor layer 29, respectively. The second contact electrode 33 is formed on an upper surface of the second conductive type semiconductor layer 29 to cover a portion or the entirety of the second conductive type semiconductor layer 29. The second contact electrode 33 is provided as a monolithic layer and is formed to cover the upper surface of the second conductive type semiconductor layer 29 excluding the exposed region of the first conductive type semiconductor layer 25. By the second contact electrode 33 formed as the monolithic layer, electric current can be uniformly supplied to an overall region of the light emitting structure 23, thereby improving current spreading efficiency. It should be understood that the second contact electrode 33 may include a plurality of unit electrodes, as needed.

The second contact electrode 33 may be formed of any material capable of forming ohmic contact with the second conductive type semiconductor layer 29 and may include, for example, at least one of a metallic material and a conductive oxide.

In the structure wherein the second contact electrode 33 includes a metallic material, the second contact electrode 33 may include a reflective layer (not shown) and a cover layer (not shown) covering the reflective layer. With this structure, light emitted from the light emitting structure 23 can be reflected by the second contact electrode 33. The reflective layer may include a metal having high reflectance and capable of forming ohmic contact with the second conductive type semiconductor layer 29. For example, the reflective layer may include at least one of Ni, Pt, PD, Rh, W, Ti, Al, Ma, Ag or Au, and may be composed of a single layer or multiple layers.

The cover layer can prevent inter-diffusion of materials between the reflective layer and other layers, and can prevent external materials from diffusing into and damaging the reflective layer. With the reflective layer contacting the second conductive type semiconductor layer 29, the cover layer may be formed to cover an upper surface and a side surface of the reflective layer. In the structure wherein the cover layer covers the side surface of the reflective layer, the cover layer and the second conductive type semiconductor layer 29 are electrically connected to each other such that the cover layer and the reflective layer can be used as contact electrodes. The cover layer may include at least one of, for example, Au, Ni, Ti or Cr, and may be composed of a single layer or multiple layers.

Each of the reflective layer and the cover layer may be formed by e-beam evaporation or plating.

In the structure wherein the second contact electrode 33 includes a conductive oxide, the conductive oxide may include ITO, ZnO, AZO, or IZO, and the like. The second contact electrode 33 including the conductive oxide may be formed to cover a larger area of the second conductive type semiconductor layer 29 than the second contact electrode including a metal. The structure wherein the second contact electrode 33 includes a conductive oxide has a shorter separation distance from the periphery of the exposed region of the first conductive type semiconductor layer 25 to the second contact electrode 33 than the structure wherein the second contact electrode 33 includes a metal. As a result, the shortest distance from a contact portion between the second contact electrode 33 and the second conductive type semiconductor layer 29 to a contact portion between the first contact electrode 31 and the first conductive type semiconductor layer 25 is relatively reduced, whereby the forward voltage Vf of the light emitting element 10 can be reduced.

The difference in the area of the second contact electrode 33 between the structure wherein the second contact electrode 33 includes the metallic material and the structure wherein the second contact electrode 33 includes the conductive oxide can be caused by a difference in fabrication method. For example, in use of the metallic material, since the second contact electrode 33 is formed by deposition or plating, a separation between outer peripheries of the second contact electrode 33 and the second conductive type semiconductor layer 29 is formed due to process margin of a mask. Conversely, the conductive oxide is formed over the entire region of the second conductive type semiconductor layer 29 and is then removed together with the second conductive type semiconductor layer 29 during etching to expose the first conductive type semiconductor layer 25. As a result, the conductive oxide can be formed closer to the outer periphery of the second conductive type semiconductor layer 29.

The first insulation layer 35 may be formed to partially cover an upper surface of the light emitting structure 23 and the second contact electrode 33. Further, the first insulation layer 35 may be formed to cover side surfaces of the holes h such that the first conductive type semiconductor layer 25 can be partially exposed through bottom surfaces of the holes h. Further, the first insulation layer 35 may be formed with at least one opening through which a portion of the second contact electrode 33 is exposed.

The first insulation layer 35 may include an insulation material, for example, $SiO_2$, $SiN_x$, or $MgF_2$, and the like. The first insulation layer 35 may be composed of multiple layers and may include a distributed Bragg reflector in which materials having different indices of refraction are alternately stacked.

In the structure wherein the second contact electrode 33 includes the conductive oxide, the first insulation layer 35 may include a distributed Bragg reflector to improve luminous efficacy of the light emitting element 10. Further, in the structure wherein the second contact electrode 33 includes the conductive oxide, the first insulation layer 35 is formed using a transparent insulation oxide (for example, $SiO_2$) to form an omnidirectional reflector by a stack structure of the second contact electrode 33, the first insulation layer 35 and the first contact electrode 31.

The first contact electrode 31 may be formed to cover the entirety of the first insulation layer 35 excluding a portion thereof in which the opening partially exposing the second contact electrode 33 is formed. As a result, the first insulation layer 35 may be partially interposed between the first contact electrode 31 and the second contact electrode 33.

Although not shown in FIGS. 2A and 2B, the first insulation layer 35 may also be formed to cover a portion of a side surface of the light emitting structure 23. This structure of the first insulation layer 35 can vary depending upon chip unit isolation in fabrication of the light emitting element 10. When the first insulation layer 35 is formed after chip unit isolation of a wafer in fabrication of the light emitting element 10, the side surface of the light emitting structure 23 can also be covered by the first insulation layer 35.

The first contact electrode 31 is formed to partially cover the light emitting structure 23. The first contact electrode 31 is formed to fill the holes h, thereby forming ohmic contact with the first conductive type semiconductor layer 25 not covered by the first insulation layer 35 placed corresponding to the holes h. In the first exemplary embodiment, the first contact electrode 31 may be formed to cover the entirety of the first insulation layer 35 excluding a portion of the first insulation layer 35. With this structure, light emitted from the light emitting structure 23 can be reflected by the first contact electrode 31, and a first contact layer and a second contact layer can be electrically insulated from each other by the first insulation layer 35.

The first contact electrode 31 is formed to cover the entire upper surface of the light emitting structure 23 excluding some regions, thereby further improving current spreading efficiency of the light emitting element. Further, the first contact electrode 31 may also cover a portion of the light emitting structure not covered by the second contact electrode 33, thereby improving luminous efficacy of the light emitting element 10 through more effective reflection of light.

The first contact electrode 31 serves to form ohmic contact with the first conductive type semiconductor layer 25 while reflecting light. Thus, the first contact electrode 31 may include a highly reflective metal layer such as an Al layer and may be composed of a single layer or multiple layers. Here, the highly reflective metal layer may be formed on a contact layer such as a Ti, Cr or Ni layer, and the first contact electrode 31 may include at least one of Ni, Pt, Pd, Rh, W, Ti, Al, Mg, Ag, or Au.

As in the first insulation layer 35, the first contact electrode 31 may be formed to cover a portion of the side surface of the light emitting structure 23. In the structure wherein the first contact electrode 31 is also formed on the side surface of the light emitting structure 23, the first contact electrode 31 reflects light emitted from the active layer 27 to the side surface of the light emitting structure, thereby improving luminous efficacy of the light emitting element 10. In the structure wherein the first contact electrode 31 is formed to cover a portion of the side surface of the light emitting structure 23, the first insulation layer 35 may be interposed between the light emitting structure 23 and the first contact electrode 31.

The second insulation layer 37 is formed to cover the entire region of the first contact electrode 31 excluding some regions thereof. The second insulation layer 37 may be formed with a first opening op1 that partially exposes the first contact electrode 31 and a second opening op2 that partially exposes the second contact electrode 33. Here, the second insulation layer 37 may include one or more first openings op1 and one or more second openings op2.

The second insulation layer 37 may include an insulation material, for example, $SiO_2$, $SiN_x$, or $MgF_2$, and the like. The second insulation layer 37 may be composed of multiple layers and may include a distributed Bragg reflector in which materials having different indices of refraction are alternately stacked. In the structure wherein the second insulation layer 37 is composed of multiple layers, an uppermost layer of the second insulation layer 37 is formed of or includes $SiN_x$. The structure wherein the uppermost layer of the second insulation layer 37 is formed of or includes $SiN_x$ can more effectively prevent moisture penetration into the light emitting structure 23.

The first electrode pad 39 and the second electrode pad 41 may be disposed on the light emitting structure 23 and electrically connected to the first contact electrode 31 and the second contact electrode 33, respectively. The first electrode pad 39 directly contacts the first contact electrode 31 to be electrically connected thereto through the first openings op1, and the second electrode pad 41 directly contacts the second contact electrode 33 to be electrically connected thereto through the second openings op2.

Each of the first electrode pad 39 and the second electrode pad 41 has a thickness of dozens of micrometers, whereby the light emitting element 10 can be used as a chip-scale package.

Each of the first electrode pad 39 and the second electrode pad 41 may be composed of a single layer or multiple layers and may include an electrically conductive material. For example, each of the first electrode pad 39 and the second electrode pad 41 may include at least one of Cu, Pt, Au, Ti, Ni, Al or Ag, or may also include sintered metal particles and non-metallic materials interposed between metal particles. Here, the first electrode pad 39 and the second electrode pad 41 may be formed by plating, deposition, dotting, or screen-printing, and the like.

When the first electrode pad 39 and the second electrode pad 41 are formed by plating, a seed metal layer is formed over the first openings op1 and the second openings op2 by sputtering. The seed metal layer may include Ti, Cu, Au, or Cr, and the like, and can serve as an under bump metallization layer (UBM layer). For example, the seed metal layer may have a Ti/Cu stack structure. After the seed metal layer is formed, a mask is formed on the seed metal layer so as to cover a portion corresponding to a region, in which an insulation support will be formed, while opening regions in which the first and second electrode pads 39, 41 will be formed. Then, the first and second electrode pads 39, 41 are formed in the open regions of the mask through plating, followed by etching to remove the mask and the seed metal layer, thereby forming the first and second electrode pads 39, 41.

The following description will be given of forming the first and second electrode pads 39, 41 by screen-printing. The UBM layer is formed on at least some of the first openings op1 and the second openings op2 through deposition such as sputtering and patterning, or through deposition and lift-off. The UBM layer may be formed in regions in which the first and second electrode pads 39, 41 will be formed, and may include a Ti or TiW layer and a Cu, Ni, or Au or combination layer. For example, the UBM layer may have a Ti/Cu stack structure. Then, a mask is formed on the UBM layer so as to cover a portion corresponding to a region, in which an insulation support will be formed, while opening regions in which the first and second electrode pads 39, 41 will be formed. Thereafter, a material such as Ag pastes, Au pastes, or Cu pastes is printed in the open regions by screen-printing and is cured. Thereafter, the mask is removed by etching, thereby forming the first and second electrode pads 39, 41.

When the first and second electrode pads 39, 41 are formed by the methods as described above, the first and second electrode pads 39, 41 may be formed at corners of the light emitting structure 23, respectively, as shown in FIG. 1, in the first exemplary embodiment. Further, the sizes of the first electrode pad 39 and the second electrode pad 41 may be adjusted to form a space between the first and second electrode pads 39, 41. The sizes of the first electrode pad 39 and the second electrode pad 41 may be determined to have a predetermined area or less at the corners of the light emitting structure 23.

In the first exemplary embodiment, each of the first electrode pad 39 and the second electrode pad 41 may be formed in a triangular shape at the corresponding corner of the light emitting structure 23 and the heat dissipation pad 43 may be formed in a hexagonal shape between the first electrode pad 39 and the second electrode pad 41 on the upper surface of the light emitting structure 23.

The heat dissipation pad 43 may be formed on the upper surface of the light emitting structure 23 and contact the second insulation layer 37. The heat dissipation pad 43 may have the same thickness as the first and second electrode pads 39, 41, or may have a smaller thickness than the first and second electrode pads 39, 41. Further, the heat dissipation pad 43 may have a larger area than the first and second electrode pads 39, 41 in plan view and thus at least three sides of the heat dissipation pad 43 may be exposed to the outside, as shown in FIG. 1. For example, the heat dissipation pad may be formed to have an area occupying 50% or more of the area of the light emitting element in plan view and a large area of the heat dissipation pad can provide better heat dissipation efficiency.

In the first exemplary embodiment, since each of the first electrode pad 39 and the second electrode pad 41 is formed to have a predetermined area or less at the corresponding corner of the light emitting structure 23, the heat dissipation pad 43 may be formed in an overall region in which the first and second electrode pads 39, 41 are not formed. Here, the first and second electrode pads 39, 41 may be separated from the heat dissipation pad 43 by a predetermined distance or more. In some implementations, the heat dissipation pad 43 may be formed of or include the same material as the first and second electrode pads 39, 41, and the heat dissipation pad 43 may be separated from the first and second electrode pads 39, 41 to prevent electric current from flowing to the heat dissipation pad 43. Here, the shapes of the first and second electrode pads 39, 41 and the shape of the heat dissipation pad 43 are not limited to the shapes shown in the drawings, and may be changed in various ways, as needed.

Figures 3A, 3B:
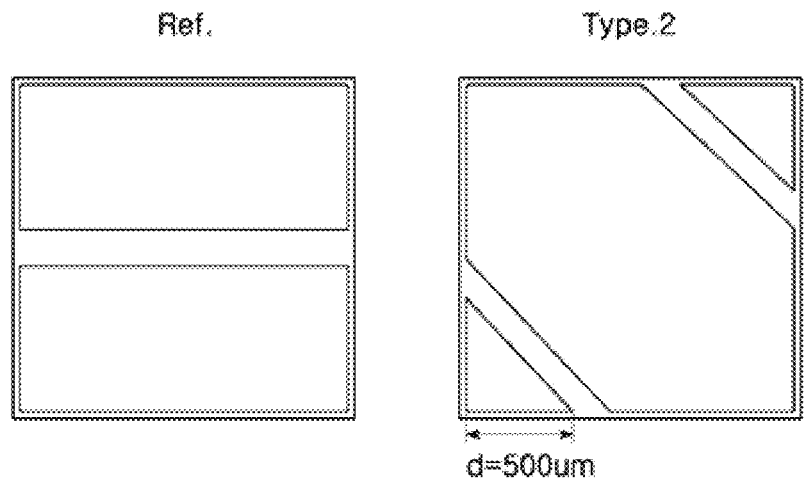
FIGS. 3A and 3B are bottom views of heat dissipation pads of a typical light emitting element and the light emitting element according to the first exemplary embodiment of the present disclosure.

FIGS. 3A and 3B are views illustrating a junction temperature depending upon the area of the heat dissipation pad 43 of the light emitting element 10 according to the first exemplary embodiment of the present disclosure.

FIG. 3A is a bottom view of a typical light emitting element and FIG. 3B is a bottom view of the light emitting element according to the first exemplary embodiment of the present disclosure, in which the light emitting element 10 includes the first electrode pad 39, the second electrode pad 41 and the heat dissipation pad 43. The typical light emitting element includes first and second electrode pads without including the heat dissipation pad 43, and the light emitting element according to the first exemplary embodiment includes the heat dissipation pad and the first and second electrode pads 39, 41, in which each side of each of the first and second electrode pads 39, 41 has a length of about 500 μm.

For comparison of the light emitting element according to the first exemplary embodiment with the typical light emitting element, current density and the maximum applicable current were measured, and it could be confirmed that the junction temperature of the light emitting element according to the first exemplary embodiment was decreased due to formation of the heat dissipation pad. With this structure, the light emitting element according to the first exemplary embodiment could secure stable reliability upon high current driving within a predetermined operation range.

Figure 4:
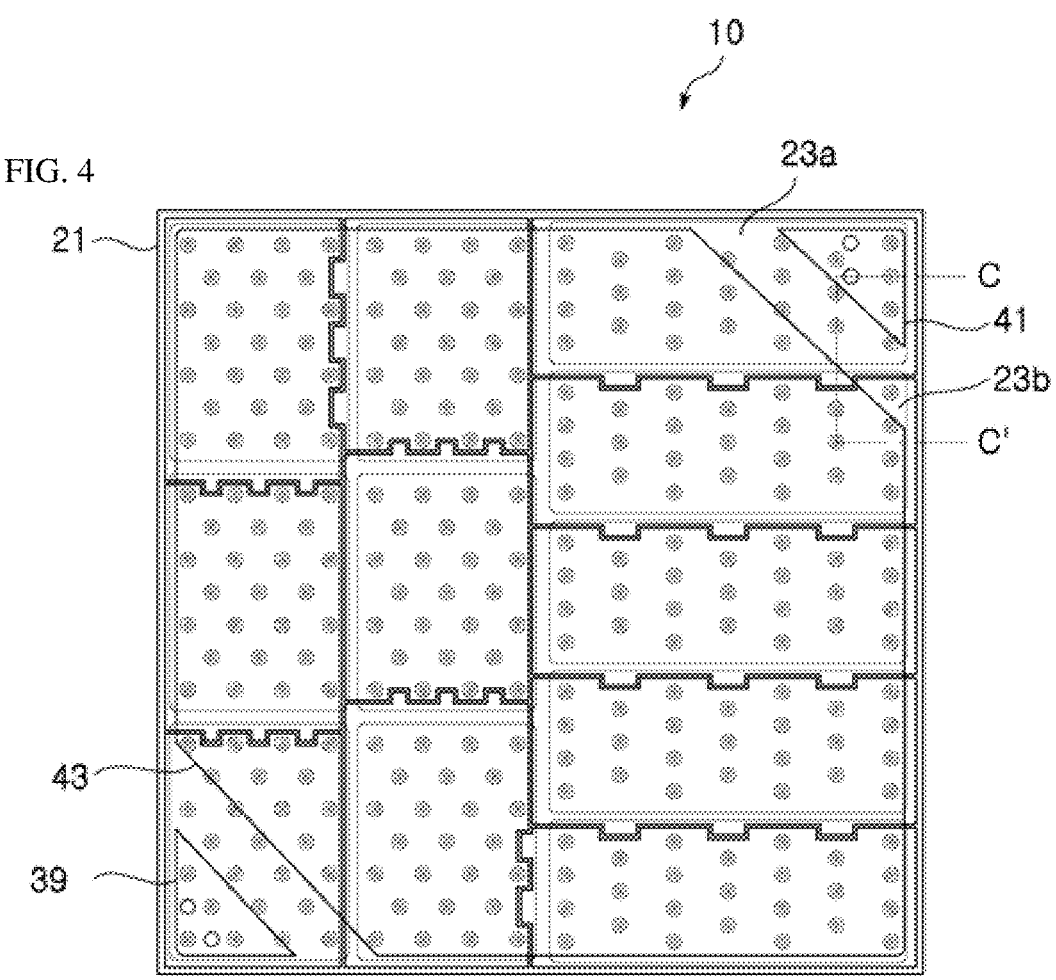
FIG. 4 is a bottom view of a light emitting element according to a second exemplary embodiment of the present disclosure.
Figure 5:
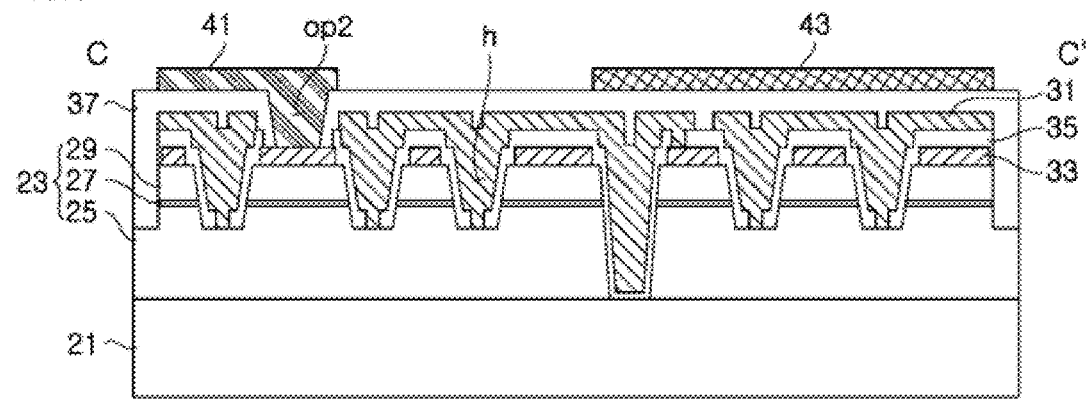
FIG. 5 is a cross-sectional view taken along line C-C' of FIG. 4.

FIG. 4 is a bottom view of a light emitting element according to a second exemplary embodiment of the present disclosure and FIG. 5 is a cross-sectional view taken along line C-C' of FIG. 4.

The light emitting element 10 according to the second exemplary embodiment of the present disclosure includes a light emitting structure 23, a first contact electrode 31, a second contact electrode 33, a first insulation layer 35, a second insulation layer 37, a first electrode pad 39, a second electrode pad 41, and a heat dissipation pad 43. In description of the light emitting element 10 according to the second exemplary embodiment, descriptions of the same components as those of the first exemplary embodiment will be omitted.

Referring to FIG. 4 and FIG. 5, the light emitting element 10 according to the second exemplary embodiment includes a plurality of light emitting structures 23a, 23b connected to each other in series. For easy understanding of this exemplary embodiment, the following description will focus on series connection between a first light emitting structure 23a and a second light emitting structure 23b. The first light emitting structure 23a and the second light emitting structure 23b are formed on a substrate 21 to be separated from each other, and the first insulation layer 35 and the first contact electrode 31 are formed in a space between the first light emitting structure 23a and the second light emitting structure 23b. The first and second light emitting structures 23a, 23b according to this exemplary embodiment are the same structure as those of the first exemplary embodiment.

With the plurality of light emitting structures 23a, 23b connected to each other in series, the second insulation layer 37 is formed to cover all of the light emitting structures 23a, 23b, and the first electrode pad 39, the second electrode pad 41 and the heat dissipation pad 43 are formed on the second insulation layer 37. Here, the first electrode pad 39 electrically contacts the first contact electrode 31 through the first openings op1 and the second electrode pad 41 electrically contacts the second contact electrode 33 through the second openings op2. The heat dissipation pad 43 is separated from the first and second electrode pads 39, 41 and is formed on the second insulation layer 37.

Although the plurality of light emitting structures 23a, 23b are illustrated as being connected to each other in series in the second exemplary embodiment, the plurality of light emitting structures 23a, 23b may be connected to each other in parallel or in series-parallel.

Figure 6:
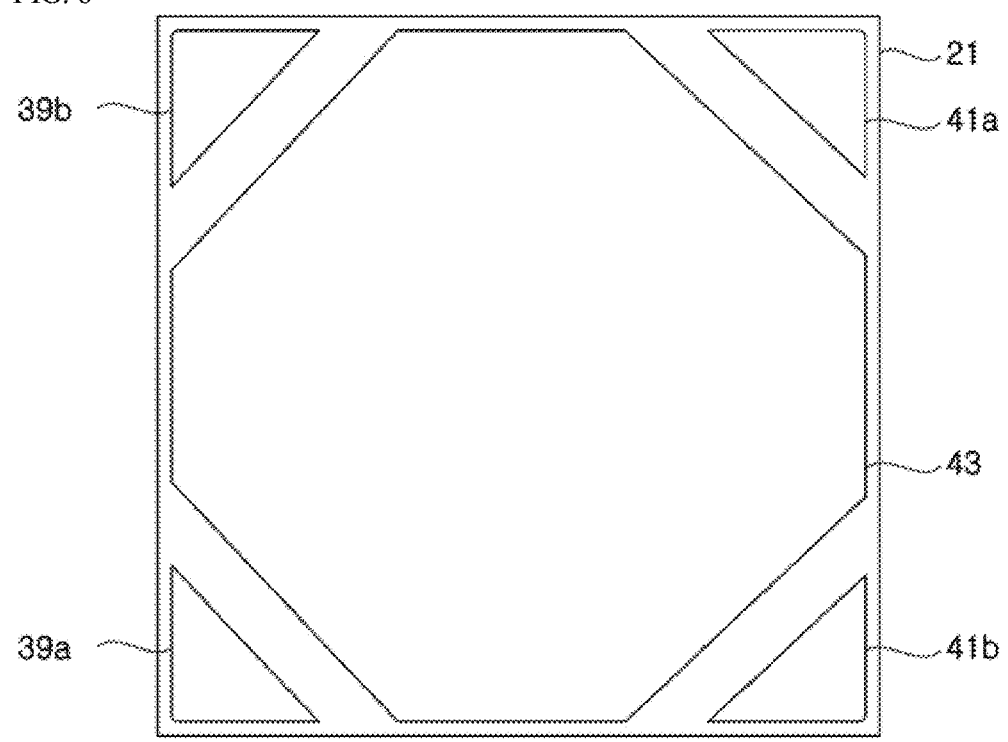
FIG. 6 is a bottom view of a light emitting element according to a third exemplary embodiment of the present disclosure.

FIG. 6 is a bottom view of a light emitting element according to a third exemplary embodiment of the present disclosure.

Referring to FIG. 6, the light emitting element 10 according to the third exemplary embodiment of the present disclosure includes a light emitting structure 23, a first contact electrode 31, a second contact electrode 33, a first insulation layer 35, a second insulation layer 37, first electrode pads 391, 39b, second electrode pads 41a, 41b, and a heat dissipation pad 43. In description of the light emitting element 10 according to the third exemplary embodiment, descriptions of the same components as those of the first exemplary embodiment will be omitted.

In the third exemplary embodiment, the light emitting element 10 includes a pair of first electrode pads 39a, 39b and a pair of second electrode pads 41a, 41b, in which each of the first and second electrode pads 39a, 39b, 41a, 41b is formed in a triangular shape at a corner of the light emitting structure 23. The heat dissipation pad 43 may be formed in an octagonal shape between the first and second electrode pads 39a, 39b, 41a, 41b. In this structure, four sides of the heat dissipation pad 43 having an octagonal shape are adjacent to the first and second electrode pads 39a, 39b, 41a, 41b, and the remaining four sides thereof are exposed to an outer surface of the light emitting structure 23.

Figure 7:
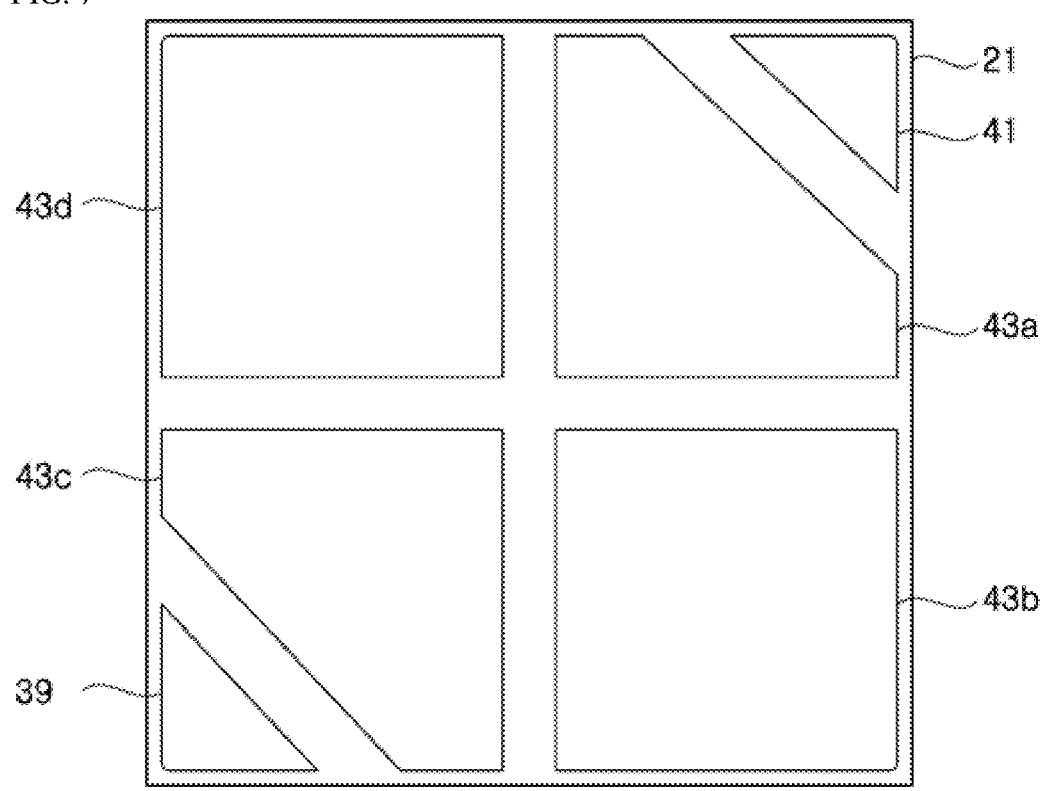
FIG. 7 is a bottom view of a light emitting element according to a fourth exemplary embodiment of the present disclosure.

FIG. 7 is a bottom view of a light emitting element according to a fourth exemplary embodiment of the present disclosure.

Referring to FIG. 7, the light emitting element 10 according to the fourth exemplary embodiment includes a light emitting structure 23, a first contact electrode 31, a second contact electrode 33, a first insulation layer 35, a second insulation layer 37, a first electrode pad 39, a second electrode pad 41, and heat dissipation pads 43a, 43b, 43c, 43d. In description of the light emitting element 10 according to the fourth exemplary embodiment, descriptions of the same components as those of the first exemplary embodiment will be omitted.

In the fourth exemplary embodiment, each of the first electrode pad 39 and the second electrode pad 41 has a triangular shape and is disposed in a diagonal direction at a corner of the light emitting structure 23. In addition, four heat dissipation pads 43a, 43b, 43c, 43d are disposed between the first electrode pad 39 and the second electrode pad 41. Among the four heat dissipation pads 43a, 43b, 43c, 43d, two heat dissipation pads 43b, 43d, disposed in regions in which the first and second electrode pads 39, 41 are not formed, have a rectangular shape, and the remaining two heat dissipation pads 43a, 43c have a rectangular shape having a chamfered corner. The four heat dissipation pads 43a, 43b, 43c, 43d are separated from each other and from the first and second electrode pads 39, 41.

Figure 8:
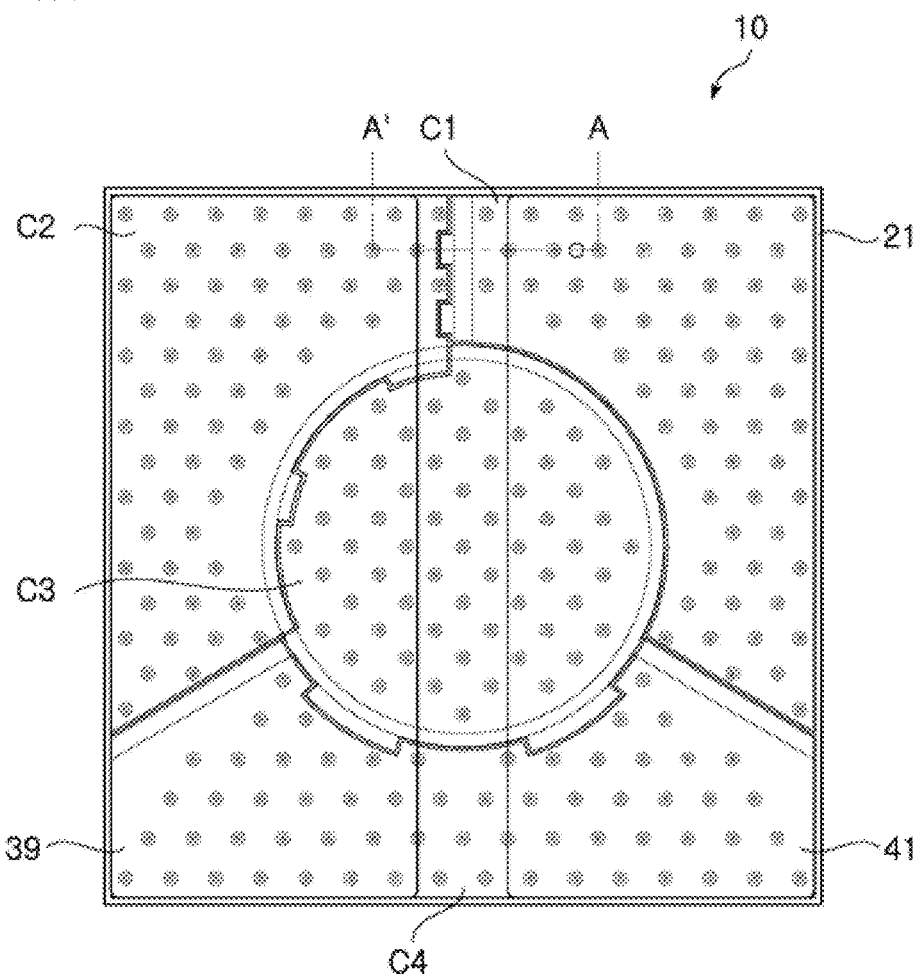
FIG. 8 is a bottom view of a light emitting element according to a fifth exemplary embodiment of the present disclosure.
Figure 9:
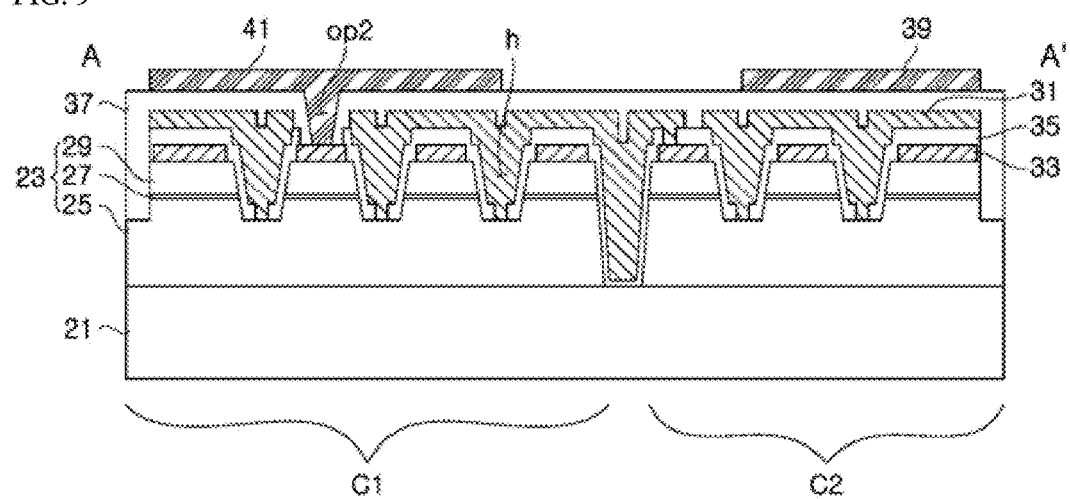
FIG. 9 is a cross-sectional view taken along line A-A' of FIG. 8.

FIG. 8 is a bottom view of a light emitting element according to a fifth exemplary embodiment of the present disclosure and FIG. 9 is a cross-sectional view taken along line A-A' of FIG. 1.

Referring to FIG. 8 and FIG. 9, the light emitting element 10 according to the fifth exemplary embodiment includes first to fourth light emitting cells C1, C2, C3, C4, a first electrode pad 39, and a second electrode pad 41.

Although four light emitting cells C1, C2, C3, C4 are used in the fifth exemplary embodiment as shown in FIG. 8, it should be understood that the light emitting element 10 may include more or fewer than four light emitting cells, as needed.

The first to fourth light emitting cells C1, C2, C3, C4 are connected to each other in series, and among the first to fourth light emitting cells C1, C2, C3, C4, the third light emitting cell C3 is disposed at the center of the light emitting element 10 and the remaining light emitting cells C1, C2, C4 are disposed to surround the third light emitting cell C3. Here, the first to fourth light emitting cells C1, C2, C3, C4 are connected to each other in series such that electric current applied through the first and second electrode pads 39, 41 sequentially flows from the first light emitting cell C1 to the fourth light emitting cell C4.

In this exemplary embodiment, the light emitting element 10 has a rectangular shape and the third light emitting cell C3 has a circular shape in plan view. However, it should be understood that the shapes of the light emitting element 10 and the third light emitting cell C3 may be changed in various ways, for example, including a triangular shape, a rectangular shape, a hexagonal shape, or an octagonal shape, and the like, as needed.

With the third light emitting cell C3 having a circular shape disposed at the center of the light emitting element 10 having a rectangular shape, the first light emitting cell C1, the second light emitting cell C2 and the fourth light emitting cell C4 are formed to have different shapes such that the light emitting element 10 has a rectangular shape.

The first light emitting cell C1 is disposed at an upper right side of the third light emitting cell C3 and the second light emitting cell C2 is disposed at an upper left side of the third light emitting cell C3. The fourth light emitting cell C4 is disposed below the third light emitting cell C3. In this structure, the first light emitting cell C1 and the second light emitting cell C2 may be arranged in linear symmetry.

As described above, the first light emitting cell C1 is electrically connected to the second light emitting cell C2, the second light emitting cell C2 is electrically connected to the third light emitting cell C3, and the third light emitting cell C3 is electrically connected to the fourth light emitting cell C4 such that electric current can sequentially flow from the first light emitting cell C1 to the fourth light emitting cell C4. To this end, the first light emitting cell C1 is electrically connected to the second light emitting cell C2 above the third light emitting cell C3, and is separated from the third light emitting cell C3 and the fourth light emitting cell C4 by a predetermined distance or more so as to be electrically insulated therefrom.

In addition, the second light emitting cell C2 is electrically connected to the first light emitting cell C1 above the third light emitting cell C3, and is electrically connected to the third light emitting cell C3 at the upper left side of the third light emitting cell C3. The second light emitting cell C2 is separated from the fourth light emitting cell C4 by a predetermined distance or more so as to be electrically insulated therefrom.

The third light emitting cell C3 is electrically connected to the second light emitting cell C2, and is electrically connected to the fourth light emitting cell C4 below the third light emitting cell C3. The third light emitting cell C3 is separated from the first light emitting cell C1 by a predetermined distance or more so as to be electrically insulated therefrom.

The fourth light emitting cell C4 is electrically connected to the third light emitting cell C3 and is separated from the first and second light emitting cells C1, C2 by a predetermined distance or more so as to be electrically insulated therefrom.

The first to fourth light emitting cells C1, C2, C3, C4 may have the same size. Since the first to fourth light emitting cells C1, C2, C3, C4 are connected to each other in series, light can be uniformly emitted from each of the first to fourth light emitting cells C1, C2, C3, C4 having the same area.

Although the first to fourth light emitting cells C1, C2, C3, C4 are illustrated as being connected to one another in series in the fifth exemplary embodiment, the first to fourth light emitting cells C1, C2, C3, C4 may be connected to one another in parallel or in series-parallel.

With the first to fourth light emitting cells C1, C2, C3, C4 disposed on the light emitting element as described above, the first and second electrode pads 39, 41 are disposed on the first to fourth light emitting cells C1, C2, C3, C4. In addition, the first electrode pad 39 is electrically connected to the fourth light emitting cell C4 and the second electrode pad 41 is electrically connected to the first light emitting cell C1. That is, the first electrode pad 39 is not electrically connected to the first to third light emitting cells C1, C2, C3, and the second electrode pad 41 is not electrically connected to the second to fourth light emitting cells C2, C3, C4.

The first and second electrode pads 39, 41 may be disposed at opposite ends of the light emitting element 10 and the sizes of the first and second electrode pads 39, 41 may be adjusted so as to form a space having a predetermined distance or more between the first electrode pad 39 and the second electrode pad 41.

Referring to FIG. 9, the light emitting element 10 according to the fifth exemplary embodiment will be described in more detail. The light emitting element 10 according to the fifth exemplary embodiment further includes a light emitting structure 23, a first contact electrode 31, a second contact electrode 33, a first insulation layer 35, and a second insulation layer 37.

In description of the light emitting element 10 according to the fifth exemplary embodiment, descriptions of components that are the same as those of the first exemplary embodiment will be omitted.

The light emitting structure 23 includes a first conductive type semiconductor layer 25, an active layer 27 disposed on the first conductive type semiconductor layer 25, and a second conductive type semiconductor layer 29 disposed on the active layer 27.

The light emitting structure 23 may include a partially exposed region of the first conductive type semiconductor layer 25 formed by partially removing the second conductive type semiconductor layer 29 and the active layer 27. That is, as shown in FIG. 9, a plurality of holes h may be formed through the second conductive type semiconductor layer 29 and the active layer 27 to expose the first conductive type semiconductor layer 25. Here, the shape and arrangement of the holes h may be modified in various ways. In the partially exposed region of the first conductive type semiconductor layer 25, a mesa including the second conductive type semiconductor layer 29 and the active layer 27 may be formed by partially removing the second conductive type semiconductor layer 29 and the active layer 27.

A growth substrate may be disposed under the first conductive type semiconductor layer 25 of the light emitting structure 23.

The first contact electrode 31 and the second contact electrode 33 may form ohmic contact with the first and second conductive type semiconductor layers 25, 29, respectively. The second contact electrode 33 is formed on an upper surface of the second conductive type semiconductor layer 29 to cover a portion or the entirety of the second conductive type semiconductor layer 29.

The first insulation layer 35 may be formed to partially cover an upper surface of the light emitting structure 23 and the second contact electrode 33. Further, the first insulation layer 35 may be formed to cover side surfaces of the holes h such that the first conductive type semiconductor layer 25 can be partially exposed through bottom surfaces of the holes h. Further, the first insulation layer 35 may be formed with at least one opening through which a portion of the second contact electrode 33 is exposed.

The first contact electrode 31 may be formed to cover the entirety of the first insulation layer 35 excluding a portion thereof in which the opening partially exposing the second contact electrode 33 is formed. As a result, the first insulation layer 35 may be partially interposed between the first contact electrode 31 and the second contact electrode 33.

The first insulation layer 35 may also be formed to partially cover a side surface of the light emitting structure 23.

The first contact electrode 31 is formed to partially cover the light emitting structure 23. The first contact electrode 31 is formed to fill the holes h, thereby forming ohmic contact with the first conductive type semiconductor layer 25 not covered by the first insulation layer 35 placed corresponding to the holes h. In the first exemplary embodiment, the first contact electrode 31 may be formed to cover the entirety of the first insulation layer 35 excluding a portion of the first insulation layer 35. With this structure, light emitted from the light emitting structure 23 can be reflected by the first contact electrode 31, and a first contact layer and a second contact layer can be electrically insulated from each other by the first insulation layer 35.

The second insulation layer 37 is formed to cover the entire region of the first contact electrode 31 excluding some regions thereof. The second insulation layer 37 may be formed with a first opening op1 that partially exposes the first contact electrode 31 and a second opening op2 that partially exposes the second contact electrode 33. Here, the second insulation layer 37 may include one or more first openings op1 and one or more second openings op2.

The first electrode pad 39 and the second electrode pad 41 may be disposed on the light emitting structure 23 and electrically connected to the first contact electrode 31 and the second contact electrode 33, respectively. The first electrode pad 39 directly contacts with the first contact electrode 31 to be electrically connected thereto through the first openings op1, and the second electrode pad 41 directly contacts with the second contact electrode 33 to be electrically connected thereto through the second openings op2.

In the fifth exemplary embodiment, since the first electrode pad 39 is electrically connected to the fourth light emitting cell C4, the first openings may be formed in the fourth light emitting cell C4. Thus, as shown in FIG. 9, the first electrode pad 39 is disposed on the second insulation layer 37 without being electrically connected to the second light emitting cell C2.

Further, in order to achieve series connection between the first light emitting cell C1 and the second light emitting cell C2, the first contact electrode 31 of the first light emitting cell C1 electrically contacts with the second contact electrode 33 of the second light emitting cell C2. Here, the first contact electrode 31 of the first light emitting cell C1 may be formed on a space between the first light emitting cell C1 and the second light emitting cell C2. In some implementations, the first contact electrode 31 may fill the space between the first light emitting cell C1 and the second light emitting cell C2.

Each of the first electrode pad 39 and the second electrode pad 41 has a thickness of dozens of micrometers, whereby the light emitting element 10 can be used as a chip-scale package.

Further, each of the first electrode pad 39 and the second electrode pad 41 may be composed of a single layer or multiple layers, and may include an electrically conductive material.

Figure 10:
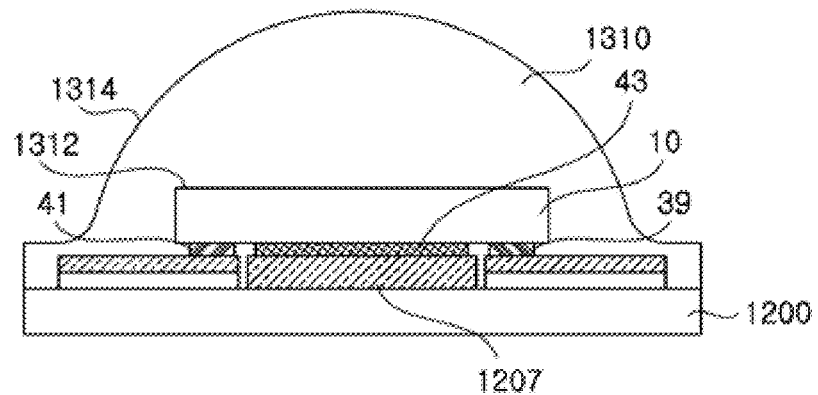
FIG. 10 is a side sectional view of a light emitting diode including the light emitting element according to the fifth exemplary embodiment of the present disclosure and a dome-shaped lens.
Figure 11:
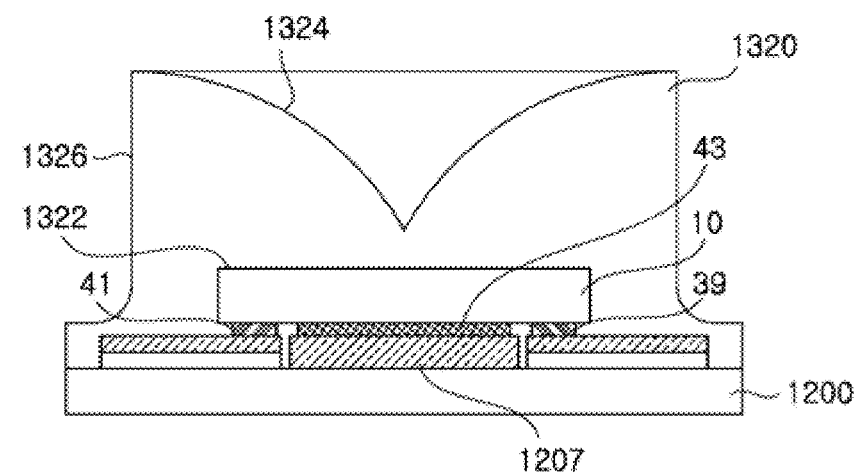
FIG. 11 is a side sectional view of a light emitting diode including the light emitting element according to the fifth exemplary embodiment of the present disclosure and a total reflection type lens.

FIG. 10 is a side sectional view of a light emitting diode including the light emitting element according to the fifth exemplary embodiment of the present disclosure and a dome-shaped lens. FIG. 11 is a side sectional view of a light emitting diode including the light emitting element according to the fifth exemplary embodiment of the present disclosure and a total reflection type lens.

In the light emitting diode including the light emitting element according to the fifth exemplary embodiment, the light emitting element 10 may be mounted on a printed circuit board 1200 and a dome-shaped lens 1310 may be coupled to an upper side of the light emitting element 10. The dome-shaped lens 1310 includes a light incidence plane 1312 upon which light emitted from the light emitting element 10 is incident, and a light exit plane 1314 defined on an upper surface of the lens 1310. The light incident plane 1312 may have a flat shape and may be changed to have various shapes, as needed. The light exit plane 1314 may have a circular cross-sectional shape or a modified circular cross-sectional shape.

The light emitting element 10 is mounted on the printed circuit board 1200 such that external power can be applied to the printed circuit board 1200 through the first electrode pad 39 and the second electrode pad 41 of the light emitting element 10. The printed circuit board 1200 may be formed at a lower side thereof with a dissipation portion that dissipates heat transferred from the light emitting element 10.

As a result of comparing luminous efficacy of the light emitting diode including the light emitting element 10 according to the fifth exemplary embodiment and having the structure as described above with that of a typical light emitting diode having the same structure, it could be seen that the light emitting diode according to the fifth exemplary embodiment had a luminous efficacy of 100.7% when the typical light emitting diode had a luminous efficacy of 100%.

In comparison of the light emitting diode according to the fifth exemplary embodiment with the typical light emitting diode, the same kind of phosphor having a color coordinate CIEx of 0.330 was used.

Furthermore, in the structure wherein a total reflection type lens 1320 as shown in FIG. 11 is applied to the light emitting diode, light emitted from the light emitting diode according to the fifth exemplary embodiment has high brightness at the center of the light emitting diode, thereby improving luminous efficacy of the light emitting diode.

The total reflection type lens 1320 may be a TIR lens, an upper surface of which has a total reflection function. Namely, the total reflection type lens 1320 includes a light incidence plane 1322 on which light emitted from the light emitting element 10 is incident, a reflection portion 1324 disposed on an upper surface thereof, and a light exit plane 1326 defined on a side surface thereof. Thus, when light emitted from the light emitting element 10 enters the total reflection type lens 1320, the light is reflected to the side surface of the total reflection type lens 1320 and passes therethrough. Although the light incidence plane 1322 is shown as having a flat shape in this exemplary embodiment, the light incidence plane 1322 may have a concave shape, as needed.

Figure 12:
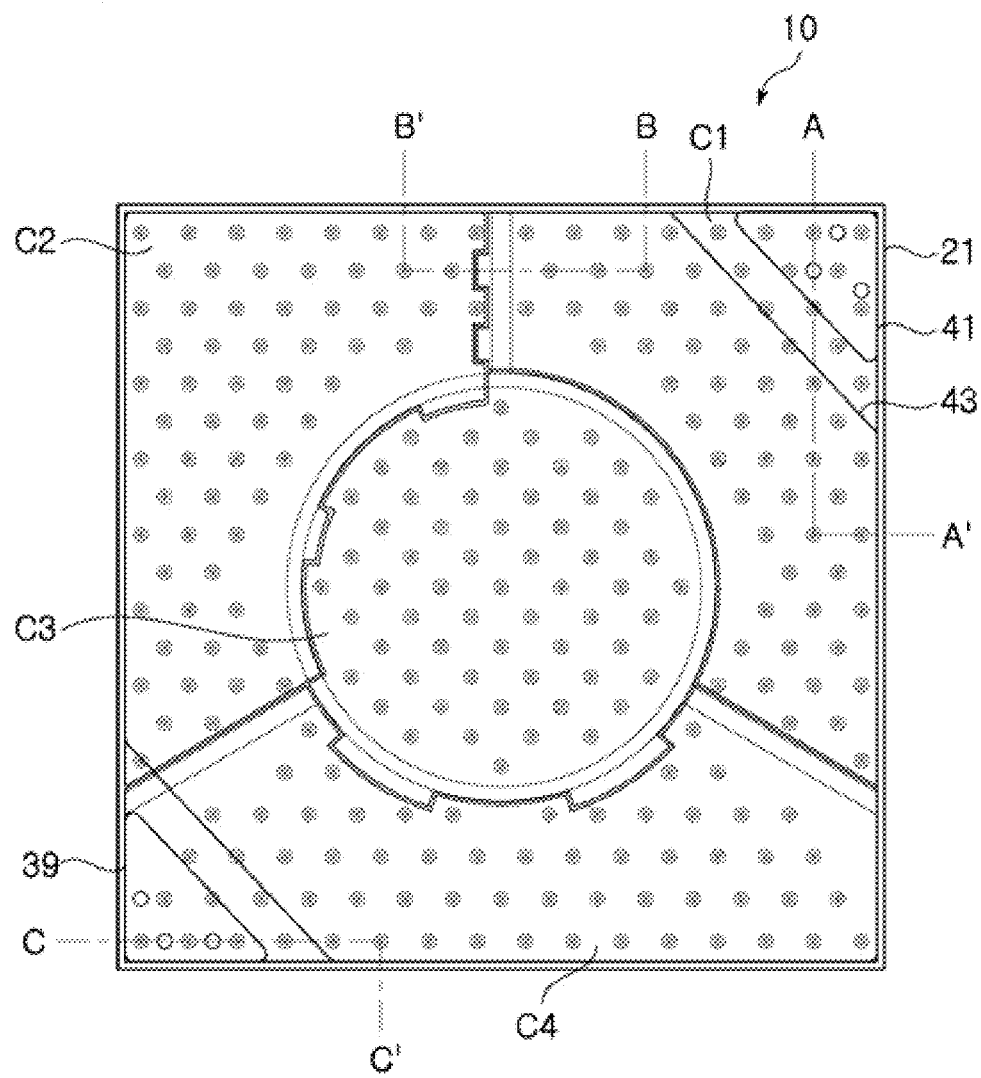
FIG. 12 is a bottom view of a light emitting element according to a sixth exemplary embodiment of the present disclosure.
Figure 13A:
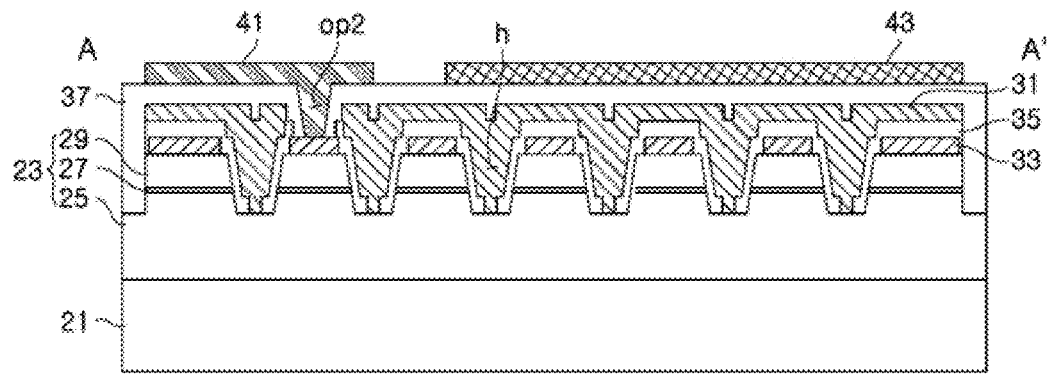
FIGS. 13A-13C show cross-sectional views taken along lines A-A', B-B' and C-C' of FIG. 12.
Figure 13B:
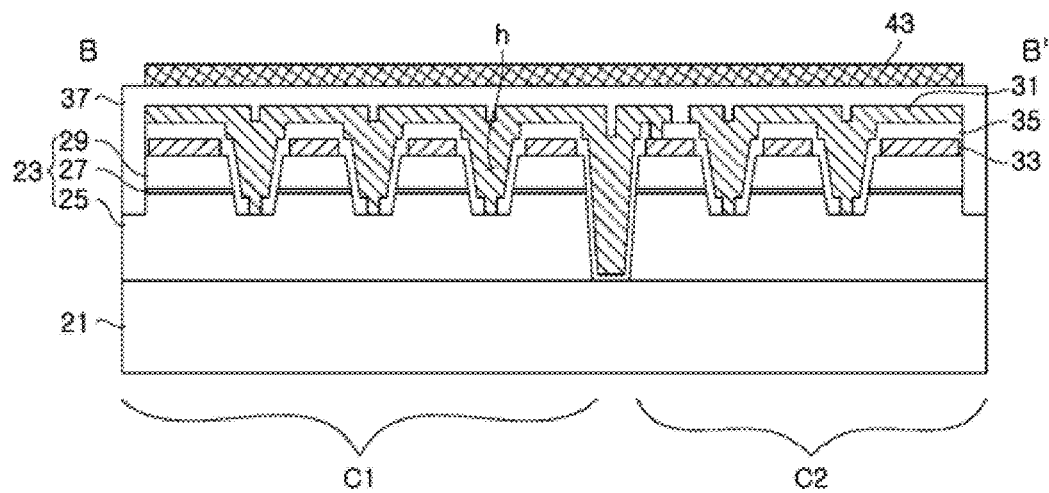
Figure 13C:
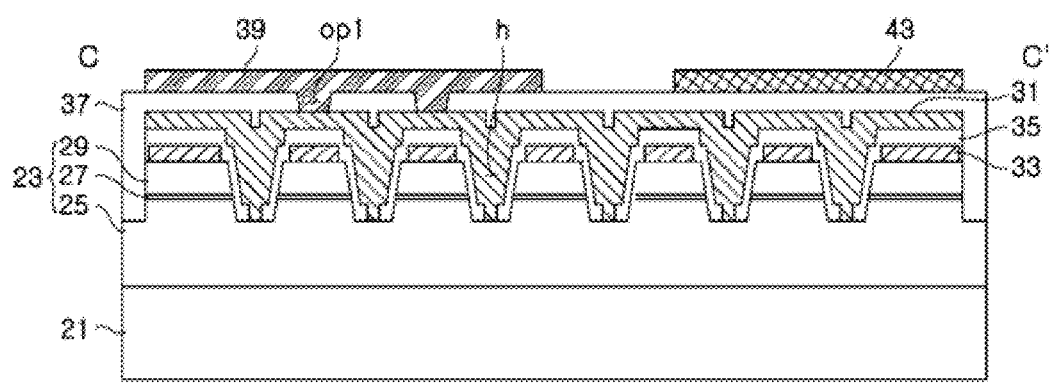

FIG. 12 is a bottom view of a light emitting element according to a sixth exemplary embodiment of the present disclosure, and FIG. 13A, FIG. 13B and FIG. 13C are cross-sectional views taken along lines A-A', B-B' and C-C' of FIG. 12, respectively.

Referring to FIG. 12 and FIGS. 13A-13C, the light emitting element 10 according to the sixth exemplary embodiment includes first to fourth light emitting cells C1, C2, C3, C4, a first electrode pad 39, a second electrode pad 41, and a heat dissipation pad 43.

Although four light emitting cells C1, C2, C3, C4 are used in the sixth exemplary embodiment as shown in FIG. 8, it should be understood that the light emitting element 10 may include more or fewer than four light emitting cells, as needed.

The first to fourth light emitting cells C1, C2, C3, C4 are connected to each other in series, and among the first to fourth light emitting cells C1, C2, C3, C4, the third light emitting cell C3 is disposed at the center of the light emitting element 10 and the remaining light emitting cells C1, C2, C4 are disposed to surround the third light emitting cell C3. In addition, the first to fourth light emitting cells C1, C2, C3, C4 are connected to one another in series such that electric current applied through the first and second electrode pads 39, 41 sequentially flows from the first light emitting cell C1 to the fourth light emitting cell C4.

Here, the light emitting element 10 has a rectangular shape and the third light emitting cell C3 has a circular shape in plan view. However, it should be understood that the shapes of the light emitting element 10 and the third light emitting cell C3 may be changed to have various shapes, including, for example, a triangular shape, a rectangular shape, a hexagonal shape, an or octagonal shape, and the like, as needed.

With the third light emitting cell C3 of a circular shape disposed at the center of the light emitting element 10 having a rectangular shape, the first light emitting cell C1, the second light emitting cell C2 and the fourth light emitting cell C4 are formed to have different shapes such that the light emitting element 10 has a rectangular shape.

In the sixth exemplary embodiment, the first to fourth light emitting cell are disposed coplanar with each other, as shown in FIG. 12. For convenience of description, spatially relative terms such as upper, lower, left and right will be described with reference to FIG. 12.

The first light emitting cell C1 is disposed at an upper right side of the third light emitting cell C3 and the second light emitting cell C2 is disposed at an upper left side of the third light emitting cell C3. The fourth light emitting cell C4 is disposed below the third light emitting cell C3. In this structure, the first light emitting cell C1 and the second light emitting cell C2 may be arranged in line symmetry.

Further, the second light emitting cell C2 is electrically connected to the first light emitting cell C1 above the third light emitting cell C3 and is electrically connected to the third light emitting cell C3 at the upper left side of the third light emitting cell C3. The second light emitting cell C2 is separated from the fourth light emitting cell C4 by a predetermined distance or more so as to be electrically insulated therefrom.

The fourth light emitting cell C4 is electrically connected to the third light emitting cell C3 and is separated from the first and second light emitting cells C1, C2 by a predetermined distance or more so as to be electrically insulated therefrom.

Although the first to fourth light emitting cells C1, C2, C3, C4 are illustrated as being connected to each other in series in the sixth exemplary embodiment, the first to fourth light emitting cells C1, C2, C3, C4 may be connected to each other in parallel or in series-parallel.

With the first to fourth light emitting cells C1, C2, C3, C4 disposed on the light emitting element as described above, the first and second electrode pads 39, 41 are disposed on the fourth light emitting cell C4 and the first light emitting cell C1. In addition, the first electrode pad 39 is electrically connected to the fourth light emitting cell C4 and the second electrode pad 41 is electrically connected to the first light emitting cell C1.

In this exemplary embodiment, the first and second electrode pads 39, 41 may be formed in a triangular shape at the corresponding corners of the light emitting cells C1, C2, C3, C4, and the heat dissipation pad 43 may be formed in a hexagonal shape between the first electrode pad 39 and the second electrode pad 41. Here, the shapes of the first and second electrode pads 39, 41 and the shape of the heat dissipation pad 43 are not limited to the shapes shown in the drawings, and may be changed in various ways, as needed. In addition, the first electrode pad 39, the second electrode pad 41 and the heat dissipation pad 43 may be separated from one another by a predetermined distance.

As described above, in the structure wherein the third light emitting cell C3 is disposed at the center of the light emitting element 10, and the first light emitting cell C1, the second light emitting cell C2 and the fourth light emitting cell C4 are disposed to surround the third light emitting cell C3, luminous efficacy at the center of the light emitting element 10 can be improved by increasing current density of the third light emitting cell C3. For example, the current density of the third light emitting cell C3 can be increased by forming the third light emitting cell C3 to have a smaller area than the light emitting cells C1, C2, C4.

When the current density of the third light emitting cell C3 is increased, heat can be intensively generated from the third light emitting cell C3. Thus, in order to dissipate heat from the third light emitting cell C3, the heat dissipation pad 43 is provided to the light emitting element, and in the sixth exemplary embodiment, the heat dissipation pad 43 may be disposed to cover the entirety of the third light emitting cell C3, as shown in FIG. 12.

Referring to FIGS. 13A-13C, the light emitting element 10 according to the sixth exemplary embodiment will be described in more detail. The light emitting element 10 according to the sixth exemplary embodiment may further include a substrate 21, a light emitting structure 23, a first contact electrode 31, a second contact electrode 33, a first insulation layer 35, and a second insulation layer 37.

The substrate 21 may be any substrate which allows growth of the light emitting structure 23 thereon, and may include, for example, a sapphire substrate, a silicon carbide substrate, a silicon substrate, a gallium nitride substrate, or an aluminum nitride substrate. The substrate 21 may be removed from the light emitting structure 23 using a technique known in the art, as needed. Although not shown in the drawings, the light emitting structure 23 may have a rough region formed on a lower surface thereof.

The light emitting structure 23 includes a first conductive type semiconductor layer 25, an active layer 27 disposed on the first conductive type semiconductor layer 25, and a second conductive type semiconductor layer 29 disposed on the active layer 27.

The light emitting structure 23 may include a partially exposed region of the first conductive type semiconductor layer 25 formed by partially removing the second conductive type semiconductor layer 29 and the active layer 27. That is, as shown in FIGS. 13A-13C, a plurality of holes h may be formed through the second conductive type semiconductor layer 29 and the active layer 27 to expose the first conductive type semiconductor layer 25. Here, the shape and arrangement of the holes h may be modified in various ways.

The first contact electrode 31 and the second contact electrode 33 may form ohmic contact with the first conductive type semiconductor layer 25 and the second conductive type semiconductor layer 29, respectively. The second contact electrode 33 may be formed on an upper surface of the second conductive type semiconductor layer 29 to cover a portion or the entirety of the second conductive type semiconductor layer 29.

The second contact electrode 33 may be formed of any material capable of forming ohmic contact with the second conductive type semiconductor layer 29 and may include, for example, at least one of a metallic material and a conductive oxide.

The first insulation layer 35 may be formed on the upper surface of the light emitting structure 23 to cover the entirety of the light emitting structure 23 excluding some regions thereof through which the second contact electrode 33 is exposed. Further, the first insulation layer 35 is formed to cover the second conductive type semiconductor layer 29 and the active layer 28 exposed through the holes h formed in the light emitting structure 23. The first insulation layer may be formed on bottom surfaces of the holes h such that the first conductive type semiconductor layer 25 is partially exposed through bottom surfaces of the holes h so as to allow ohmic contact between the first conductive type semiconductor layer 25 and the first contact electrode 31. The first insulation layer 35 may be formed on the second contact electrode 33 such that the second contact electrode 33 can be partially exposed.

The first insulation layer 35 may include an insulation material, for example, $SiO_2$, $SiN_x$, or $MgF_2$, and the like. The first insulation layer 35 may be composed of multiple layers and may include a distributed Bragg reflector in which materials having different indices of refraction are alternately stacked.

Figure 14A:
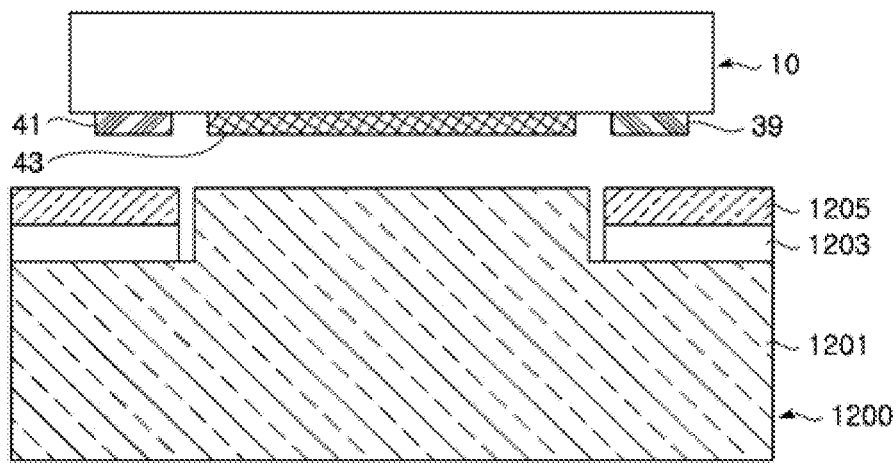
FIGS. 14A-14C show side sectional views of a light emitting diode according to a sixth exemplary embodiment of the present disclosure.
Figure 14B:
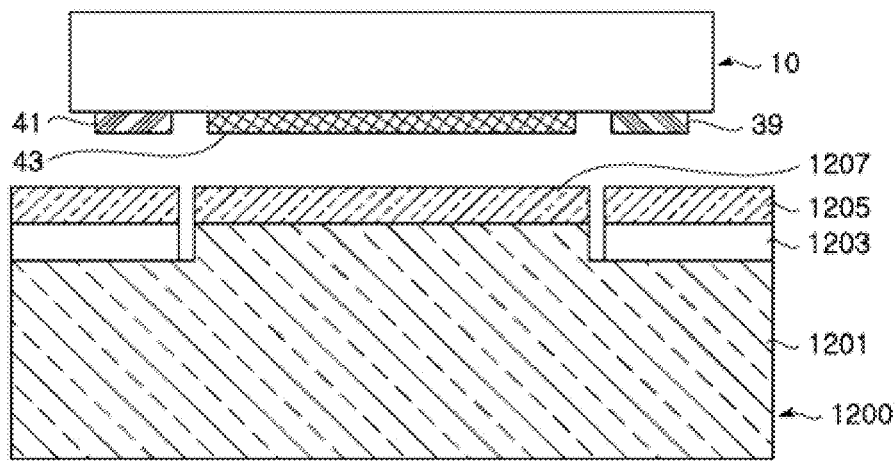
Figure 14C:
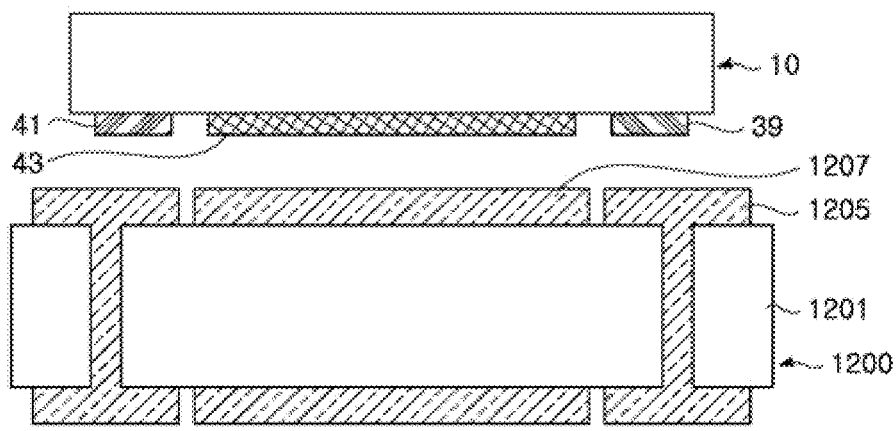

Although not shown in FIGS. 14A-14C, the first insulation layer 35 may also be formed to cover a portion of the substrate 21. This structure of the first insulation layer 35 can vary depending upon chip unit isolation in fabrication of the light emitting element 10. When the first insulation layer 35 is formed after chip unit isolation of a wafer in fabrication of the light emitting element 10, a portion of the substrate 21 can also be covered by the first insulation layer 35.

The first contact electrode 31 may be formed on the upper surface of the light emitting structure 23 so as to cover the entirety of the first insulation layer 35 excluding a portion of the first insulation layer 35. Here, the first contact electrode 31 is formed to fill the holes h formed in the light emitting structure 23, thereby forming ohmic contact with the first conductive type semiconductor layer 25 exposed through the bottom surfaces of the holes h. As described above, since the first contact electrode 31 covers most of the first insulation layer 35, light emitted from the light emitting structure 23 can be reflected by the first contact electrode 31.

The first contact electrode 31 may be electrically insulated from the second contact electrode 33 by the first insulation layer 35.

The second insulation layer 37 is formed to cover the entire region of the first contact electrode 31 excluding some regions thereof. The second insulation layer 37 may be formed with a first opening op1 that partially exposes the first contact electrode 31, as shown in FIG. 13C, and a second opening op2 that partially exposes the second contact electrode 33, as shown in FIG. 13A. The second opening op2 may be formed through the first insulation layer 35, the first contact electrode 31 and the second insulation layer 37. Here, the second insulation layer 37 may include one or more first openings op1 and one or more second openings op2.

The first electrode pad 39 and the second electrode pad 41 may be disposed on the second insulation layer 37 and electrically connected to the first contact electrode 31 and the second contact electrode 33, respectively. The first electrode pad 39 contacts the first contact electrode 31 to be electrically connected thereto through the first openings op1, and the second electrode pad 41 contacts the second contact electrode 33 to be electrically connected thereto through the second openings op2.

In the sixth exemplary embodiment, since the first electrode pad 39 is electrically connected to the fourth light emitting cell C4, as shown in FIG. 13C, the first openings op1 may be formed in the fourth light emitting cell C4.

In addition, as shown in FIG. 13B, the first light emitting cell C1 and the second light emitting cell C2 may be formed on the same substrate 21 and a separation space is formed between the first light emitting cell C1 and the second light emitting cell C2. Here, a side surface and a bottom surface of the separation space between the first light emitting cell C1 and the second light emitting cell C2 may be covered by the first insulation layer 35 of the first light emitting cell C1.

In order to achieve series connection between the first light emitting cell C1 and the second light emitting cell C2, the first contact electrode 31 of the first light emitting cell C1 electrically contacts the second contact electrode 33 of the second light emitting cell C2. Here, the first contact electrode 31 of the first light emitting cell C1 may be formed in the space between the first light emitting cell C1 and the second light emitting cell C2 or fill the space between the first light emitting cell C1 and the second light emitting cell C2.

Each of the first electrode pad 39 and the second electrode pad 41 has a thickness of dozens of micrometers, whereby the light emitting element 10 can be used as a chip-scale package.

The heat dissipation pad 43 may be formed on an upper surface of the second insulation layer 37 to contact the second insulation layer 37. The heat dissipation pad 43 may have the same thickness as the first and second electrode pads 39, 41, or may have a smaller thickness than the first and second electrode pads 39, 41. Further, the heat dissipation pad 43 may have a larger area than the first and second electrode pads 39, 41 in plan view and thus at least three sides of the heat dissipation pad 43 may be exposed to the outside, as shown in FIG. 12. For example, the heat dissipation pad may be formed to have an area occupying 50% or more the area of the light emitting element in plan view and a large area of the heat dissipation pad can provide better heat dissipation efficiency.

In the sixth exemplary embodiment, since each of the first electrode pad 39 and the second electrode pad 41 is formed to have a predetermined area or less at the corresponding corner of the light emitting structure 23, the heat dissipation pad 43 may be formed in an overall region in which the first and second electrode pads 39, 41 are not formed. Here, the first and second electrode pads 39, 41 may be separated from the heat dissipation pad 43 by a predetermined distance or more so as to secure electrical insulation therebetween. That is, the heat dissipation pad 43 may be formed of the same material as the first and second electrode pads 39, 41, and the heat dissipation pad 43 may be separated from the first and second electrode pads 39, 41 to prevent electric current from flowing to the heat dissipation pad 43. Here, the shapes of the first and second electrode pads 39, 41 and the shape of the heat dissipation pad 43 are not limited to the shapes shown in the drawings, and may be changed in various ways, as needed.

FIG. 14A is a side sectional view of one example of coupling between the light emitting element according to the sixth exemplary embodiment and a printed circuit board.

In this example, a light emitting diode includes a light emitting element 10 and a printed circuit board 1200. The light emitting element 10 is the same as the light emitting element described above, and the printed circuit board 1200 includes a substrate body 1201, an insulation portion 1203, and a lead portion 1205.

In this example, the substrate body 1201 is formed of or includes a metal and directly contacts the heat dissipation pad 43 such that heat generated from the light emitting element 10 is transferred to the substrate body 1201 through the heat dissipation pad 43. As shown in the drawings, the printed circuit board 1200 includes at least two lead portions 1205, which are brought into contact with and electrically connected to the first and second electrode pads 39, 41 upon mounting of the light emitting element 10 on the printed circuit board 1200. The insulation portion 1203 is interposed between the substrate body 1201 and the lead portions 1205 to insulate the lead portions 1205 from the substrate body 1201.

The substrate body 1201 has a protrusion in a region thereof, in which the lead portions 1205 are not formed, so as to contact the heat dissipation pad 43, and the height of the protrusion is the same as the height of the lead portions 1205. Further, in order to secure electrical insulation between the substrate body 1201 and the lead portion 1205, the protrusion of the substrate body 1201 may be separated from the lead portions 1205 by a predetermined distance or more.

FIG. 14B is a side sectional view of another example of coupling between the light emitting element according to the sixth exemplary embodiment and a printed circuit board.

In this example, the light emitting diode includes the light emitting element 10 and a printed circuit board 1200, and descriptions of the same components as those of the above example will be omitted.

In this example, the substrate body 1201 has a protrusion in a region in which the lead portions 1205 are not formed, and the height of the protrusion is the same as the height of the insulation portion 1203. Further, in order to secure electrical insulation between the substrate body 1201 and the lead portion 1205, the protrusion of the substrate body 1201 may be separated from the lead portions 1205 by a predetermined distance or more.

Further, the printed circuit board 1200 includes a dissipation portion 1207 formed on the protrusion of the substrate body 1201. As shown in the drawings, the dissipation portion 1207 is separated from the lead portions 1205 by a predetermined distance or more and has the same height as the lead portions 1205. Thus, when the light emitting element 10 is mounted on the printed circuit board 1200, the dissipation portion 1207 contacts the heat dissipation pad 43. Further, the dissipation portion 1207 may be formed of or include the same material as the lead portion 1205, but is not limited thereto.

FIG. 14C is a side sectional view of a further example of coupling between the light emitting element according to the sixth exemplary embodiment and a printed circuit board.

In this example, the light emitting diode includes the light emitting element 10 and a printed circuit board 1200, and descriptions of the same components as those of the above example will be omitted.

In this example, the substrate body 1201 may be formed of or include an insulation material such as silicone or ceramics, and may include lead portions 1205 formed through the substrate body 1201 from an upper surface thereof to a lower surface thereof. The substrate body may further include dissipation portions 1207 formed on the upper and lower surfaces thereof. Thus, when the light emitting element 10 is mounted on the printed circuit board 1200, the first and second electrode pads 39, 41 directly contact the lead portions 1205, and the heat dissipation pad 43 may directly contact the dissipation portions 1207. The lead portions 1205 may be separated from the dissipation portions 1207.

Figure 15:
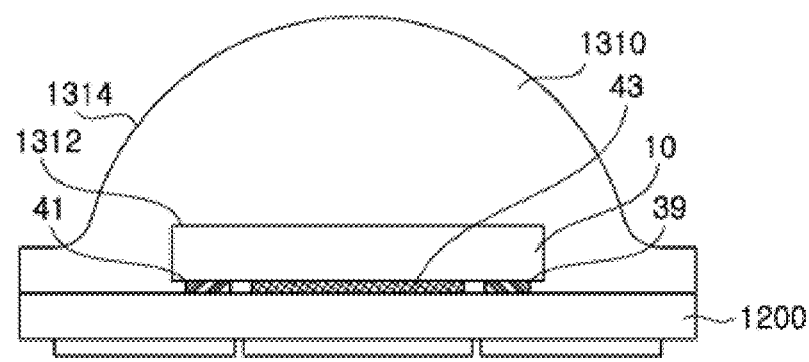
FIG. 15 is a side sectional view of a light emitting diode including the light emitting element according to the sixth exemplary embodiment of the present disclosure and a dome-shaped lens.

FIG. 15 is a side sectional view of a light emitting diode including the light emitting element according to the sixth exemplary embodiment of the present disclosure and a dome-shaped lens.

In the light emitting diode including the light emitting element 10 according to the sixth exemplary embodiment, the light emitting element 10 may be mounted on a printed circuit board 1200 and a dome-shaped lens 1310 may be coupled to an upper side of the light emitting element 10. The dome-shaped lens 1310 includes a light incidence plane 1312 on which light emitted from the light emitting element 10 is incident, and a light exit plane 1314 defined on an upper surface of the lens 1310. The light incident plane 1312 may have a flat shape and may be changed to have various shapes, as needed. The light exit plane 1314 may have a circular cross-sectional shape or a modified circular cross-sectional shape.

The light emitting element 10 is mounted on the printed circuit board 1200 such that external power can be applied to the printed circuit board 1200 through the first electrode pad 39 and the second electrode pad 41 of the light emitting element 10. The printed circuit board 1200 may be formed at a lower side thereof with a dissipation portion that dissipates heats transferred from the light emitting element 10.

As a result of comparing luminous efficacy of the light emitting diode including the light emitting element 10 according to the sixth exemplary embodiment and having the structure as described above with that of a typical light emitting diode having the same structure, it could be seen that the light emitting diode according to the sixth exemplary embodiment had a luminous efficacy of 100.7% when the typical light emitting diode had a luminous efficacy of 100%.

In comparison of the light emitting diode according to the fifth exemplary embodiment with the typical light emitting diode, the same kind of phosphor having a color coordinate CIEx of 0.330 was used.

Figure 16:
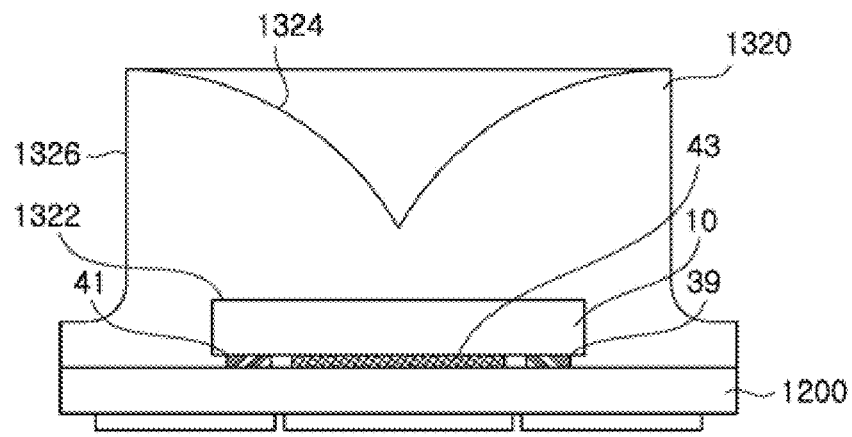
FIG. 16 is a side sectional view of a light emitting diode including the light emitting element according to the sixth exemplary embodiment of the present disclosure and a concave lens.

FIG. 16 is a side sectional view of a light emitting diode including the light emitting element according to the sixth exemplary embodiment of the present disclosure and a concave lens.

In the structure wherein a total reflection type lens 1320 as shown in FIG. 16 is applied to the light emitting diode, light emitted from the light emitting diode according to the sixth exemplary embodiment has high brightness at the center of the light emitting diode, thereby improving luminous efficacy of the light emitting diode.

The concave lens 1320 may be or include a TIR lens. Namely, the concave lens 1320 includes a light incidence plane 1322 on which light emitted from the light emitting element 10 is incident, a reflection portion 1324 disposed on an upper surface thereof, and a light exit plane 1326 defined on a side surface thereof. Thus, when light emitted from the light emitting element 10 enters the concave lens 1320, the light is reflected to the side surface of the concave lens 1320 and is emitted therethrough. Although the light incidence plane 1322 is shown as having a flat shape in this exemplary embodiment, the light incidence plane 1322 may have a convex shape, as needed.

Figure 17A:
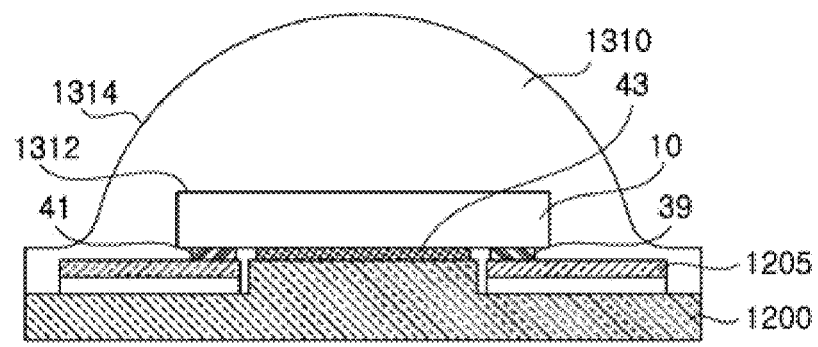
FIGS. 17A-17C show side sectional views of a light emitting diode including the light emitting element according to the sixth exemplary embodiment of the present disclosure, a printed circuit board, and a lens.
Figure 17B:
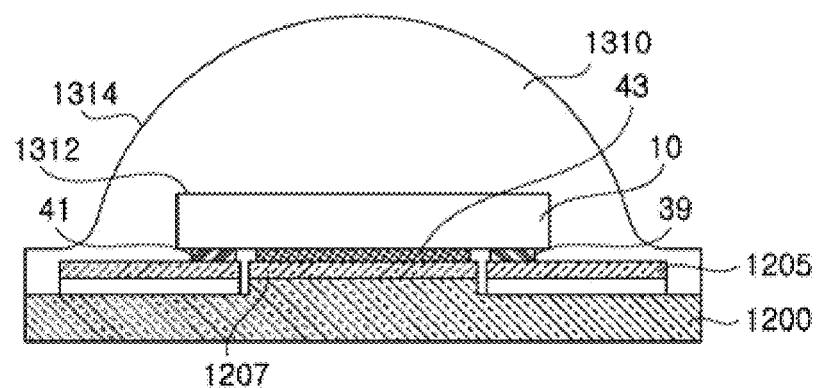
Figure 17C:
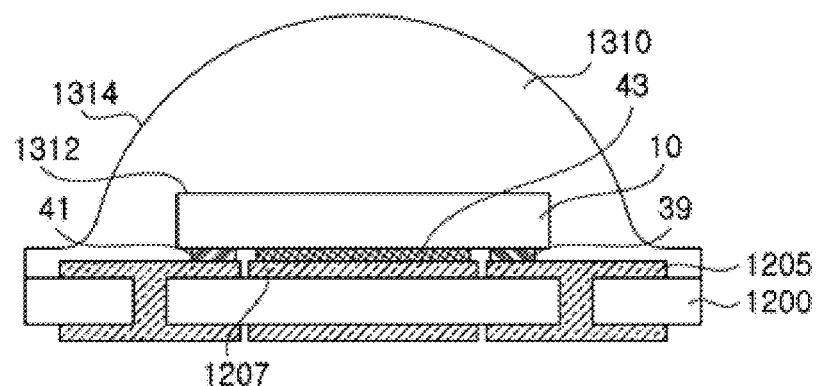

FIGS. 17A-17C show side sectional views of the light emitting diode including the light emitting element, the printed circuit board, and the lens, according to the sixth exemplary embodiment of the present disclosure.

FIGS. 17A to 17C show the light emitting diode, in which the light emitting element 10 according to the sixth exemplary embodiment is mounted on the printed circuit board 1200 shown in FIGS. 14A-14C, and a dome-shaped lens 1310 is formed on the light emitting element 10. As shown in FIGS. 17A to 17C, the light emitting element 10 may cover the entire upper surface of the printed circuit board 1200, and the first and second electrode pads 39, 41 of the light emitting element 10 may directly contact the lead portions 1205 of the printed circuit board to be electrically connected thereto. The heat dissipation pad 43 may directly contact the dissipation portion 1207 of the printed circuit board 1200, or may be directly formed on the printed circuit board 1200 in an exemplary embodiment wherein the printed circuit board 1200 is formed of a metal.

As described in the sixth exemplary embodiment, the dome-shaped lens 1310 or the concave lens 1320 may contain phosphors that convert wavelengths of light emitted from the light emitting element 10. The phosphors enable light emitted from the light emitting element 10 to be realized as various colors, particularly, mixed light such as white light.

Figure 18:
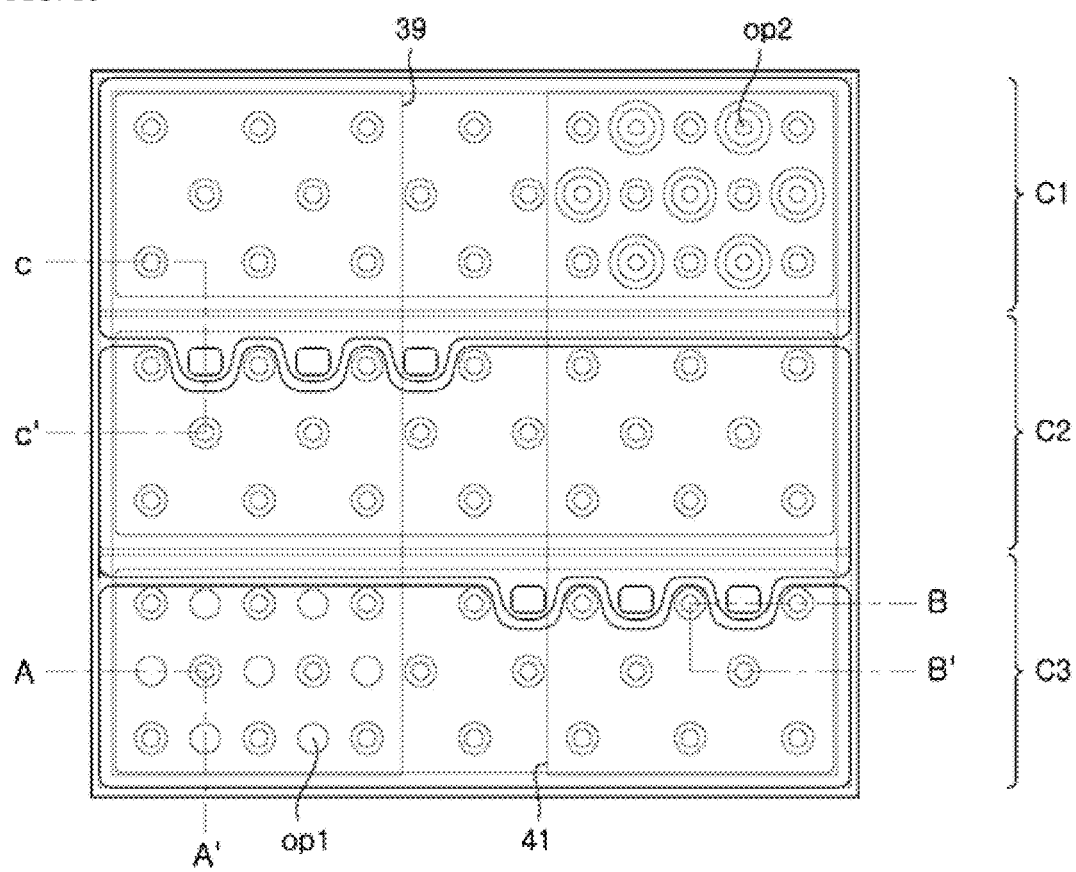
FIG. 18 is a plan view of a light emitting element according to a seventh exemplary embodiment of the present disclosure.
Figure 19:
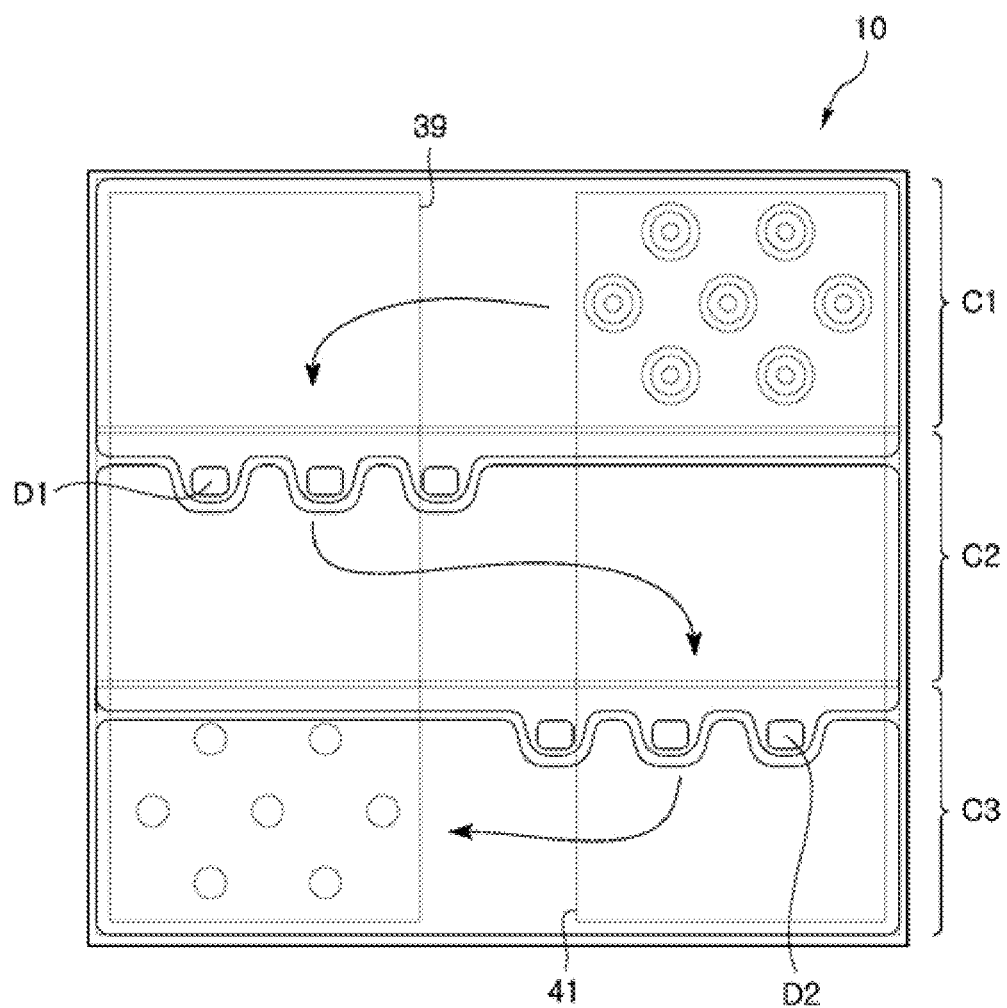
FIG. 19 is a schematic plan view of the light emitting element according to the seventh exemplary embodiment of the present disclosure.
Figure 20A:
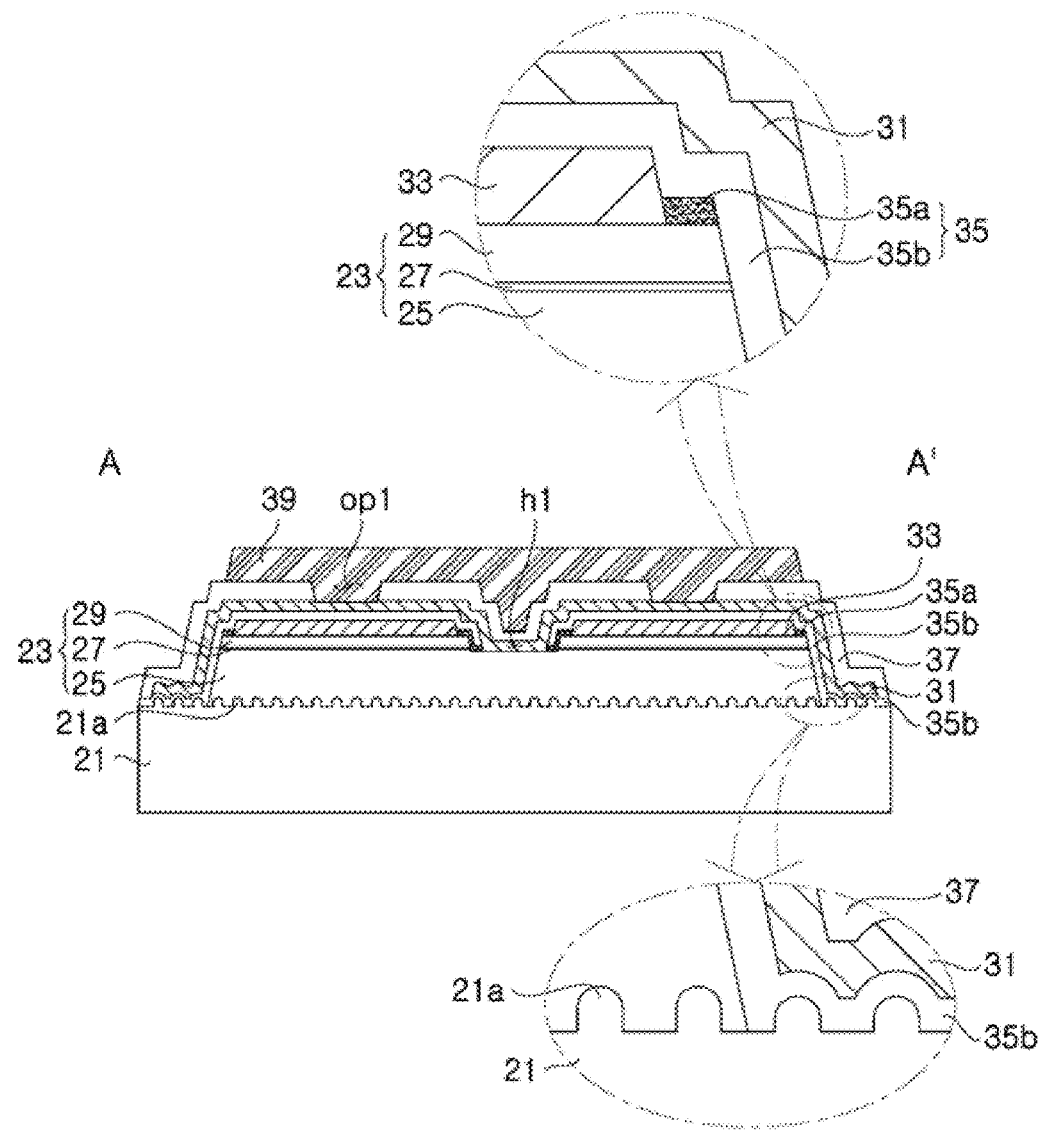
FIGS. 20A-20C show cross-sectional views taken along lines A-A', B-B' and C-C' of FIG. 1.
Figure 20B:
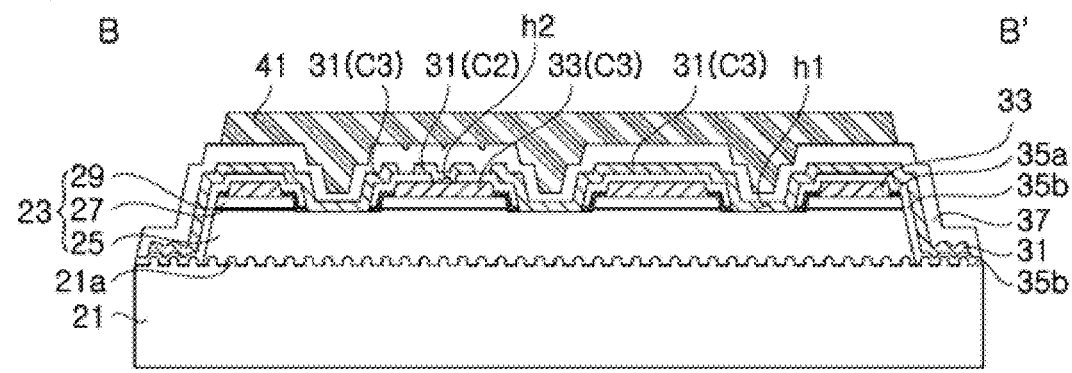
Figure 20C:
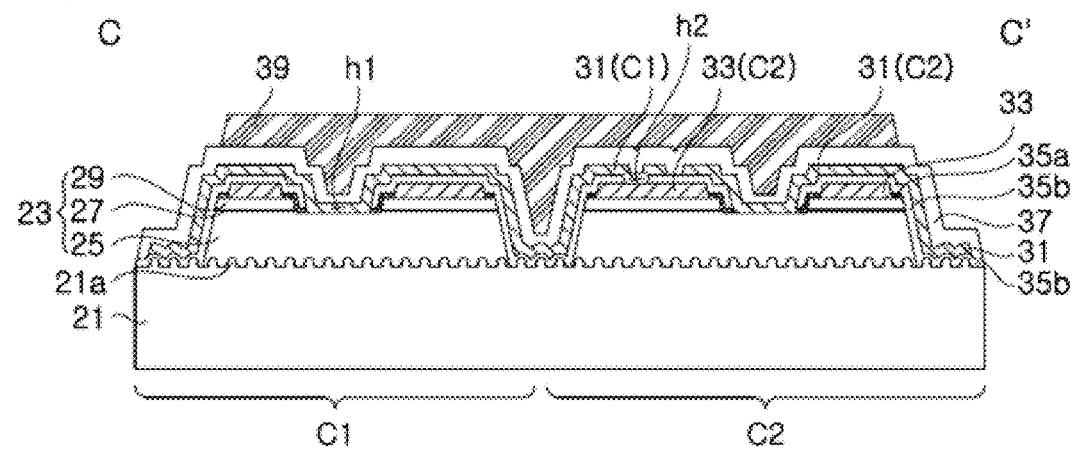
Figure 21:
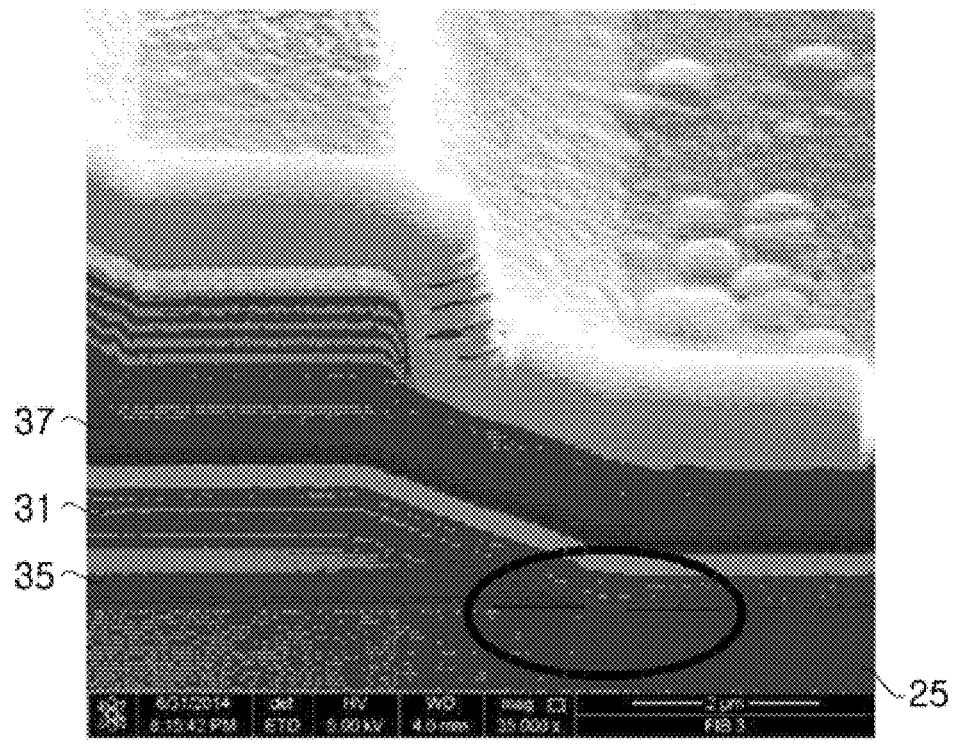
FIG. 21 to FIG. 23 are analysis pictures of the light emitting element according to the seventh exemplary embodiment of the present disclosure.
Figure 22:
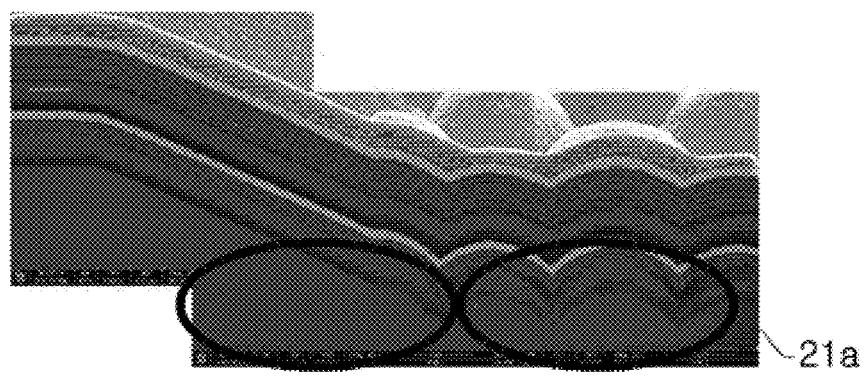
Figure 23:
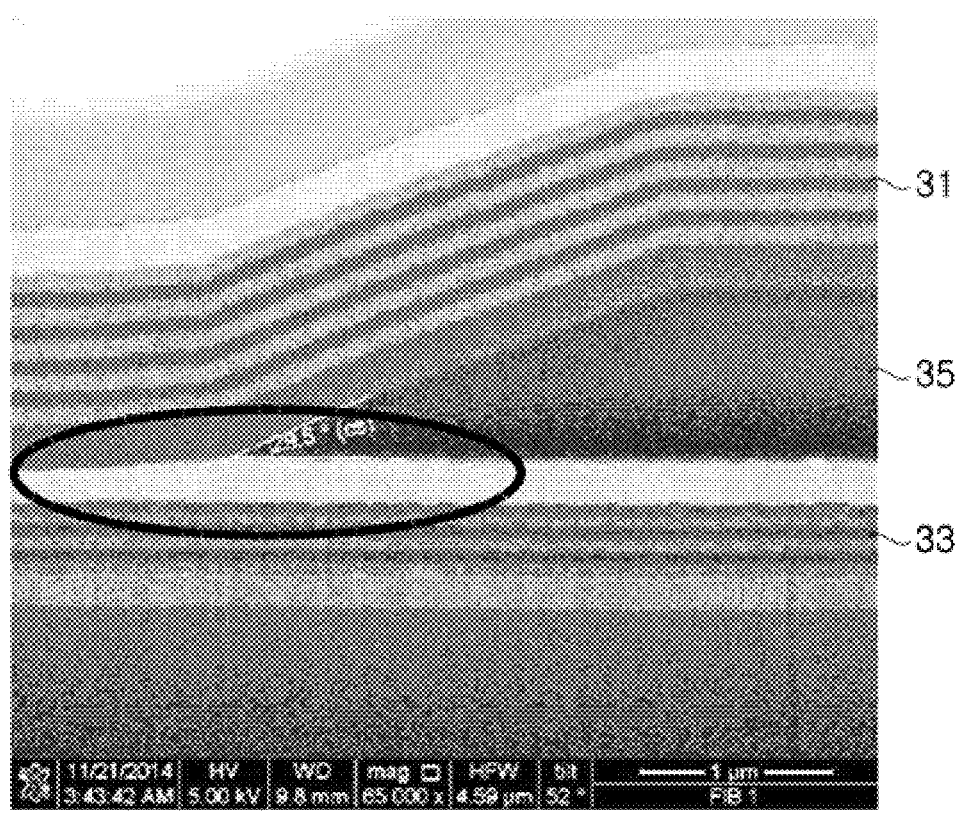

FIG. 18 is a plan view of a light emitting element according to a seventh exemplary embodiment of the present disclosure and FIG. 19 is a schematic plan view of the light emitting element according to the seventh exemplary embodiment of the present disclosure. FIG. 20A is a cross-sectional view taken along line A-A' of FIG. 18, FIG. 20B is a cross-sectional view taken along line B-B' of FIG. 18, and FIG. 20C is a cross-sectional view taken along line C-C' of FIG. 18. FIG. 21 is an analysis picture showing ohmic contact between a first contact electrode and a first conductive type semiconductor layer in the light emitting element according to the seventh exemplary embodiment and FIG. 22 is an analysis picture showing one edge end of the light emitting element according to the seventh exemplary embodiment. FIG. 23 is an analysis picture showing ohmic contact between the first contact electrode and a second contact electrode in the light emitting element according to the seventh exemplary embodiment.

Referring to FIG. 18 to FIG. 20B, the light emitting element 10 according to the seventh exemplary embodiment includes first to third light emitting cells C1, C2, C3, a first electrode connection D1, a second electrode connection D2, a first electrode pad, 39 and a second electrode pad 41.

As shown in FIG. 18 and FIG. 19, in the light emitting element 10 according to the seventh exemplary embodiment, the first to third light emitting cells C1, C2, C3 are electrically connected to each other in series and have substantially the same size. The first to third light emitting cells C1, C2, C3 are disposed parallel to one another and arranged adjacent to one another.

The first light emitting cell C1 is electrically connected to the second light emitting cell C2 by the first electrode connection D1 and the second light emitting cell C2 is electrically connected to the third light emitting cell C3 by the second electrode connection D2. That is, the first to third light emitting cells C1, C2, C3 are electrically connected to one another in series by the first and second electrode connections D1, D2.

The first and second electrode pads 39, 41 are formed to partially cover the first to third light emitting cells C1, C2, C3 and are separated from one another by a predetermined distance. The first and second electrode pads 39, 41 are connected to an external power source to supply electric power to the light emitting element 10.

The second electrode pad 41 is electrically connected to the first light emitting cell C1 and the third light emitting cell C3. That is, as shown in FIG. 19, electric current supplied from an external power source flows to the first light emitting cell C1, the second light emitting cell C2 and the third light emitting cell C3 through the second electrode pad 41 and finally flows to the first electrode pad 39. Here, in order to allow electric current flowing from the second electrode pad 41 to be uniformly distributed to the first to third light emitting cells C1, C2, C3, the first electrode connection D1 and the second electrode connection D2 are disposed to be separated from each other as far as possible.

Specifically, the first electrode connection D1 is formed on an upper surface of the second light emitting cell C2 and the second electrode connection D2 is formed on an upper surface of the third light emitting cell C3 such that the first electrode connection D1 electrically connects the first and second light emitting cells C1, C2 to each other and the second electrode connection D2 electrically connects the second and third light emitting cells C2, C3 to each other. In order to dispose the first electrode connection D1 and the second electrode connection D2 to be separated as far as possible with reference to the second light emitting cell, the first and second electrode connections D1, D2 may be arranged as follows. With reference to the second light emitting cell C2, the first electrode connection D1 is disposed at one side of the second light emitting cell C2 and the second electrode connection D2 is disposed at the other side of the second light emitting cell C2. Further, in order to dispose the first electrode connection D1 and the second electrode connection D2 to be separated as far as possible with reference to the second light emitting cell, the first and second electrode connections D1, D2 may be disposed in the diagonal direction with reference to the second light emitting cell C2.

As shown in FIG. 18, in the light emitting element 10 according to the seventh exemplary embodiment, three light emitting cells C1, C2, C3 are arranged in series. Since the first light emitting cell C1 is electrically connected to the second electrode pad 41, the first electrode connection D1 may be formed at a location where the first light emitting cell C1 is not electrically connected to the second electrode pad 41. Further, in order to dispose the first electrode connection D1 and the second electrode connection D2 to be separated from each other as far as possible, the second electrode connection D2 may be disposed in the diagonal direction of the first electrode connection D1 with reference to the second light emitting cell C2. In this structure, the second electrode connection D2 may be formed on a portion of the third light emitting cell C3 and the third light emitting cell C3 may be electrically connected to the first electrode pad 39 at a location where the second electrode connection D2 is not formed.

Accordingly, as shown in FIG. 19, electric current can flow through the overall region of the first to third light emitting cells C1, C2, C3.

Here, the first electrode pad 39 and the second electrode pad 41 are disposed over the first to third light emitting cells C1, C2, C3, whereby heat caused by application of electric current to the first to third light emitting cells C1, C2, C3 can be more effectively discharged to the outside.

Referring to FIGS. 20A-20B, details of the first to third light emitting cells C1, C2, C3 will be described.

As shown in FIG. 20A, each of the first to third light emitting cells C1, C2, C3 includes a substrate 21, a light emitting structure 23, a first contact electrode 31, a second contact electrode 33, a first insulation layer 35, a second insulation layer 37, a third insulation layer, a first electrode pad 39, and a second electrode pad 41.

The substrate 21 may be any substrate which allows growth of the light emitting structure 23 thereon, and may include, for example, a sapphire substrate, a silicon carbide substrate, a silicon substrate, a gallium nitride substrate, and an aluminum nitride substrate. In the seventh exemplary embodiment, the substrate 21 may include a plurality of patterns 21a on an upper surface thereof. As shown in FIG. 20A, the patterns 21a on the upper surface of the substrate 21 may be composed of or include a plurality of protrusions, and each of the patterns 21a may have a peak or a flat plane on an upper surface thereof. Here, as shown in FIG. 20A and FIG. 22, the patterns 21a formed on the upper surface of the substrate 21 may have a small size in a region of the substrate 21 where the light emitting structure 23 is not formed.

The substrate 21 may be separated from the light emitting structure 23 using a technique known in the art, as needed, whereby the light emitting structure 23 may have a rough region formed on a lower surface thereof.

The light emitting structure 23 includes a first conductive type semiconductor layer 25, an active layer 27 disposed on the first conductive type semiconductor layer 25, and a second conductive type semiconductor layer 29 disposed on the active layer 27.

The light emitting structure 23 may include a partially exposed region of the first conductive type semiconductor layer 25 formed by partially removing the second conductive type semiconductor layer 29 and the active layer 27. That is, as shown in FIG. 20A, a plurality of holes h may be formed through the second conductive type semiconductor layer 29 and the active layer 27 to expose the first conductive type semiconductor layer 25. Here, the shape and arrangement of the holes h may be modified in various ways.

The light emitting structure 23 may include a mesa which includes the active layer 27 and the second conductive type semiconductor layer 29 and may further includes a portion of the first conductive type semiconductor layer 25. A first hole h1 may be formed in the mesa so as to expose the first conductive type semiconductor layer 25 and may be formed in plural.

The first contact electrode 31 and the second contact electrode 33 may form ohmic contact with the first conductive type semiconductor layer 25 and the second conductive type semiconductor layer 29, respectively. First, the second contact electrode 33 will be described. The second contact electrode 33 is formed to cover an upper surface of the second conductive type semiconductor layer 29 and may be formed on an upper surface of the mesa.

The second contact electrode 33 may be formed of any material capable of forming ohmic contact with the second conductive type semiconductor layer 29 and may include, for example, at least one of a metallic material or a conductive oxide. In the structure wherein the second contact electrode 33 includes a metallic material, the second contact electrode 33 may include a reflective layer (not shown), which forms ohmic contact with the second conductive type semiconductor layer 29, and a cover layer (not shown) covering the reflective layer to protect the reflective layer. The reflective layer may include a metal and may be composed of a single layer or multiple layers. In the structure wherein the second contact electrode 33 is composed of multiple layers, the second contact electrode 33 may include Ti, Ni or Au, and may have a structure wherein Au and Ti layers are sequentially stacked on a stack structure of Ti and Ni layers alternately stacked one above another.

The first insulation layer 35 may be formed on an upper surface of the light emitting structure 23 to cover the second contact electrode 33. The first insulation layer 35 may be formed to cover side surfaces of the first holes h formed in the mesa. Further, as shown in FIG. 20B and FIG. 20C, the first insulation layer 35 may be formed with second holes h2 which partially expose the second contact electrode 33. With this structure, the first contact electrode 31 of the light emitting cell adjacent to the second contact electrode 33 can form ohmic contact through the second holes h2.

The first insulation layer 35 may include an insulation material, for example, $SiO_2$, $SiN_x$, or $MgF_2$, and the like. The first insulation layer 35 may be composed of multiple layers and may include a distributed Bragg reflector in which materials having different indices of refraction are alternately stacked.

In addition, as shown in FIG. 20A to FIG. 20C, the first insulation layer 35 may be formed to cover a portion of the substrate 21. The structure of the first insulation layer 35 can vary depending upon chip unit isolation in fabrication of the light emitting element 10. When the first insulation layer 35 is formed after chip unit isolation of a wafer in fabrication of the light emitting element 10, the first insulation layer 35 may be formed to cover a portion of the substrate 21. Thus, the first insulation layer 35 may be formed to cover a side surface of the light emitting structure 23 exposed through the side surface of the substrate 21 while covering the substrate at opposite ends of the light emitting element 10.

When the first insulation layer 35 is formed to cover a portion of the substrate 21, the first insulation layer 35 may be formed to cover some patterns 21a formed on the substrate 21 instead of covering all of the patterns 21a. Accordingly, some patterns 21a of the substrate 21 may be exposed towards an upper side of the first insulation layer 35 at the corresponding locations.

As shown in FIG. 20C, the first insulation layer 35 may be formed to cover a portion of the substrate 21 in a separation space between the light emitting cells.

The first insulation layer 35 may include a pre-insulation layer 35a and a main insulation layer 35b. The pre-insulation layer 35a may be formed prior to the main insulation layer 35b and thus may be disposed under the main insulation layer 35b.

The pre-insulation layer 35a may cover a portion of the light emitting structure 23 and may be formed to cover a portion of an upper surface or a side surface of the second contact electrode 33. After the pre-insulation layer 35a is formed to cover the upper surface of the light emitting structure 23, the pre-insulation layer 35a may be subjected to etching so as to expose a portion of the second conductive type semiconductor layer 29. The second contact electrode 33 may be formed on the exposed region of the second conductive type semiconductor layer 29. As a result, the pre-insulation layer 35a may be connected to the second contact electrode 33.

The pre-insulation layer 35a may be formed in the course of forming the second contact electrode 33. For example, in a structure wherein the second contact electrode 33 includes a conductive oxide layer (not shown) and a reflective electrode layer (not shown), the conductive oxide layer may be formed on the second conductive type semiconductor layer 29 and the pre-insulation layer 35a may be formed before formation of the reflective electrode layer. After the reflective electrode layer is formed, the main insulation layer 35b is formed to cover the reflective electrode layer, thereby forming the first insulation layer 35. In this exemplary embodiment, the pre-insulation layer 35a may have a thickness of about 1,000 Å and the second contact electrode 33 may have a thickness of about 11 kÅ.

In the seventh exemplary embodiment, the pre-insulation layer 35a and the main insulation layer 35b may be formed of the same material, for example, $SiO_2$.

Before formation of the main insulation layer 35b, the periphery of the light emitting element 10 may be etched for chip unit isolation of the light emitting element 10, and during this process, the patterns 21a exposed at the periphery of the substrate 21 may also be etched. Thus, the exposed patterns 21a may have a smaller size than the patterns 21a covered by the light emitting structure 23 as shown in FIG. 20A.

The first contact electrode 31 is formed on the upper surface of the first insulation layer 35 so as to cover the entirety of the first insulation layer 35 excluding a portion thereof. With this structure, the first contact electrode 31 can fill the first holes h1 formed in the mesa and the second holes h2 formed in the first insulation layer 35. The first contact electrode 31 forms ohmic contact with the first conductive type semiconductor layer 25 through the first holes h1 formed in the mesa, as shown in FIG. 20A. Further, as shown in FIG. 20B and FIG. 20C, the first contact electrode 31 may form ohmic contact with the second contact electrode 33 of another light emitting cell adjacent thereto through the second holes h2 formed in the first insulation layer 35.

Here, in the course of etching the first insulation layer 35 to form the first holes h1 and the second holes h2, a portion of the surface of the first conductive type semiconductor layer 25 exposed through the first holes h1 and a portion of the second contact electrode 33 exposed through the second holes h2 can also be etched together with the first insulation layer 35.

As such, in the course of etching the first insulation layer 35 to form the first holes h1, the surface of the first conductive type semiconductor layer 25 can also be partially etched together with the first insulation layer 35. Thus, as shown in FIG. 21, the first conductive type semiconductor layer 25 may have a step at a location thereof corresponding to the first holes h1.

As described above, when the second contact electrode 33 has the structure wherein the Au and Ti layers are sequentially stacked on the stack structure of Ti and Ni layers alternately stacked one above another, the Ti layer formed as the uppermost layer of the second contact electrode 33 may also be etched in the course of etching the first insulation layer 35. As a result, the uppermost layer of the second contact electrode 33 is the Ti layer in a region in which the first insulation layer 35 adjoins the second contact electrode 33, and the uppermost layer of the second contact electrode 33 exposed through the second holes h2 is the Au layer. Thus, the first contact electrode 31 can form ohmic contact with the uppermost layer of the second contact electrode 33, that is, the Au layer, through the second holes h2. Here, while the first contact electrode 31 is etched, the prior uppermost layer, that is, the Ti layer may be etched together with some of the subsequent layer, that is, the Au layer. As a result, as shown in FIG. 23, the first contact electrode 31 may have a step formed at a location thereof corresponding to the second holes h2. Here, the first insulation layer 35 may be subjected to dry etching.

In addition, the first contact electrode 31 is formed to cover the entirety of the first insulation layer 35 excluding a portion thereof, whereby light emitted from the light emitting structure 23 can be reflected by the first contact electrode 31. As shown in FIG. 20A to FIG. 20C, the first contact electrode 31 is formed to cover the side surface of the substrate 21 and the side surface of the separation space between the light emitting cells, whereby light emitted from the light emitting structure 23 can be reflected by the first contact electrode 31 and emitted to the outside. As a result, luminous efficacy of the light emitting element 10 can be maximized.

In this exemplary embodiment, the first contact electrode 31 acts as the first and second electrode connections D1, D2 of FIG. 18 and FIG. 19. That is, referring to FIG. 20C, the first contact electrode 31 of the first light emitting cell C1 extends to an upper surface of the second contact electrode 33 of the second light emitting cell C2 through the separation space between the first light emitting cell C1 and the second light emitting cell C2. The first contact electrode 31 of the first light emitting cell C1 is formed to partially cover the mesa, the first insulation layer 35 and the second contact electrode 33 of the second light emitting cell C2, and forms ohmic contact with the second contact electrode 33 of the second light emitting cell C2 through the second holes h2 formed in the first insulation layer 35 of the second light emitting cell C2. Further, the first contact electrode 31 of the second light emitting cell C2 is formed to cover the first insulation layer 35 of the second light emitting cell C2 while being separated from the first contact electrode 31 of the first light emitting cell C1 by a predetermined distance.

As a result, the first contact electrode 31 may be formed to cover the side surface of another light emitting cell adjacent thereto, as shown in FIG. 20C. That is, the first contact electrode 31 of the first light emitting cell C1 extends from the upper surface of the first light emitting cell C1 to cover a portion of the second light emitting cell C2 and a side surface of the second light emitting cell C2.

Further, as described above, the first contact electrode 31 may form ohmic contact with the first conductive type semiconductor layer 25 through the plurality of first holes h1, and, as shown in FIG. 19 and FIG. 20B, the first electrode connection D1 or the second electrode connection D2 may be disposed between the first holes h1. Specifically, referring to FIG. 20B, in the third light emitting cell C3, the first contact electrode 31 is formed to cover a plurality of mesas while forming ohmic contact with the first conductive type semiconductor layer 25 through the first holes h1. Here, the first contact electrode 31 of the second light emitting cell C2 may extend to form ohmic contact with the second conductive type semiconductor layer 29 through the second holes h2 disposed between the first holes h1, thereby forming the second electrode connection D2. In other words, the second electrode connection D2 may be disposed between the first holes h1.

As described above, the first contact electrode 31 serves to form ohmic contact with the first conductive type semiconductor layer 25 while reflecting light. As a result, the first contact electrode 31 may include a highly reflective metal layer such as an Al layer, and may be composed of a single layer or multiple layers. Here, the highly reflective metal layer may be formed on a contact layer such as a Ti, Cr or Ni layer, and the first contact electrode 31 may include at least one of Ni, Pt, Pd, Rh, W, Ti, Al, Mg, Ag or Au.

The second insulation layer 37 is formed to cover the entire region of the first contact electrode 31 excluding some regions thereof. The second insulation layer 37 may be formed with a first opening op1 that partially exposes the first contact electrode 31 and a second opening op2 that partially exposes the second contact electrode 33. Here, the second opening op2 may be formed through the first insulation layer 35, the first contact electrode 31 and the second insulation layer 37, and the second insulation layer 37 may include one or more first openings op1 and one or more second openings op2.

The first electrode pad 39 may form ohmic contact with the first contact electrode 31 through the first openings op1 and the second electrode pad 41 may form ohmic contact with the second contact electrode 33 through the second openings op2.

The second insulation layer 37 may include an insulation material, for example, $SiO_2$, $SiN_x$, or $MgF_2$, and the like. The second insulation layer 37 may be composed of multiple layers and may include a distributed Bragg reflector in which materials having different indices of refraction are alternately stacked. In the structure wherein the second insulation layer 37 is composed of multiple layers, the uppermost layer of the second insulation layer 37 is formed of $SiN_x$. The structure wherein the uppermost layer of the second insulation layer 37 is formed of $SiN_x$ can more effectively prevent moisture penetration into the light emitting structure 23.

The first electrode pad 39 and the second electrode pad 41 may be disposed on the second insulation layer 37 and electrically connected to the first contact electrode 31 and the second contact electrode 33, respectively. As shown in FIG. 20A, the first electrode pad 39 may form ohmic contact with the first contact electrode 31 through the first openings op1. In addition, the second electrode pad 41 may form ohmic contact with the second contact electrode 33 through the second openings op2.

The first electrode pad 39 is formed over the first to third light emitting cells C1, C2, C3, and the first openings op1 are formed in the third light emitting cell C3. With this structure, the first electrode pad 39 forms ohmic contact with the first contact electrode 31 of the third light emitting cell C3. In addition, the second electrode pad 41 is formed over the first to third light emitting cells C1, C2, C3 while being separated from the first electrode pad 39 by a predetermined distance or more, and the second openings op2 are formed in the first light emitting cell C1. With this structure, the second electrode pad 41 forms ohmic contact with the second contact electrode 33 of the first light emitting cell C1.

The first openings op1 and the second openings op2 may be formed by etching the second insulation layer 37. The first contact electrode 31 and the second contact electrode 33 exposed through the first and second openings op1, op2 may be etched in the course of etching the second insulation layer 37. That is, when each of the first and second contact electrodes 31, 33 is composed of multiple layers including Ti, Ni and Au, the first and second contact electrodes 31, 33 may have a structure wherein Au and Ti layers are sequentially stacked on a stack structure of Ti and Ni layers alternately stacked one above another. Here, in each of the first and second contact electrodes 31, 33, since the Ti layer formed as the uppermost layer may also be etched together with the second insulation layer 37 in the course of forming the first and second openings op1, op2, the uppermost layer of each of the first and second contact electrodes 31, 33 exposed through the first and second openings op1, op2 is the Au layer. With this structure, the first and second electrode pads 39, 41 may form ohmic contact with the first and second contact electrodes 31, 33, the uppermost layer of which is the Au layer, through the first and second openings op1, op2. Here, the second insulation layer 37 may be subjected to dry etching.

In addition, each of the first electrode pad 39 and the second electrode pad 41 may be formed in the separation space between the first to third light emitting cells C1, C2, C3. In some implementations, each of the first electrode pad 39 and the second electrode pad 41 may fill the separation space between the first to third light emitting cells C1, C2, C3 and may have a thickness of dozens of micrometers, whereby the light emitting element 10 can be used as a chip-scale package.

Each of the first electrode pad 39 and the second electrode pad 41 may be composed of a single layer or multiple layers and may include an electrically conductive material. For example, each of the first electrode pad 39 and the second electrode pad 41 may include at least one of Cu, Pt, Au, Ti, Cr, Ni, Al or Ag, or may also include sintered metal particles and non-metallic materials interposed between metal particles. Here, the first electrode pad 39 and the second electrode pad 41 may be formed by plating, deposition, dotting, or screen printing, and the like.

Although not shown in the drawings, the light emitting element according to the seventh exemplary embodiment may further include a heat dissipation pad. In the light emitting element 10, the heat dissipation pad may be disposed between the first electrode pad 39 and the second electrode pad 41 to be separated from the first and second electrode pads 39, 41. The heat dissipation pad is disposed on the second insulation layer 37 to be insulated from other components. As a result, heat generated from the light emitting structure 23 can be transferred to the heat dissipation pad through the second insulation layer 37.

The heat dissipation pad may include the same material as the first and second electrode pads 39, 41 and may be formed by the same method. In the seventh exemplary embodiment, the entirety of the first and second electrode pads 39, 41 and the heat dissipation pad may be formed to cover most of the light emitting element 10, for example, 50% or more of the light emitting element 10 in plan view.

The light emitting element 10 described above may be fabricated by the following method. A light emitting structure 23 is grown on an upper surface of a substrate 21 and is partially etched to form a mesa. As a result, the light emitting structure 23 may include at least one mesa, and a first conductive type semiconductor layer 25, an active layer 27 and a second conductive type semiconductor layer 29 may be exposed through a side surface of the mesa. After the mesa is formed on the light emitting structure 23, a pre-insulation layer 35a is formed to cover an upper surface and a side surface of the mesa.

Thereafter, a portion of the pre-insulation layer 35a on the mesa is removed by etching, and a second contact electrode 33 is formed on an exposed upper surface of the second conductive type semiconductor layer 29 formed by etching. After formation of the second contact electrode 33, the light emitting element 10 is formed into individual chips through chip unit isolation, whereby the light emitting element 10 is divided into a plurality of light emitting cells.

Here, due to chip unit isolation of the light emitting element 10, the periphery of the substrate 21 can be exposed together with a portion of the substrate between the light emitting cells, and some patterns formed on the upper surface of the substrate 21 may have a small size.

Then, a first insulation layer 35 (here, the first insulation layer refers to the main insulation layer 35b) is formed to cover the entire upper surface of the light emitting element 10 divided into a plurality of light emitting cells and the light emitting structure 23 exposed through the side surface of the mesa. Here, the first insulation layer 35 is formed to cover openings formed in the mesa and exposing the first conductive type semiconductor layer 25. Then, first holes h1 are formed to expose the first conductive type semiconductor layer 25 by etching the first insulation layer 35 formed in the openings. Further, in order to electrically connect adjacent light emitting cells to each other, second holes h2 are formed to expose a portion of the second contact electrode 33 by partially etching the first insulation layer 35 covering the upper surface of the second contact electrode 33.

A first contact electrode 31 is formed to cover an upper surface of the first insulation layer 35 having the first holes h1 and the second holes h2 formed therein. The first contact electrode 31 may be formed over the entire region of the light emitting element 10 while forming in or filling the separation space between the light emitting cells such that light emitted from the light emitting structure 23 can be reflected by the first contact electrode 31. In addition, the first contact electrode 31 of one of plural light emitting cells may be formed to cover a portion of another light emitting cell adjacent thereto such that adjacent light emitting cells can be electrically connected to each other. Here, the first contact electrodes 31 of the light emitting cells are insulated from each other.

A second insulation layer 37 may be formed to cover an upper surface of the first contact electrode 31. The second insulation layer 37 may be formed to cover the entire region of the light emitting element 10 including the first contact electrode 31. After formation of the second insulation layer 37, in order to form a first electrode pad 39 and a second electrode pad 41 on the light emitting element 10, a first opening op1 is formed in the second insulation layer 37 of one of the light emitting cells included in the light emitting element 10 by etching the second insulation layer 37 so as to expose the first contact electrode 31. Then, a second opening op1 is formed in the second insulation layer 37 of another light emitting cell by etching the second insulation layer 37 so as to expose the second contact electrode 33. The first opening op1 and the second opening op2 may be formed in plural.

Then, the first electrode pad 39 is formed on an upper surface of the second insulation layer 37 to form ohmic contact with the first contact electrode 31 exposed through the first openings op1, and the second electrode pad 41 is formed on the upper surface of the second insulation layer 33 to form ohmic contact with the second contact electrode 33 exposed through the second openings op2.

As needed, a heat dissipation pad may be formed between the first and second electrode pads 39, 41 on the second insulation layer 37.

Figure 24:
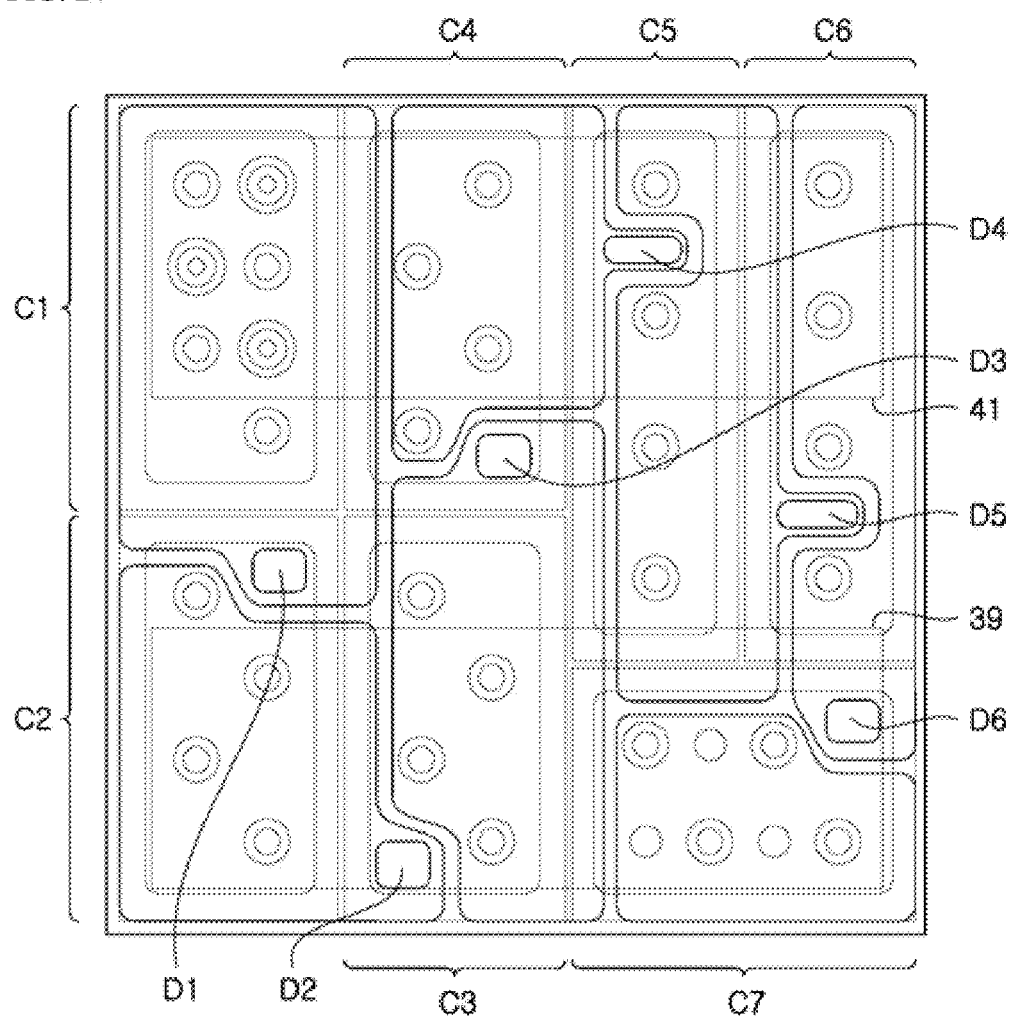
FIG. 24 is a plan view of a light emitting element according to an eighth exemplary embodiment of the present disclosure.

FIG. 24 is a plan view of a light emitting element according to an eighth exemplary embodiment of the present disclosure.

Referring to FIG. 24, the light emitting element 10 according to the eighth exemplary embodiment includes first to seventh light emitting cells C1, C2, C3, C4, C5, C6, C7, first to sixth electrode connections D1, D2, D3, D4, D5, D6, a first electrode pad 39, and a second electrode pad 41.

As shown therein, the first to seventh light emitting cells C1, C2, C3, C4, C5, C6, C7 are disposed coplanar with one another and electrically connected to one another. The first to seventh light emitting cells C1, C2, C3, C4, C5, C6, C7 may have substantially the same size. For series connection among the first to seventh light emitting cells C1, C2, C3, C4, C5, C6, C7, these light emitting cells are electrically connected to one another by the first to sixth electrode connections D1, D2, D3, D4, D5, D6.

Thus, the first light emitting cell C1 is electrically connected to the second light emitting cell C2 by the first electrode connection D1. Here, the second light emitting cell C2 is disposed under the first light emitting cell C1 and the first electrode connection D1 is disposed at an upper right side of the second light emitting cell C2. The second light emitting cell C2 is electrically connected to the third light emitting cell C3 by the second electrode connection D2. Here, the third light emitting cell C3 is disposed at the right side of the second light emitting cell C2 and the second electrode connection D2 is disposed at a lower left side of the third light emitting cell C3.

The third light emitting cell C3 is electrically connected to the fourth light emitting cell C4 by the third electrode connection D3. Here, the fourth light emitting cell C4 is disposed on the third light emitting cell C3 and the third electrode connection D3 is disposed at a lower right side of the fourth light emitting cell C4. In this arrangement, the fourth light emitting cell C4 is disposed at the right side of the first light emitting cell C1.

The fourth light emitting cell C4 is electrically connected to the fifth light emitting cell C5 by the fourth electrode connection D4. Here, the fifth light emitting cell C5 is disposed at the right side of the fourth light emitting cell C4 and the fourth electrode connection D4 is disposed at an upper left side of the fifth light emitting cell C5. The fifth light emitting cell C5 may have a narrower width and a longer length than the fourth light emitting cell C4.

The fifth light emitting cell C5 is electrically connected to the sixth light emitting cell C6 by the fifth electrode connection D5. Here, the sixth light emitting cell C6 is disposed at the right side of the fifth light emitting cell C5 and the fifth electrode connection D5 is disposed at a lower left side of the sixth light emitting cell C6.

The sixth light emitting cell C6 is electrically connected to the seventh light emitting cell C7 by the sixth electrode connection D6. Here, the seventh light emitting cell C7 is disposed under the fifth and sixth light emitting cells C5, C6 and the sixth electrode connection D6 is disposed at an upper right side of the seventh light emitting cell C7. The seventh light emitting cell C7 has the same width as the sum of widths of the fifth and sixth light emitting cells C5, C6, and a shorter length than any other light emitting cells.

The first to seventh light emitting cells C1, C2, C3, C4, C5, C6, C7 are connected to each other in series to constitute one light emitting element 10.

The first to sixth electrode connections D1, D2, D3, D4, D5, D6 are disposed on the second to seventh light emitting cells C2, C3, C4, C5, C6, C7, respectively. To this end, the first contact electrode 31 extends to an upper surface of another light emitting cell adjacent thereto, thereby minimizing loss of light in the light emitting element 10 despite the separation space between the light emitting cells.

The first to sixth electrode connections D1, D2, D3, D4, D5, D6 are disposed such that adjacent electrode connections can be separated from each other as far as possible. For example, with reference to the second light emitting cell C2, the first electrode connection D1 is disposed at the upper right side of the second light emitting cell C2 and the second electrode connection D2 is disposed at the lower right side of the second light emitting cell C2. As a result, electric current applied to the second light emitting cell C2 through the first electrode connection D1 flows to the second electrode connection D2 throughout the second light emitting cell C2. That is, the first electrode connection D1 is disposed at a corner of one surface of the second light emitting cell C2 and the second electrode connection D2 is disposed at a corner of another surface of the first electrode connection D1.

Further, with reference to the third light emitting cell C3, the second electrode connection D2 is disposed at the lower left side of the third light emitting cell C3 and the third electrode connection D3 is disposed at the upper right side of the third light emitting cell C3. As a result, with reference to the third light emitting cell C3, the second electrode connection D2 and the third electrode connection D3 are disposed in the diagonal direction, whereby electric current applied to the third light emitting cell C3 through the second electrode connection D2 can flow to the third electrode connection D3 through the third light emitting cell C3.

Figure 25:
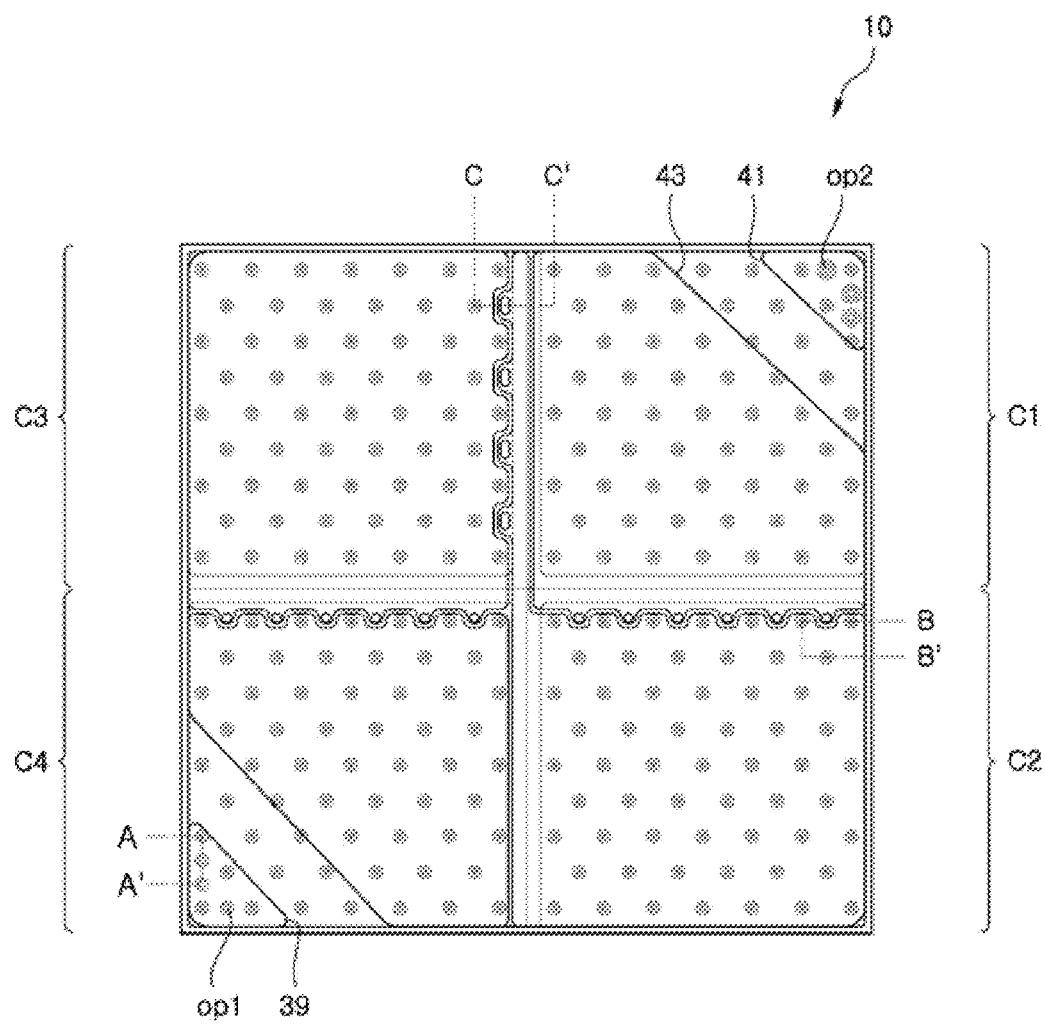
FIG. 25 is a plan view of a light emitting element according to a ninth exemplary embodiment of the present disclosure.
Figure 26:
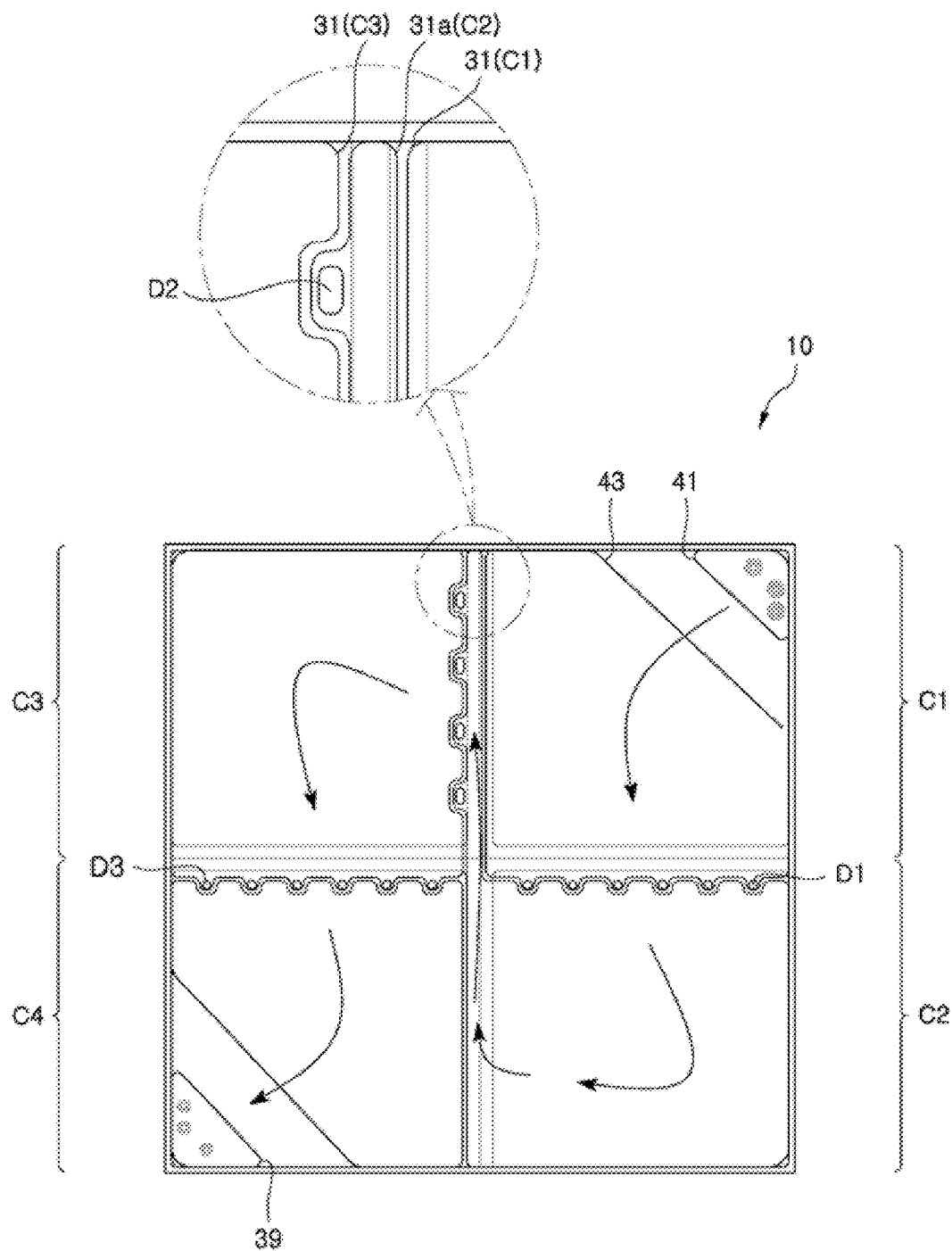
FIG. 26 is a schematic plan view of the light emitting element according to the ninth exemplary embodiment of the present disclosure.
Figure 27A:
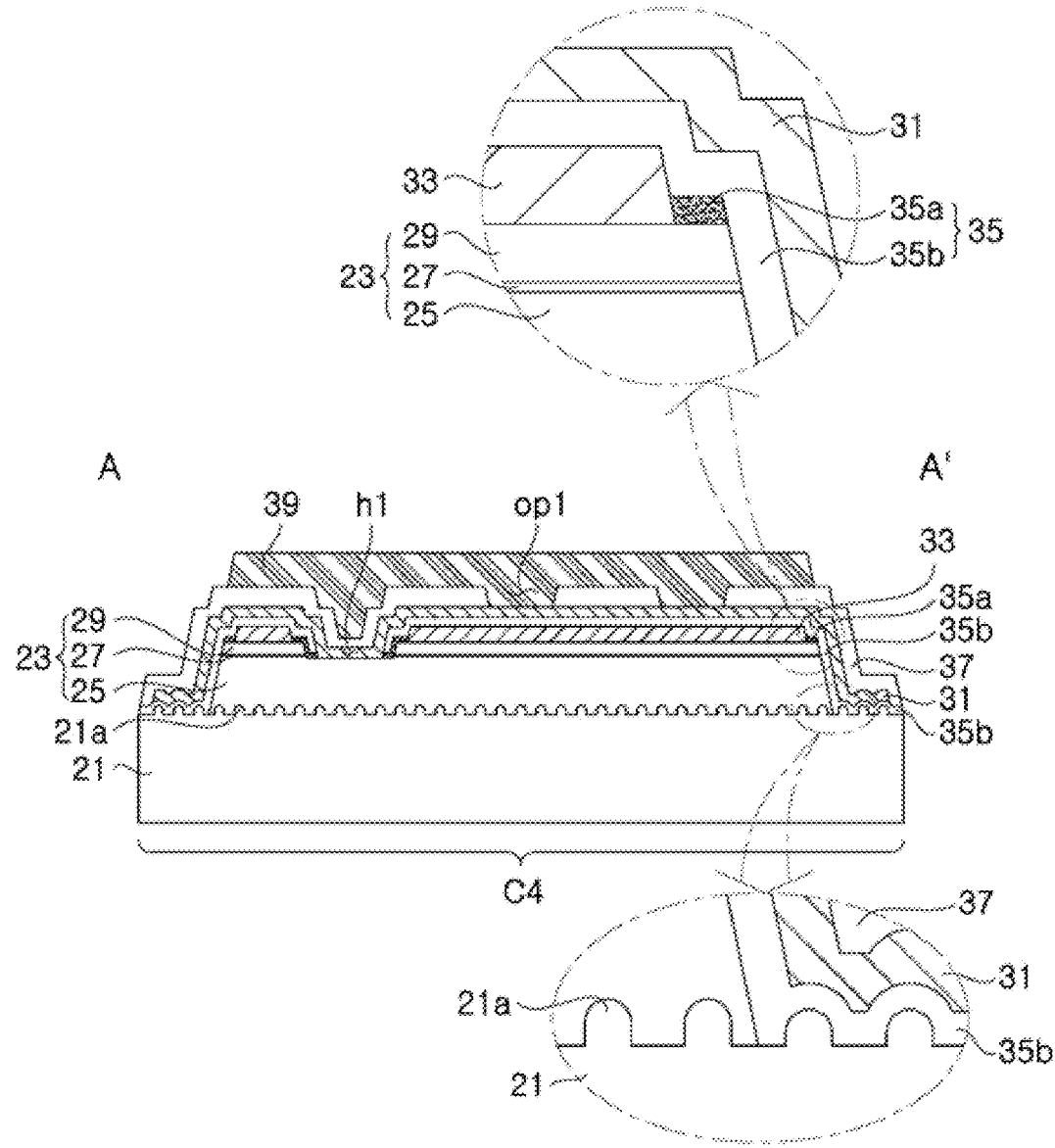

FIG. 25 is a plan view of a light emitting element according to a ninth exemplary embodiment of the present disclosure and FIG. 26 is a schematic plan view of the light emitting element according to the ninth exemplary embodiment of the present disclosure. FIG. 27A is a cross-sectional view taken along line A-A' of FIG. 25, FIG. 27B is a cross-sectional view taken along line B-B' of FIG. 25, and FIG. 27C is a cross-sectional view taken along line C-C' of FIG. 25.

As shown in FIG. 25 to FIG. 27C, the light emitting element 10 according to a ninth exemplary embodiment includes first to fourth light emitting cells C1, C2, C3, C4, first to third electrode connections D1, D2, D2, a first electrode pad 39, a second electrode pad 41, and a heat dissipation pad 43.

As shown in FIG. 25 and FIG. 26, in the light emitting element 10 according to the ninth exemplary embodiment, the first to fourth light emitting cells C1, C2, C3, C4 are electrically connected to each other in series and have substantially the same area. Thus, in the ninth exemplary embodiment, four light emitting cells C1, C2, C3, C4 are disposed adjacent to one another and the arrangement of four light emitting cells C1, C2, C3, C4 has a shape substantially similar to a square.

Here, among the four light emitting cells C1, C2, C3, C4, the first light emitting cell C1 may be disposed at the upper right side and the second light emitting cell C2 may be disposed at the lower right side in FIG. 25 and FIG. 26. The third light emitting cell C3 may be disposed at the upper left side and the fourth light emitting cell C4 may be disposed at the lower left side.

Further, the first light emitting cell C1 is electrically connected to the second light emitting cell C2 by the first electrode connection D1; the second light emitting cell C2 is electrically connected to the third light emitting cell C3 by the second electrode connection D2; and the third light emitting cell C3 is electrically connected to the fourth light emitting cell C4 by the third electrode connection D3. That is, the first to fourth light emitting cells C1, C2, C3, C4 are electrically connected to each other by the first to third electrode connections D1, D2, D3.

In the above arrangement of the first to fourth light emitting cells C1, C2, C3, C4, the first light emitting cell C1 and the second light emitting cell C2 are disposed such that one side of the first light emitting cell C1 faces one side of the second light emitting cell C2, and the third light emitting cell C3 and the fourth light emitting cell C4 are also disposed such that one side of the third light emitting cell C3 faces one side of the fourth light emitting cell C4. However, the second light emitting cell C2 and the third light emitting cell C3 are not disposed such that one side of the second light emitting cell C2 faces one or the other side of the third light emitting cell C3. Accordingly, the first electrode connection D1 electrically connecting the first light emitting cell C1 to the second light emitting cell C2 is disposed on the second light emitting cell C2 and extends from one side of the first light emitting cell C1 towards the second light emitting cell C2. The third electrode connection D3 electrically connecting the third light emitting cell C3 to the fourth light emitting cell C4 is disposed on the fourth light emitting cell C4.

However, the second light emitting cell C2 and the third light emitting cell C3 are not disposed to be adjacent each other such that one side of the second light emitting cell C2 faces one or the other side of the third light emitting cell C3. The second electrode connection D2 is disposed on the third light emitting cell C3. To this end, the first contact electrode 31 of the second light emitting cell C2 extends from the second light emitting cell C2 to the second electrode connection D2 disposed on the third light emitting cell C3.

Referring to FIG. 25 and FIG. 26, the second electrode connection D2 is formed on the right side of the third light emitting cell C3, and an extension portion 31a of the first contact electrode 31 of the second light emitting cell C2 extends to a space between the first contact electrode 31 of the first light emitting cell C1 and the first contact electrode 31 of the third light emitting cell C3 and is electrically connected to the second electrode connection D2. The extension portion 31a is separated and insulated from the first contact electrode 31 of the first light emitting cell C1 and the first contact electrode 31 of the third light emitting cell C3. The first contact electrode 31 of each of the light emitting cells C1, C2, C3, C4 will be described in more detail below.

As described above, the first to third electrode connections D1, D2, D3 are formed on the second to fourth light emitting cells C2, C3, C4, respectively. In some implementations, the first to third electrode connections D1, D2, D3 are formed on the sides of the second to fourth light emitting cells C2, C3, C4 adjacent to the first to third light emitting cells C1, C2, C3, respectively. Further, in the structure wherein each of the first to third electrode connections D1, D2, D3 is provided in plural, each of the first to third electrode connections D1, D2, D3 is disposed along the corresponding side of each of the second to fourth light emitting cells C2, C3, C4 to be separated from one another.

The first electrode pad 39 and the second electrode pad 41 are formed to partially cover the fourth light emitting cell C4 and the first light emitting cell C1, respectively. The first electrode pad 39 is disposed at a corner of the fourth light emitting cell C4 to be electrically connected to the fourth light emitting cell C4, and the second electrode pad 41 is disposed at a corner of the first light emitting cell C1 to be electrically connected to the first light emitting cell C1.

In the ninth exemplary embodiment, the first and second electrode pads 39, 41 have a triangular shape and are arranged so as to be separated from each other as far as possible in a plan view of the light emitting element 10. Further, the heat dissipation pad 43 may be formed in a hexagonal shape between the first electrode pad 39 and the second electrode pad 41. Here, the shapes of the first electrode pad 39, the second electrode pad 41 and the heat dissipation pad 43 are not limited to the shapes shown in the drawings and may be changed in various ways, as needed. Further, the first electrode pad 39, the second electrode pad 41 and the heat dissipation pad 43 may be separated from one another by a predetermined distance.

In the ninth exemplary embodiment, the heat dissipation pad 43 is formed to cover most of the first to fourth light emitting cells C1, C2, C3, C4 by covering the entirety of the second light emitting cell C2 and the third light emitting cell C3 on which the first electrode pad 39 and the second electrode pad 41 are not disposed. With this structure, the heat dissipation pad 43 is formed such that at least three sides of the heat dissipation pad 43 are exposed to the outside in a plan view of the light emitting element 10, and may have, for example, a hexagonal shape. As such, the heat dissipation pad 43 is formed over the first to fourth light emitting cells C1, C2, C3, C4, whereby heat caused by application of electric current to the first to fourth light emitting cells C1, C2, C3, C4 can be more effectively discharged.

Referring to FIGS. 27A-27C, details of the first to fourth light emitting cells C1, C2, C3, C4 will now be described.

Referring to FIG. 27A, each of the first to fourth light emitting cells C1, C2, C3, C4 includes a substrate 21, a light emitting structure 23, a first contact electrode 31, a second contact electrode 33, a first insulation layer 35, a second insulation layer 37, a first electrode pad 39, a second electrode pad 41, and a heat dissipation pad 43. In description of the first to fourth light emitting cells C1, C2, C3, C4, descriptions of the same components as those of the above exemplary embodiments will be omitted.

The substrate 21 may be any substrate which allows growth of the light emitting structure 23 thereon, and may include, for example, a sapphire substrate, a silicon carbide substrate, a silicon substrate, a gallium nitride substrate, and an aluminum nitride substrate. In the ninth exemplary embodiment, the substrate 21 may include a plurality of patterns 21a on an upper surface thereof. As shown in FIG. 27A, the patterns 21a formed on the upper surface of the substrate 21 may include a plurality of protrusions, and each of the patterns 21a may have a peak or a flat plane on an upper surface thereof. Here, the plurality of patterns 21a formed on the upper surface of the substrate 21 may have a small size in a region of the substrate 21 where the light emitting structure 23 is not formed.

The substrate 21 may be separated from the light emitting structure 23 using a technique known in the art, as needed, whereby the light emitting structure 23 may have a rough region formed on a lower surface thereof.

The light emitting structure 23 includes a first conductive type semiconductor layer 25, an active layer 27 disposed on the first conductive type semiconductor layer 25, and a second conductive type semiconductor layer 29 disposed on the active layer 27.

The light emitting structure 23 may include a partially exposed region of the first conductive type semiconductor layer 25 formed by partially removing the second conductive type semiconductor layer 29 and the active layer 27. That is, as shown in FIG. 27A, first holes h may be formed through the second conductive type semiconductor layer 29 and the active layer 27 to expose the first conductive type semiconductor layer 25. Here, the shape and arrangement of the first holes h1 may be modified in various ways.

The light emitting structure 23 may include a mesa which includes the active layer 27 and the second conductive type semiconductor layer 29 and may further includes a portion of the first conductive type semiconductor layer 25. The first holes h1 may be formed in the mesa so as to expose the first conductive type semiconductor layer 25 and may be formed in plural.

The first contact electrode 31 and the second contact electrode 33 may form ohmic contact with the first conductive type semiconductor layer 25 and the second conductive type semiconductor layer 29, respectively. First, the second contact electrode 33 will be described. The second contact electrode 33 is formed to cover an upper surface of the second conductive type semiconductor layer 29 and may be formed on an upper surface of the mesa.

The second contact electrode 33 may be formed of any material capable of forming ohmic contact with the second conductive type semiconductor layer 29 and may include, for example, at least one of a metallic material and a conductive oxide.

The first insulation layer 35 may be formed on an upper surface of the light emitting structure 23 to cover the second contact electrode 33. The first insulation layer 35 may be formed to cover side surfaces of the first holes h formed in the mesa. Further, as shown in FIG. 27B and FIG. 27C, the first insulation layer 35 may be formed with second holes h2 which partially expose the second contact electrode 33. With this structure, the first contact electrode 31 of the light emitting cell adjacent to the second contact electrode 33 can form ohmic contact through the second holes h2.

The first insulation layer 35 may include an insulation material, for example, $SiO_2$, $SiN_x$, or $MgF_2$, and the like. The first insulation layer 35 may be composed of multiple layers and may include a distributed Bragg reflector in which materials having different indices of refraction are alternately stacked.

In addition, as shown in FIG. 27A to FIG. 27C, the first insulation layer 35 may be formed to cover a portion of the substrate 21. The structure of the first insulation layer 35 can vary depending upon chip unit isolation in fabrication of the light emitting element 10. When the first insulation layer 35 is formed after chip unit isolation of a wafer in fabrication of the light emitting element 10, the first insulation layer 35 may be formed to cover a portion of the substrate 21. Thus, the first insulation layer 35 may be formed to cover a side surface of the light emitting structure 23 exposed through the side surface of the substrate 21 while covering the substrate at opposite ends of the light emitting element 10.

When the first insulation layer 35 is formed to cover a portion of the substrate 21, the first insulation layer 35 may be formed to cover some patterns 21a formed on the substrate 21 instead of covering all of the patterns 21a. Accordingly, some patterns 21a of the substrate 21 may be exposed towards an upper side of the first insulation layer 35 at the corresponding locations.

As shown in FIG. 27C, the first insulation layer 35 may be formed to cover a portion of the substrate 21 in a separation space between the light emitting cells.

The first insulation layer 35 may include a pre-insulation layer 35a and a main insulation layer 35b. The pre-insulation layer 35a may be formed prior to the main insulation layer 35b and thus may be disposed under the main insulation layer 35b.

The pre-insulation layer 35a may cover a portion of the light emitting structure 23 and may be formed to cover a portion of an upper surface of the second contact electrode 33 or a side surface thereof. After the pre-insulation layer 35a is formed to cover the upper surface of the light emitting structure 23, the pre-insulation layer 35a may be subjected to etching so as to expose a portion of the second conductive type semiconductor layer 29. The second contact electrode 33 may be formed on the exposed region of the second conductive type semiconductor layer 29. As a result, the pre-insulation layer 35a may be connected to the second contact electrode 33.

The pre-insulation layer 35a may be formed in the course of forming the second contact electrode 33. For example, in a structure wherein the second contact electrode 33 includes a conductive oxide layer (not shown) and a reflective electrode layer (not shown), the conductive oxide layer may be formed on the second conductive type semiconductor layer 29 and the pre-insulation layer 35a may be formed before formation of the reflective electrode layer. After the reflective electrode layer is formed, the main insulation layer 35b is formed to cover the reflective electrode layer, thereby forming the first insulation layer 35.

In the ninth exemplary embodiment, the pre-insulation layer 35a and the main insulation layer 35b may be formed of or include the same material, for example, $SiO_2$.

Before formation of the main insulation layer 35b, the periphery of the light emitting element 10 may be etched for chip unit isolation of the light emitting element 10, and during this process, the patterns 21a exposed at the periphery of the substrate 21 may also be etched. Thus, the exposed patterns 21a may have a smaller size than the patterns 21a covered by the light emitting structure 23 as shown in FIG. 27A.

The first contact electrode 31 is formed on the upper surface of the first insulation layer 35 so as to cover the entirety of the first insulation layer 35 excluding a portion thereof. With this structure, the first contact electrode 31 can be formed in or fill the first holes h1 formed in the mesa and the second holes h2 formed in the first insulation layer 35. The first contact electrode 31 forms ohmic contact with the first conductive type semiconductor layer 25 through the first holes h1 in the mesa, as shown in FIG. 27A. Further, as shown in FIG. 27B and FIG. 27C, the first contact electrode 31 may form ohmic contact with the second contact electrode 33 of another light emitting cell adjacent thereto through the second holes h2 in the first insulation layer 35.

In addition, the first contact electrode 31 is formed to cover the entirety of the first insulation layer 35 excluding a portion thereof, whereby light emitted from the light emitting structure 23 can be reflected by the first contact electrode 31. As shown in FIG. 27A to FIG. 27C, the first contact electrode 31 is formed to cover the side surface of the substrate 21 and a side surface of the separation space between the light emitting cells, whereby light emitted from the light emitting structure 23 can be reflected by the first contact electrode 31 and emitted to the outside. As a result, luminous efficacy of the light emitting element 10 can be maximized.

In this exemplary embodiment, the first contact electrode 31 acts as the first to third electrode connections D1, D2, D3 extending from the first to third light emitting cells C1, C2, C3, respectively, as shown in FIG. 25 and FIG. 26. That is, referring to FIG. 27B, the first contact electrode 31 of the first light emitting cell C1 extends to an upper surface of the second light emitting cell C2, whereby the first electrode connection D1 is formed on the upper surface of the second light emitting cell C2. In addition, the first contact electrode 31 extending from the first light emitting cell C1 forms ohmic contact with the second contact electrode 33 on the upper surface of the second light emitting cell C2.

Further, referring to FIG. 27C, the first contact electrode 31 of the first light emitting cell C1 is formed on an upper surface of the first light emitting cell C1, and the extension portion 31a of the first contact electrode 31 extends from the second light emitting cell C2 to the upper surface of the third light emitting cell C3 while filling the separation space between the first light emitting cell C1 and the third light emitting cell C3. With this structure, the extension portion 31a of the second light emitting cell C2 forms ohmic contact with the second contact electrode 33 of the third light emitting cell C3 through the second holes h2 on the third light emitting cell C3, whereby the second electrode connection D2 can be formed on the upper surface of the third light emitting cell C3. Here, the extension portion 31a of the second light emitting cell C2 may be separated from the first contact electrode 31 of the third light emitting cell C3 to be insulated therefrom, and may extend to the upper surface of the first light emitting cell C1 while being separated from the first contact electrode 31 of the first light emitting cell C1 to be insulated therefrom.

As described above, the first contact electrode 31 serves to form ohmic contact with the first conductive type semiconductor layer 25 while reflecting light. Thus, the first contact electrodes of the first to third light emitting cells C1, C2, C3 extend to the second to fourth light emitting cells C2, C3, C4 for electrical connection and cover most of the light emitting element, thereby improving luminous efficacy of the light emitting element 10.

The first contact electrode 31 may include a highly reflective metal layer such as an Al layer, and may be composed of a single layer or multiple layers. Here, the highly reflective metal layer may be formed on a contact layer such as a Ti, Cr or Ni layer, and the first contact electrode 31 may include at least one of Ni, Pt, Pd, Rh, W, Ti, Al, Mg, Ag and Au.

The second insulation layer 37 is formed to cover the entire region of the first contact electrode 31 excluding some regions thereof. The second insulation layer 37 may be formed with a first opening op1 that partially exposes the first contact electrode 31 and a second opening op2 that partially exposes the second contact electrode 33. Here, the second opening op2 may be formed through the first insulation layer 35, the first contact electrode 31 and the second insulation layer 37, and the second insulation layer 37 may include one or more first openings op1 and one or more second openings op2.

The first electrode pad 39 may form ohmic contact with the first contact electrode 31 through the first openings op1 and the second electrode pad 41 may form ohmic contact with the second contact electrode 33 through the second openings op2.

The first electrode pad 39, the second electrode pad 41 and the heat dissipation pad 43 are disposed on the second insulation layer 37 such that the first electrode pad 39 can be electrically connected to the first contact electrode 31 of the fourth light emitting cell C4 and the second electrode pad 41 can be electrically connected to the second contact electrode 33 of the first light emitting cell C1. As shown in FIG. 27A, the first electrode pad 39 may form ohmic contact with the first contact electrode 31 through the first openings op1. Further, the second electrode pad 41 may form ohmic contact with the second contact electrode 33 through the second openings op2. The heat dissipation pad 43 may be disposed on the second insulation layer while being insulated from the first electrode pad 39 and the second electrode pad 41.

The first electrode pad 39 is formed on the fourth light emitting cell C4 and the first openings op1 are formed in the fourth light emitting cell C4. With this structure, the first electrode pad 39 forms ohmic contact with the first contact electrode 31 of the fourth light emitting cell C4. Further, the second electrode pad 41 is formed on the first light emitting cell C1 so as to be separated from the heat dissipation pad 43 by a predetermined distance or more and the second openings op2 are formed in the first light emitting cell C1. As a result, the second electrode pad 41 forms ohmic contact with the second contact electrode 33 of the first light emitting cell C1.

Further, the heat dissipation pad 43 may be formed to fill the separation spaces between the first to fourth light emitting cells C1, C2, C3, C4 and may have a thickness of dozens of micrometers. Further, like the heat dissipation pad 43, the first electrode pad 39 and the second electrode pad 41 have the same thickness, whereby the light emitting element 10 can be used as a chip-scale package.

Each of the first electrode pad 39 and the second electrode pad 41 may be composed of a single layer or multiple layers and may include an electrically conductive material. For example, each of the first electrode pad 39 and the second electrode pad 41 may include at least one of Cu, Pt, Au, Ti, Cr, Ni, Al or Ag, or may also include sintered metal particles and non-metallic materials interposed between metal particles. Here, the first electrode pad 39 and the second electrode pad 41 may be formed by plating, deposition, dotting, or screen-printing, and the like. Further, the heat dissipation pad 43 may include the same material as the first and second electrode pads 39, 41.

The light emitting element 10 described above may be fabricated by the same method as in the seventh exemplary embodiment.

Figure 28:
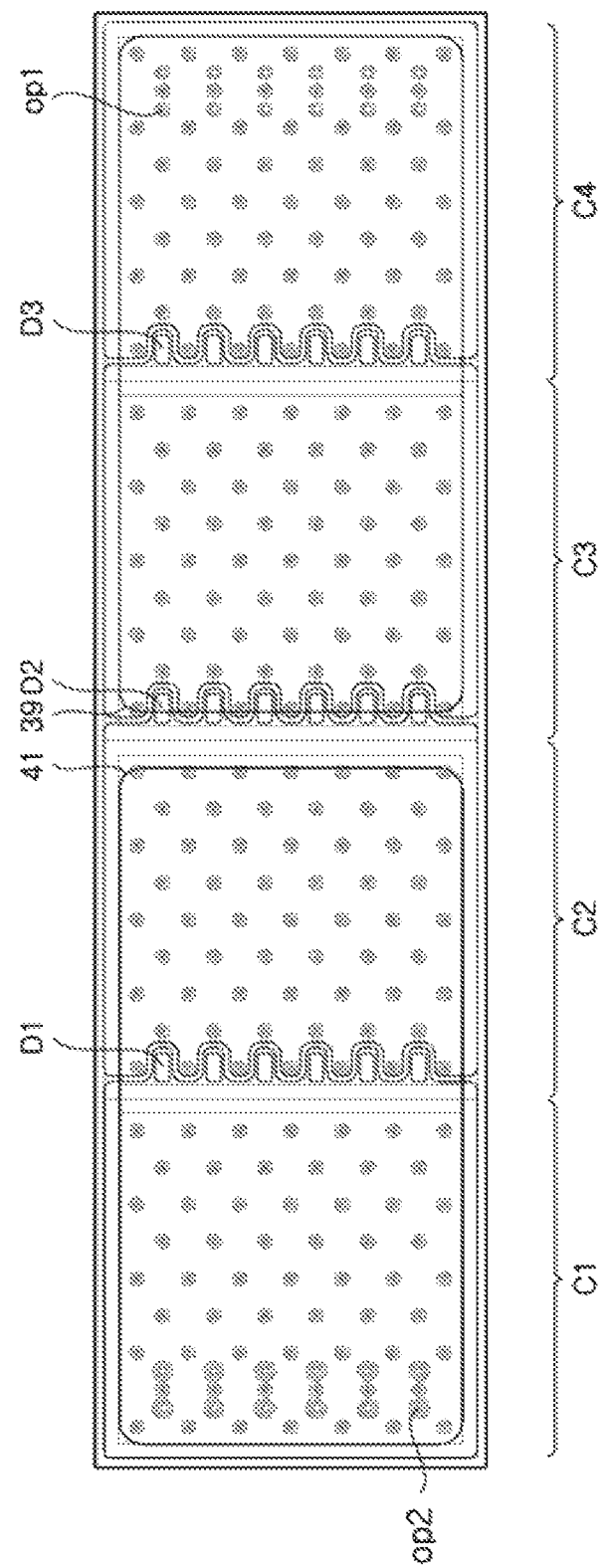
FIG. 28 is a plan view of a light emitting element according to a tenth exemplary embodiment of the present disclosure.

FIG. 28 is a plan view of a light emitting element according to a tenth exemplary embodiment of the present disclosure.

Referring to FIG. 28, the light emitting element 10 according to the tenth exemplary embodiment includes first to fourth light emitting cells C1, C2, C3, C4, first to third electrode connections D1, D2, D3, a first electrode pad 39, and a second electrode pad 41. In description of the tenth exemplary embodiment, descriptions of the same components as those of the ninth exemplary embodiment will be omitted.

As shown therein, the first to fourth light emitting cells C1, C2, C3, C4 are disposed coplanar with each other so as to be electrically connected to each other and may have substantially the same area. For series connection between the first to fourth light emitting cells C1, C2, C3, C4, the light emitting cells C1, C2, C3, C4 are electrically connected to one another by the first to third electrode connections D1, D2, D3.

In the tenth exemplary embodiment, the first to fourth light emitting cells C1, C2, C3, C4 may be arranged in series in one direction.

Referring to FIG. 28, the second light emitting cell C2 is disposed at the right side of the first light emitting cell C1 and is electrically connected to the first light emitting cell C1 by the first electrode connections D1. In addition, the third light emitting cell C3 is disposed at the right side of the second light emitting cell C2 and is electrically connected to the second light emitting cell C2 by the second electrode connections D2. The fourth light emitting cell C4 is disposed at the right side of the third light emitting cell C3 and is electrically connected to the third light emitting cell C3 by the third electrode connections D3.

With this structure, the light emitting cells C1, C2, C3, C4 are connected to one another in series to provide one light emitting element 10.

The first to third electrode connections D1, D2, D3 are disposed on the second to fourth light emitting cells C2, C3, C4, respectively. To this end, the first contact electrode 31 extends to an upper surface of an another light emitting cell adjacent thereto, thereby minimizing loss of light in the light emitting element 10 despite the separation space formed between the light emitting cells.

In the tenth exemplary embodiment, since the first to fourth light emitting cells C1, C2, C3, C4 are formed to have directionality in one direction, each of the first to third electrode connections D1, D2, D3 is formed over one side of an adjacent light emitting cell. For example, the first electrode connections D1 are formed over one side of the second light emitting cell C2 adjacent to the first light emitting cell C1 so as to be spaced apart or separated from one another along one side of the second light emitting cell C2. Thus, electric current can flow through the one side thereof between the first light emitting cell C1 and the second light emitting cell C2.

The first electrode pad 39 may be formed to cover the entirety or a portion of the upper surfaces of the third light emitting cell C3 and the fourth light emitting cell C4, and the second electrode pad 41 may be formed to cover the entirety or a portion of the upper surfaces of the first light emitting cell C1 and the second light emitting cell C2. The first electrode pad 39 may be electrically connected to the fourth light emitting cell C4 and the second electrode pad 41 may be electrically connected to the first light emitting cell C1. The first electrode pad 39 and the second electrode pad 41 may be separated from each other by a predetermined distance or more.

Although not shown in FIG. 28, a heat dissipation pad may be disposed between the first electrode pad 39 and the second electrode pad 41, as needed. In this case, the first electrode pad 39, the second electrode pad 41 and the heat dissipation pad may be separated from one another.

Figure 29:
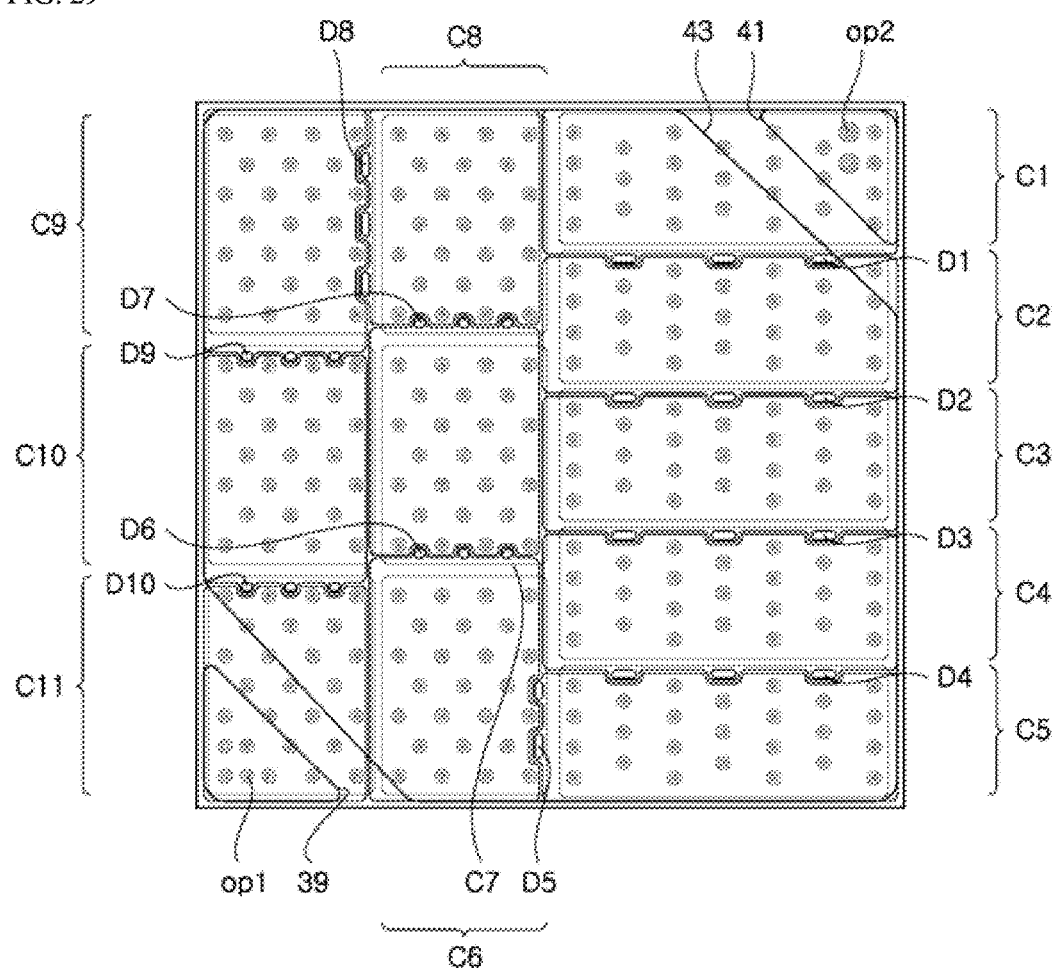
FIG. 29 is a plan view of a light emitting element according to an eleventh exemplary embodiment of the present disclosure.

FIG. 29 is a plan view of a light emitting element according to an eleventh exemplary embodiment of the present disclosure.

Referring to FIG. 29, the light emitting element according to the eleventh exemplary embodiment includes first to eleventh light emitting cells C1 to C11, first to tenth electrode connections D1 to D10, a first electrode pad 39, a second electrode pad 41, and a heat dissipation pad 43. In description of the eleventh exemplary embodiment, descriptions of the same components as those of the ninth exemplary embodiment will be omitted.

According to the eleventh exemplary embodiment, the light emitting element includes eleven light emitting cells C1 to C11, which are connected to each other in series. As shown in FIG. 29, the first to eleventh light emitting cells C1 to C11 may have similar sizes, in which the first to fifth light emitting cells C1 to C5 have the same rectangular shape and the sixth to eleventh light emitting cells C6 to C11 have the same rectangular shape, which is different from that of the first to firth light emitting cells C1 to C5, in consideration of disposition thereof.

Referring to FIG. 29, the first to eleventh light emitting cells C1 to C11 are arranged such that the first light emitting cell C1 is disposed at the uppermost side of the right side of the light emitting element and the second to fifth light emitting cells C2 to C5 are sequentially arranged in the downward direction under the first light emitting cell C1. The sixth light emitting cell C6 is disposed at the left side of the fifth light emitting cell C5 and the seventh and eighth light emitting cells C7, C8 are sequentially arranged in the upward direction on the sixth light emitting cell C6. The ninth light emitting cell C9 is disposed at the left side of the eighth light emitting cell C8 and the tenth and eleventh light emitting cells C10, C11 are sequentially arranged in the downward direction under the ninth light emitting cell C9.

In such arrangement of the first to eleventh light emitting cells C1 to C11, the first to tenth electrode connections D1 to D10 electrically connect the light emitting cells C1 to C11 to one another. With this structure, the first to eleventh light emitting cells C1 to C11 are electrically connected to one another and may be connected to one another in series in other exemplary embodiments.

In the eleventh exemplary embodiment, the first to tenth electrode connections D1 to D10 are formed on upper surfaces of the second to eleventh light emitting cells C2 to C11, respectively, and the first to tenth electrode connections D1 to D10 may be formed in plural. That is, in the eleventh exemplary embodiment, the first to eleventh light emitting cells C1 to C11 are disposed to be adjacent to one another such that one side of one light emitting cell faces one side of another light emitting cell, whereby each of the first to tenth electrode connections D1 to D10 can be disposed along one side of each of the second to eleventh light emitting cells C2 to C11.

In arrangement of the fifth and sixth light emitting cells C5, C6, one side of the fifth light emitting cell C5 partially faces one side of the sixth light emitting cell C6. Thus, the fifth electrode connections D5 are formed on a portion of the one side of the sixth light emitting cell C6 facing one side of the fifth light emitting cell C5 instead of being formed over the one side of the sixth light emitting cell C6.

The first electrode pad 39 is formed on the upper surface of the eleventh light emitting cell C11 so as to be electrically connected to the first contact electrode 31 of the eleventh light emitting cell C11. In addition, the second electrode pad 41 is formed on the upper surface of the first light emitting cell C1 so as to be electrically connected to the first contact electrode 31 of the first light emitting cell C1. Electrical connection between the first electrode pad 39 and the eleventh light emitting cell C11 and between the second electrode pad 41 and the first light emitting cell C1 is the same as in the ninth exemplary embodiment, and thus detailed descriptions thereof will be omitted.

The heat dissipation pad 43 is disposed between the first and second electrode pads 39, 41 while being separated from the first electrode pad 39 and the second electrode pad 41. With this structure, the heat dissipation pad 43 may be formed to cover some regions of the first light emitting cell C1 and the eleventh light emitting cell C11 and some or the entire region of the second to tenth light emitting cells C2 to C10.

Figure 30:
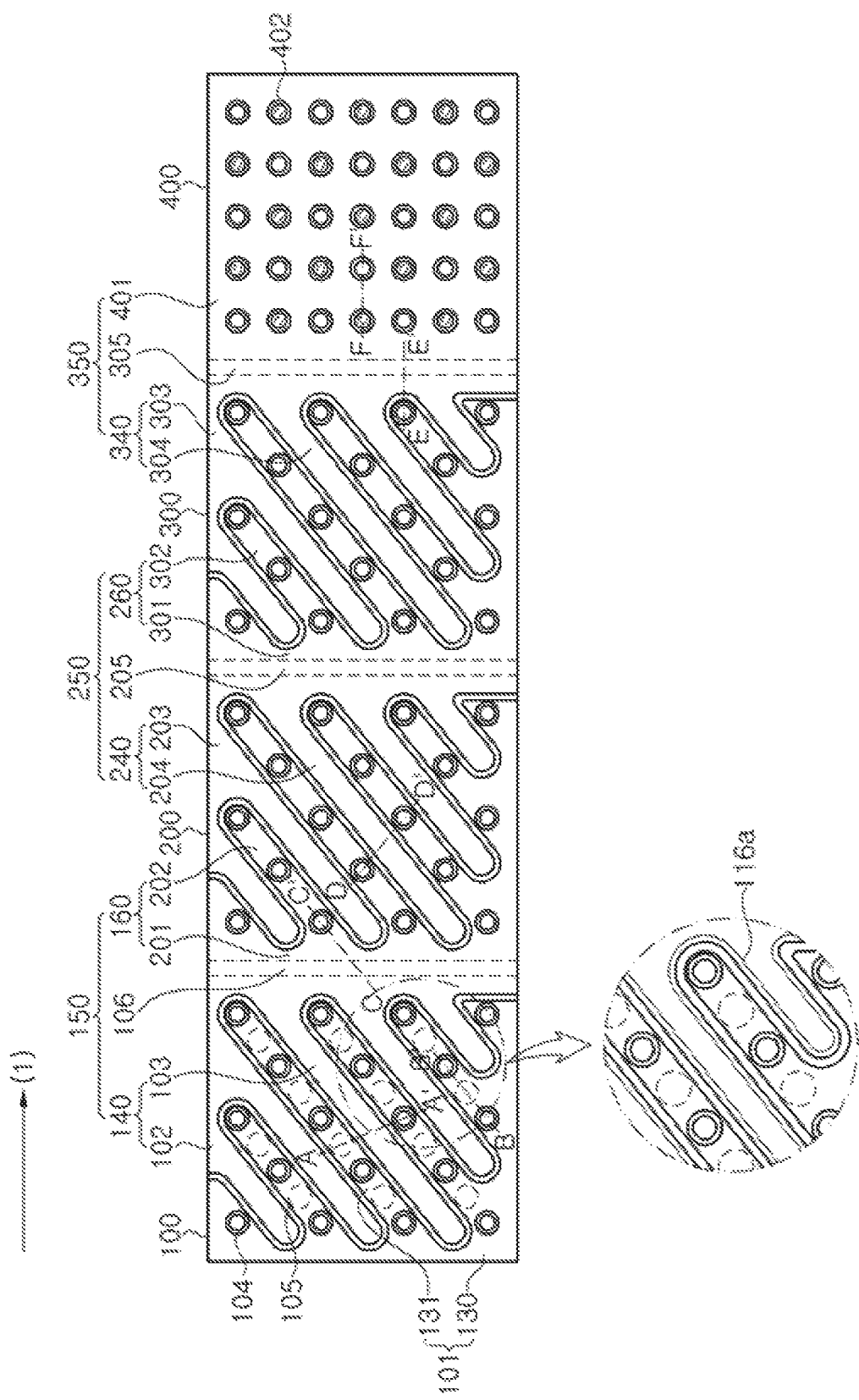
FIG. 30 is a plan view of a light emitting element according to a twelfth exemplary embodiment of the present disclosure.
Figure 31:
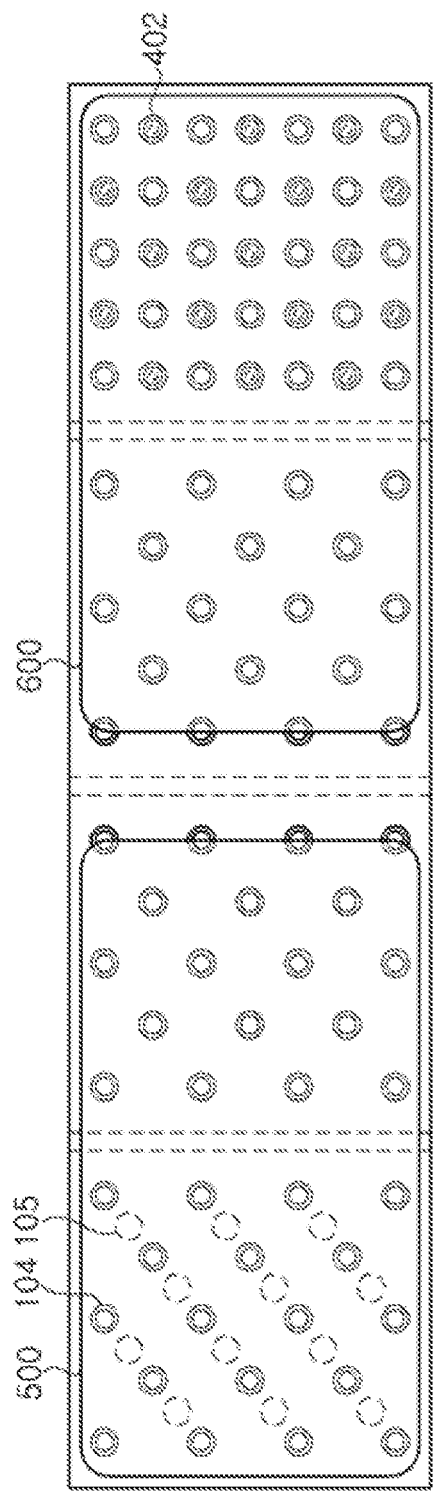
FIG. 31 is a schematic plan view of the light emitting element according to the twelfth exemplary embodiment of the present disclosure.

FIG. 30 and FIG. 31 are plan views of a light emitting element according to a twelfth exemplary embodiment of the present disclosure. FIGS. 32 to 37 are schematic cross-sectional views taken along the corresponding lines of FIG. 31.

Referring to FIG. 30, the light emitting element includes first to fourth light emitting cells 100, 200, 300, 400 disposed adjacent to one another in a first direction 1. In addition, the light emitting element may include a first electrode connection 150 electrically connecting the first light emitting cell 100 to the second light emitting cell 200, a second electrode connection 250 electrically connecting the second light emitting cell 200 to the third light emitting cell 300, and a third electrode connection 350 electrically connecting the third light emitting cell 300 to the fourth light emitting cell 400. Further, the light emitting element may include a substrate 110, a first electrode pad 500, and a second electrode pad 600.

The substrate 110 may be any substrate which allows growth of the first conductive type semiconductor layer 111, the active layer 112 and the second conductive type semiconductor layer 113 thereon, and may include, for example, a sapphire substrate, a silicon carbide substrate, a gallium nitride substrate, an aluminum nitride substrate, or a silicon substrate.

In this exemplary embodiment, the substrate 110 may be a patterned sapphire substrate PSS. The substrate 110 may include rough patterns R1, R2 formed on an upper surface thereof. The rough patterns R1, R2 can improve light extraction efficiency of a light emitting diode by effectively reflecting light generated from the semiconductor layers.

The rough patterns R1, R2 may have a triangular pyramid shape, a quadrangular pyramid shape, or a semispherical shape, without being limited thereto. The first rough pattern R1 may adjoin the first conductive type semiconductor layers 111, 211, 311, 411 and may be disposed on lower surfaces of the light emitting cells, specifically, on the lower surfaces of the first conductive type semiconductor layers 111, 211, 311, 411. The second rough pattern R2 does not adjoin the first conductive type semiconductor layers 111, 211,311,411 and may be disposed in regions between the light emitting cells.

The first rough pattern R1 may have a different height from the second rough pattern R2. The second rough pattern R2 may have a smaller height than the first rough pattern R1. For example, the first rough pattern R1 may have a height of 1.5 μm to 2 μm and the second rough pattern R2 may have a smaller height than the first rough pattern. Since the first rough pattern R1 has a greater height, the first rough pattern R1 can more effectively reflect light generated from the light emitting cells.

The first electrode connection 150 may include a first-1 electrode connection 140 disposed on the first light emitting cell 100, a first-2 electrode connection 160 disposed on the second light emitting cell 200, and a first intermediate connection 106 interposed between the first light emitting cell 100 and the second light emitting cell 200 and connecting the first-1 electrode connection 140 to the first-2 electrode connection 160. The first-1 electrode connection 140 may include first-1 edge portions 102 and first-1 branches 103. Further, the first-2 electrode connection 160 may include a second-1 edge portion 201 and second-1 branches 202.

The second electrode connection 250 may include a second-1 electrode connection 240 disposed on the second light emitting cell, a third-2 electrode connection 260 disposed on the third light emitting cell, and a second intermediate connection 205 interposed between the second light emitting cell 200 and the third light emitting cell 300 and connecting the second-1 electrode connection 240 to the second-2 electrode connection 260, wherein the second-1 electrode connection may include a second-1 edge portion 203 and second-1 branches 204. In addition, the second-2 electrode connection 260 may include a second-2 edge portion 201 and second-2 branches 202.

The third electrode connection 350 may include a third-1 electrode connection 340 disposed on the third light emitting cell, a third-2 electrode connection 401 disposed on the fourth light emitting cell, and a third intermediate connection 305 interposed between the third light emitting cell 300 and the fourth light emitting cell 400 and connecting the third-1 electrode connection 340 to the third-2 electrode connection 401, wherein the third-1 electrode connection includes a third-1 edge portion 303 and third-1 branches 304.

The first light emitting cell 100 includes a first side surface adjacent to the second light emitting cell 200, a second side surface facing the first side surface, and a third side surface and a fourth side surface disposed between the first side surface and the second side surface and facing each other. The second light emitting cell 200 includes a first side surface adjacent to the first light emitting cell 100, a second side surface facing the first side surface, a third side surface disposed between the first side surface and the second side surface and adjacent to the third side surface of the first light emitting cell 100, and a fourth side surface facing third side surface. The third light emitting cell 300 includes a first side surface adjacent to the second light emitting cell 200, a second side surface facing the first side surface, a third side surface disposed between the first side surface and the second side surface and adjacent to the third side surface of the second light emitting cell 200, and a fourth side surface facing the third side surface.

Figure 32:
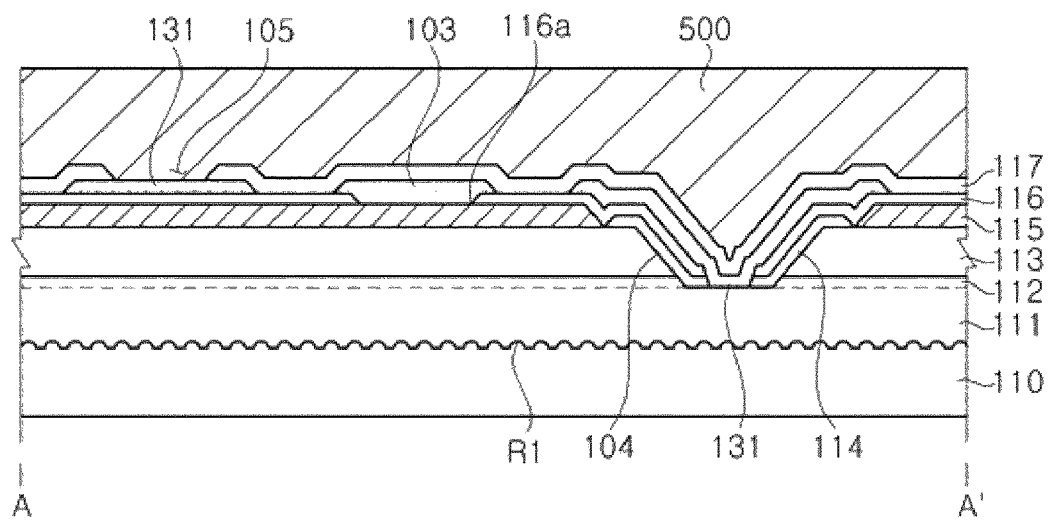
FIG. 32 is a schematic cross-sectional view taken along line A-A' of FIG. 31.
Figure 33:
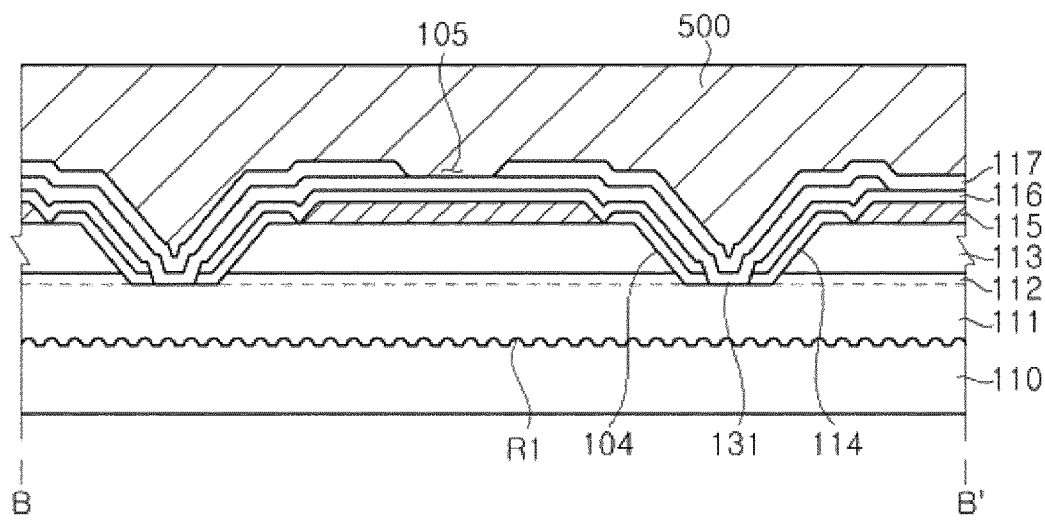
FIG. 33 is a schematic cross-sectional view taken along line B-B' of FIG. 31.

Referring to FIG. 30, FIG. 32, and FIG. 33, the first light emitting cell 100 includes a first conductive type semiconductor layer 111, an active layer 112 disposed on the first conductive type semiconductor layer 111, and a second conductive type semiconductor layer 113 disposed on the active layer 112. Further, the first light emitting cell 100 includes a pre-insulation layer 114 described below, a contact electrode 115, a first insulation layer 116, and a second insulation layer 117.

The first conductive type semiconductor layer 111, the active layer 112 and the second conductive type semiconductor layer 113 may include a III-V based compound semiconductor, for example, a nitride semiconductor such as (Al, Ga, In)N. The first conductive type semiconductor layer 111 may include an n-type dopant (for example, Si) and the second conductive type semiconductor layer 113 may include a p-type dopant (for example, Mg), or vice versa. The active layer 112 may include a multi-quantum well (MQW) structure and the composition ratio of the active layer may be determined so as to emit light in a desired wavelength range.

Further, the first light emitting cell 100 may include a partially exposed region of the first conductive type semiconductor layer 111 formed by partially removing the second conductive type semiconductor layer 113 and the active layer 112. For example, as shown in FIG. 30 and FIG. 32, the first light emitting cell 100 may include a plurality of contact holes 104 formed through the second conductive type semiconductor layer 113 and the active layer 112 to expose the first conductive type semiconductor layer 111. As shown in FIG. 30, the contact holes 104 may be arranged parallel to the first-1 branches and the first conductive type semiconductor layer 111 may be exposed in a circular shape through the contact holes 104. However, it should be understood that the shape and arrangement of the contact holes are not limited thereto. Further, in the partially exposed region of the first conductive type semiconductor layer 111, a mesa including the second conductive type semiconductor layer 113 and the active layer 112 may be formed by partially removing the second conductive type semiconductor layer 113 and the active layer 112. A side surface of the second conductive type semiconductor layer 113 and a side surface of the active layer 112 disposed around the contact holes 104 may include inclined side surfaces. The inclined side surfaces of the contact holes 104 improve extraction efficiency of light generated in the active layer 112. Although not shown in the drawings, a buffer layer may be formed between the first conductive type semiconductor layer 111 and a substrate 100, and may be an undoped semiconductor layer composed of a nitride and the like in order to relieve lattice mismatch between the first conductive type semiconductor layer 111 and the second conductive type semiconductor layer 113. The plurality of contact holes 104 increase the area and number of contact regions between a contact-hole connection 101 and the first conductive type semiconductor layer 111, thereby enabling effective current spreading.

Referring to FIG. 32 and FIG. 33, the pre-insulation layer 114 may cover a portion of the second conductive type semiconductor layer 113 disposed around the contact holes 104 and a portion of the first conductive type semiconductor layer 111 exposed through the contact holes 104. The pre-insulation layer 114 may include an opening, which defines regions in which first to third electrode connections 150, 250, 350 will be disposed. The pre-insulation layer 114 can prevent damage to the second conductive type semiconductor layer 113 by an etchant such as a buffered oxide etchant (BOE) upon formation of the first to third electrode connections 150, 250, 350.

The pre-insulation layer 114 may include an insulation material, for example, $SiO_2$, SiNx, $MgF_2$, and the like. The pre-insulation layer 114 may act as a basal layer with respect to other layers formed on the pre-insulation layer 114. For example, in the structure wherein the first insulation layer 116 described below includes a distributed Bragg reflector, the pre-insulation layer 114 may act as a basal layer that enables stable formation of the distributed Bragg reflector, thereby minimizing generation of cracks in the distributed Bragg reflector while improving resistance to electrostatic discharge (ESD). In the structure wherein the distributed Bragg reflector has a multilayer structure of $TiO_2/SiO_2$ layers alternately stacked one above another, the pre-insulation layer 114 may be formed of a $SiO_2$ layer having a predetermined thickness or more. For example, the thickness may range from about 0.2 μm to 1.0 μm. In order to form a high quality distributed Bragg reflector, it is desirable that the basal layer for the distributed Bragg reflector have good quality and surface properties. Accordingly, the pre-insulation layer 114 is formed to the predetermined thickness or more, thereby enabling stable formation of the distributed Bragg reflector on the pre-insulation layer 114.

Referring to FIG. 32 and FIG. 33, the contact electrode 115 is disposed on the second conductive type semiconductor layer 113 and may cover most of the second conductive type semiconductor layer 113 around the contact holes 104 excluding a region in which the pre-insulation layer 114 covers the second conductive type semiconductor layer 113. The contact electrode 115 may serve to form ohmic contact with the second conductive type semiconductor layer 113 while reflecting light. Thus, the contact electrode 115 may include a metal having high reflectance and capable of forming ohmic contact with the second conductive type semiconductor layer 113. For example, the contact electrode 115 may include at least one of Ni, Pt, Pd, Rh, W, Ti, Al, Ag, Au, and ITO/ZnO. Further, the contact electrode 115 may include a single layer or multiple layers.

The first insulation layer 116 may be disposed on the upper surfaces of the first conductive type semiconductor layer 111, the active layer 112, and the second conductive type semiconductor layer 113 in regions of the contact electrode 115 and the contact holes 104. In the structure wherein the light emitting element includes the pre-insulation layer 114, the first insulation layer 116 is disposed on the pre-insulation layer 114 and may cover at least a portion of the contact electrode 115. The first insulation layer 116 insulates the contact electrode 115 from the contact-hole connection 101 and serves to protect the first and second conductive type semiconductor layers 111, 113 from foreign matter such as moisture. Referring to an enlarged circle of FIG. 30, the first insulation layer 116 has an opening 116a, through which the first-1 electrode connection 140 is electrically connected to the contact electrode 115, in the region of the first-1 electrode connection 140. The opening 116a may have a narrower width than the first-1 branches 103. Furthermore, a lower surface of the second-1 electrode connection 240 of the second light emitting cell 200 and a lower surface of the third-1 electrode connection 340 of third light emitting cell 300 are formed with openings of the first insulation layers 216, 316 corresponding to the opening 116a. The first insulation layer 116 may include an oxide layer such as SiO$_2$, a nitride layer such as SiN$_x$, or an insulation layer such as MgF$_2$. Further, the first insulation layer 116 may include a distributed Bragg reflector (DBR) in which a low refractivity material layer and a high refractivity material layer are alternately stacked. For example, an insulation reflective layer having high reflectance may be formed by stacking SiO$_2$/TiO$_2$ layers or SiO$_2$/Nb$_2$O$_5$ layers.

As shown in FIG. 30, the contact-hole connection 101 includes contact-hole connecting edge portions 130 disposed on edges of a portion of the third side surface, the second side surface, and a portion of the fourth side surface of the first light emitting cell 100, and contact-hole connection branches 131 extending in a branch shape from the contact-hole connecting edge portions 130 to connect the contact holes 104. Referring to FIG. 30, the contact-hole connecting branches 131 include branches extending from a contact-hole connecting edge portion 130 disposed at a side of the second side surface of the first light emitting cell 100 towards the first side surface, branches extending from a contact-hole connecting edge portion 130 disposed at a side of the second side surface thereof towards the third side surface thereof, and branches extending from a contact-hole connecting edge portion 130 disposed at a side of fourth side surface thereof towards the first side surface thereof. The contact-hole connecting branches 131 may be parallel to each other.

The contact-hole connection 101 may be disposed on the first insulation layer 116 and the first conductive type semiconductor layer 111 and electrically connected to the first conductive type semiconductor layer 111 through the contact holes 104 formed in first light emitting cell 100. In addition, the contact-hole connection 101 may adjoin the first electrode pad 500 through first openings 105 of the second insulation layer 117. That is, the contact-hole connection 101 may be formed to achieve electrical connection between the first electrode pad 500 and the first conductive type semiconductor layer 111. Further, since the first openings 105 are alternately arranged between the contact holes 104, and the first openings 105, the contact holes 104 and the contact-hole connection 101 are disposed over the entire region of the first light emitting cell 100, electric current can be effectively dispersed through electrical connection between the first electrode pad 500 and the first conductive type semiconductor layer 111.

The contact-hole connection 101 and the first to third electrode connections 150, 250, 350 described below may include a highly reflective metal layer such as an Al layer, and the highly reflective metal layer may be formed on a contact layer such as a Ti, Cr or Ni layer. Further, a protective layer composed of a single layer or multiple layers of Ni, Cr, Au, and the like may be formed on the high reflective layer. The contact-hole connection 101 may include a multilayer structure of, for example, Ti/Al/Ti/Ni/Au layers. The contact-hole connection 101 may be formed by depositing a metallic material, followed by patterning, without being limited thereto. In addition, the contact-hole connection 101 may be formed together with the first to third electrode connections by the same process.

As shown in FIG. 32 and FIG. 33, the second insulation layer 117 may be disposed on the contact-hole connection 101, the first insulation layer 116, and the first-1 electrode connection 140. The second insulation layer 117 may serve to prevent disconnection of the contact electrode 115, the contact-hole connection 101 and the first-1 electrode connection 140 from the first electrode pad 500 while protecting the light emitting structure from foreign matter or impact.

The second insulation layer 117 may include an oxide layer such as SiO$_2$, a nitride layer such as SiN$_x$, an insulation layer such as MgF$_2$, or polymers such as polyimide, Teflon, and Parylene. In addition, the first insulation layer 116 may include a distributed Bragg reflector (DBR) in which a low refractivity material layer and a high refractivity material layer are alternately stacked. For example, an insulation reflective layer having high reflectance may be formed by stacking SiO$_2$/TiO$_2$ layers or SiO$_2$/Nb$_2$O$_5$ layers.

The second insulation layer 117 may include openings 105 through which the first electrode pad and the second electrode pad are electrically connected to the first conductive type semiconductor layer 111 and openings 402 through which the first electrode pad and the second electrode pad are electrically connected to the second conductive type semiconductor layer 113. The openings 105 may be formed in regions between the contact holes 104 of the first light emitting cell 100 and the openings 402 may be formed in regions between the contact holes of the fourth light emitting cell.

As shown in FIG. 30, the first-1 electrode connection 140 includes the first-1 edge portions 102 and the first-1 branches 103. The first-1 electrode connection 140 serves to electrically connect the first intermediate connection 106 to the second conductive type semiconductor layer 113 of the first light emitting cell 100. The first-1 edge portions 102 may include an edge portion placed at a portion of the third side surface of the first light emitting cell 100 and an edge portion placed at an edge of the first side surface thereof. The first-1 branches 103 include branches extending from the first-1 edge portion 102 disposed at a side of the third side surface towards the second side surface, branches extending from the first-1 edge portion 102 disposed at a side of the first side surface towards the second side surface, and branches extending from the first-1 edge portion 102 disposed at a side of the first side surface towards the fourth side surface. With this structure of the first-1 electrode connection 140, a contact region between the first-1 electrode connection 140 and the contact electrode 115 of the first light emitting cell has a wide area and is distributed throughout the first light emitting cell 100. As a result, the first light emitting cell 100, the second light emitting cell 200, and the third and fourth light emitting cells 300, 400 described below are connected to each other in series and have constant forward voltage characteristics, thereby improving reliability of the light emitting element.

The plural first-1 branches 103 may be disposed parallel to each other between the contact holes 104 of the first light emitting cell 100. Although the contact-hole connection 101 does not adjoin the first-1 electrode connection 140, the branches of the contact-hole connection 101 and the first-1 electrode connection 140 may be alternately arranged to be adjacent to one another.

The first intermediate connection 106 is a portion of the first electrode connection 150 disposed in a region between the first light emitting cell 100 and the second light emitting cell 200 and serves to connect the first-1 electrode connection 140 to the first-2 electrode connection 160.

Figure 34:
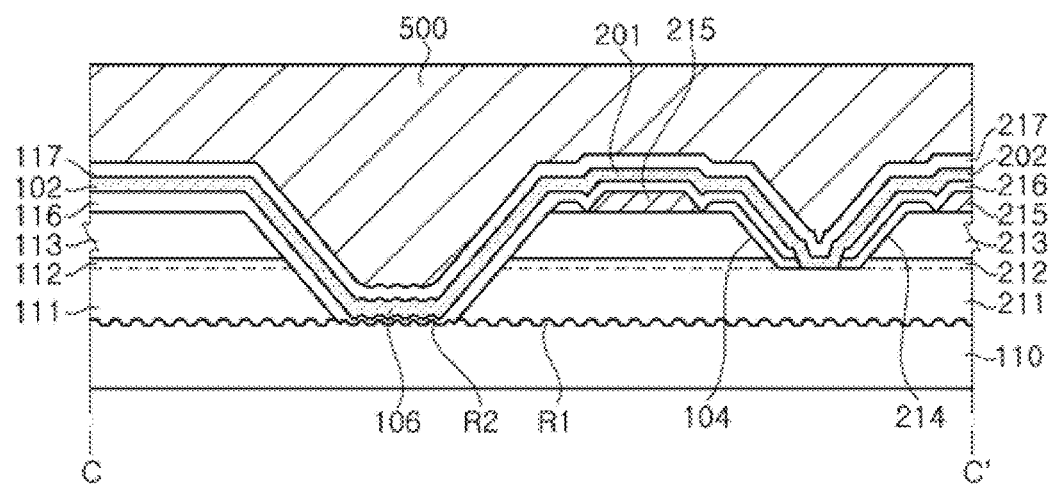
FIG. 34 is a schematic cross-sectional view taken along line C-C' of FIG. 31.
Figure 35:
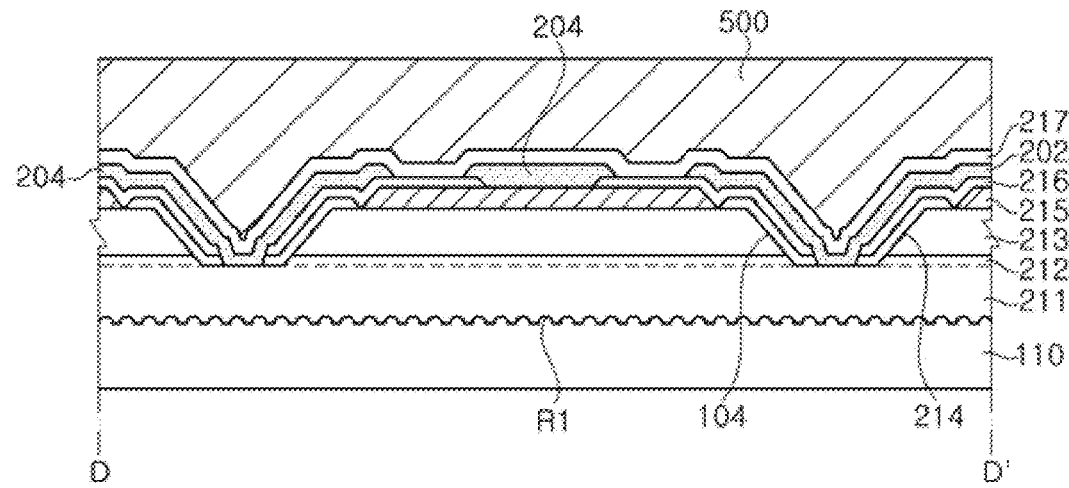
FIG. 35 is a schematic cross-sectional view taken along line D-D' of FIG. 31.

As shown in FIG. 30 and FIG. 34, the first-2 electrode connection 160 may be disposed on the first insulation layer 216 and a first conductive type semiconductor layer 211 of the second light emitting cell 200, and includes first-2 edge portions 201 and first-2 branches 202. The first-2 edge portions 201 are disposed on a portion of the first side surface of the second light emitting cell 200 and edges of the fourth side surface thereof. The first-2 branches 202 include branches extending from the first-2 edge portions 201 disposed at a side of the first side surface towards the third side surface, branches extending from the first-2 edge portions 201 disposed at a side of the first side surface towards the second side surface, and the first-2 branches 202 extending from the first-2 edge portions 201 disposed at a side of the fourth side surface towards the second side surface.

The plural first-2 branches 202 may be disposed parallel to each other and connect the contact holes 104 of the second light emitting cell 200 to each other. Although the first-2 branches 202 do not adjoin the second-1 branches 204, these branches may be alternately arranged to be adjacent to one another.

The plural first-2 branches 202 may be disposed parallel to the plural first-1 branches 103, and the first-2 branches 202 and the first-1 branches 103 may be inclined with respect to the first direction 1 and a perpendicular direction to the first direction 1.

The first-2 electrode connection 160 serves to connect the first conductive type semiconductor layer 211 of the second light emitting cell 200 to the first intermediate connection 106. That is, the first-1 electrode connection 140, the first intermediate connection 106, and the first-2 electrode connection 160, which constitute the first electrode connection 150, serve to electrically connect the first conductive type semiconductor layer 211 of the second light emitting cell 200 to the second conductive type semiconductor layer 113 of first light emitting cell 100, and the branches thereof deeply extend to the cell regions thereof, thereby improving current spreading performance.

The contact holes 104, the first conductive type semiconductor layers 211, 311, the active layers 212, 312, the second conductive type semiconductor layer 213, 313, the contact electrodes 215, 315, the first insulation layers 216, 316 and the second insulation layers 217, 317 of the second light emitting cell 200 and the third light emitting cell 300 have the same features and functions as those of the first light emitting cell 100 except that the second insulation layers 217, 317 do not include the openings 105. Further, corresponding to the first electrode connection 150, the second electrode connection 250 electrically connecting the second light emitting cell 200 to the third light emitting cell 300 also includes the second-1 electrode connection 240, the second intermediate connection 205 and the second-2 electrode connection 260, which have the same features and functions as the first-1 electrode connection 140, the first intermediate connection 105 and the first-2 electrode connection 160, respectively.

Figure 36:
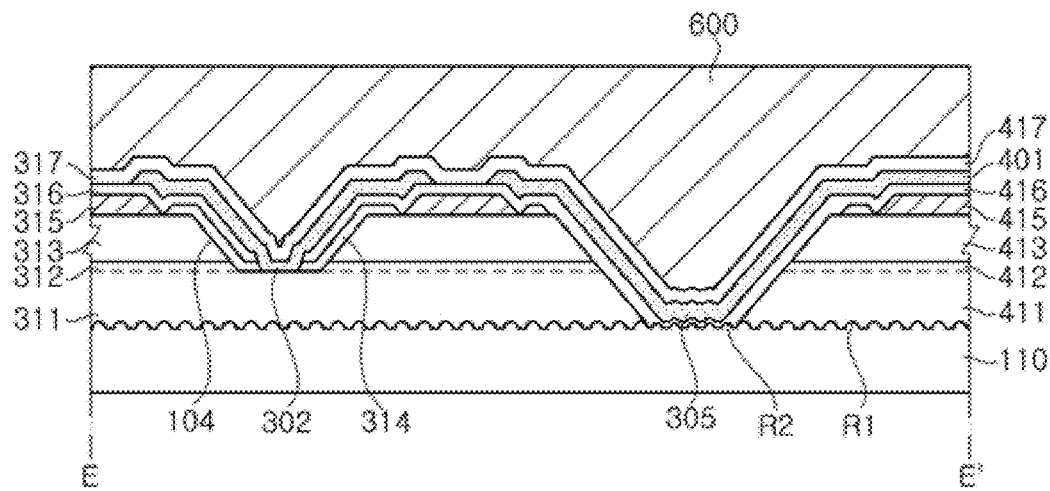
FIG. 36 is a schematic cross-sectional view taken along line E-E' of FIG. 31.
Figure 37:
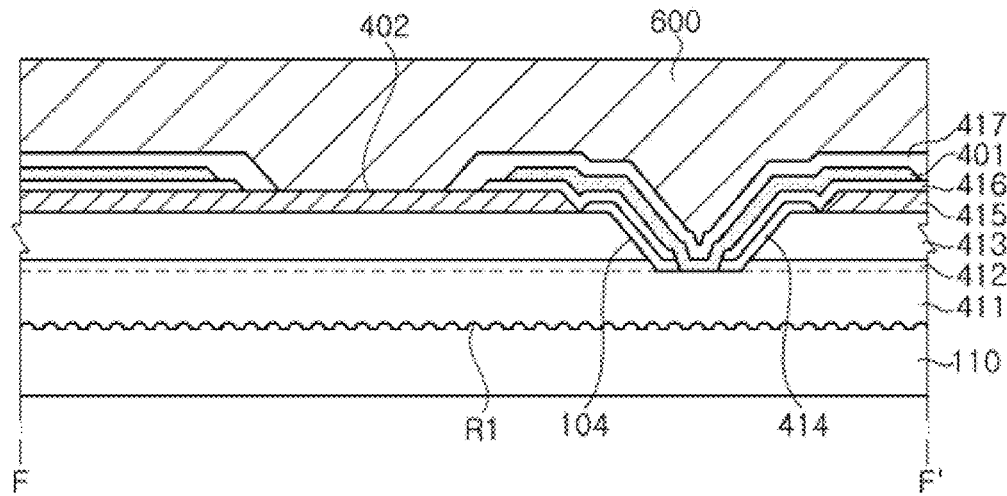
FIG. 37 is a schematic cross-sectional view taken along line F-F' of FIG. 31.

As shown in FIG. 30, FIG. 36 and FIG. 37, the third electrode connection 350 electrically connects the third light emitting cell 300 to the fourth light emitting cell 400. The features and functions of the third-1 electrode connection 340 and the third intermediate connection 305 are the same as those of the first-1 electrode connection 140 and the first intermediate connection 105. However, the third-2 electrode connection 401 is different from the first-2 and second-2 electrode connections 160, 260 in that the third-2 electrode connection 401 is formed in the entire region of the fourth light emitting cell 400.

Referring to FIG. 36 and FIG. 37, the fourth light emitting cell 400 includes a first conductive type semiconductor layer 411, an active layer 412 disposed on the first conductive type semiconductor layer 411, and a second conductive type semiconductor layer 413 disposed on the active layer 412. Further, the fourth light emitting cell 400 includes a pre-insulation layer 414, a contact electrode 415, a first insulation layer 416, a second insulation layer 417, and a plurality of contact holes 104 through which the first conductive type semiconductor layer 411 is partially exposed so as to be connected to the third-2 electrode connection 401. The features of the contact holes 104 of the fourth light emitting cell 400 are the same as those of the contact holes 104 of the first to third light emitting cells 100, 200, 300.

Further, the fourth light emitting cell 400 includes a partially exposed region of the contact electrode 415 formed by partially removing the first insulation layer 416, the third-2 electrode connection 401 and the second insulation layer 417. For example, as shown in FIG. 30 and FIG. 37, a plurality of openings 402 may be disposed on the fourth light emitting cell 400 so as to expose the contact electrode 415 such that a second electrode pad 600 is electrically connected to the contact electrode 415 therethrough. The second electrode pad 600 may be electrically connected to the second conductive type semiconductor layer 413 through the contact electrode 415. As shown in FIG. 30, the contact electrode 415 may be exposed in a circular shape through the openings 402 arranged between the contact holes 104 formed in the fourth light emitting cell 400. However, it should be understood that the shape and arrangement of the openings are not limited thereto.

As shown in FIG. 31, the first electrode pad 500 is disposed on the first and second light emitting cells 100, 200 and the second electrode pad 600 is disposed on the third and fourth light emitting cells 300, 400. The first electrode pad 500 may be electrically connected to the contact-hole connection 101 through the openings 105 disposed on the first light emitting cell 100 and electrically connected to the first conductive type semiconductor layer 111 through the contact-hole connection 101. The second electrode pad 600 may be electrically connected to the contact electrode 415 through the openings 402 disposed on fourth light emitting cell 400 and electrically connected to the second conductive type semiconductor layer 413 through the contact electrode 415.

Each of the first electrode pad 500 and the second electrode pad 600 may be composed of a single layer or multiple layers and may include an electrically conductive material. For example, each of the first electrode pad 500 and the second electrode pad 600 may include at least one of Cu, Pt, Au, Ti, Ni, Al and Ag, and may also include sintered metal particles and non-metallic materials interposed between metal particles. Here, the first electrode pad 500 and the second electrode pad 600 may be formed by plating, deposition, dotting, screen-printing, and the like.

A distance between the first electrode pad 500 and the second electrode pad 600 may be 80 μm or less. With the structure wherein the first electrode pad 500 and the second electrode pad 600 cover the most regions of the first and second light emitting cells 100, 200 and the third and fourth light emitting cells 300, 400, the first electrode pad 500 and the second electrode pad 600 can provide improved bonding strength and good heat dissipation.

Figure 38:
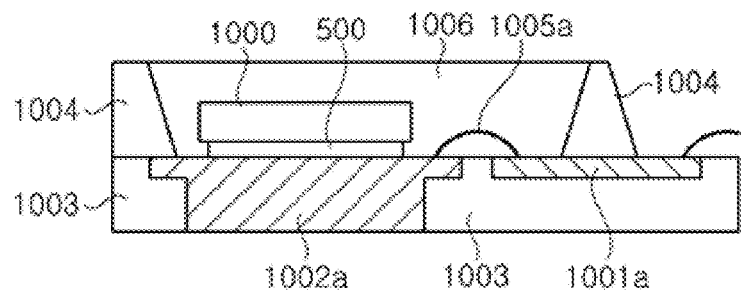
FIG. 38 is a schematic cross-sectional view of a module including the light emitting element according to the twelfth exemplary embodiment of the present disclosure.
Figure 39:
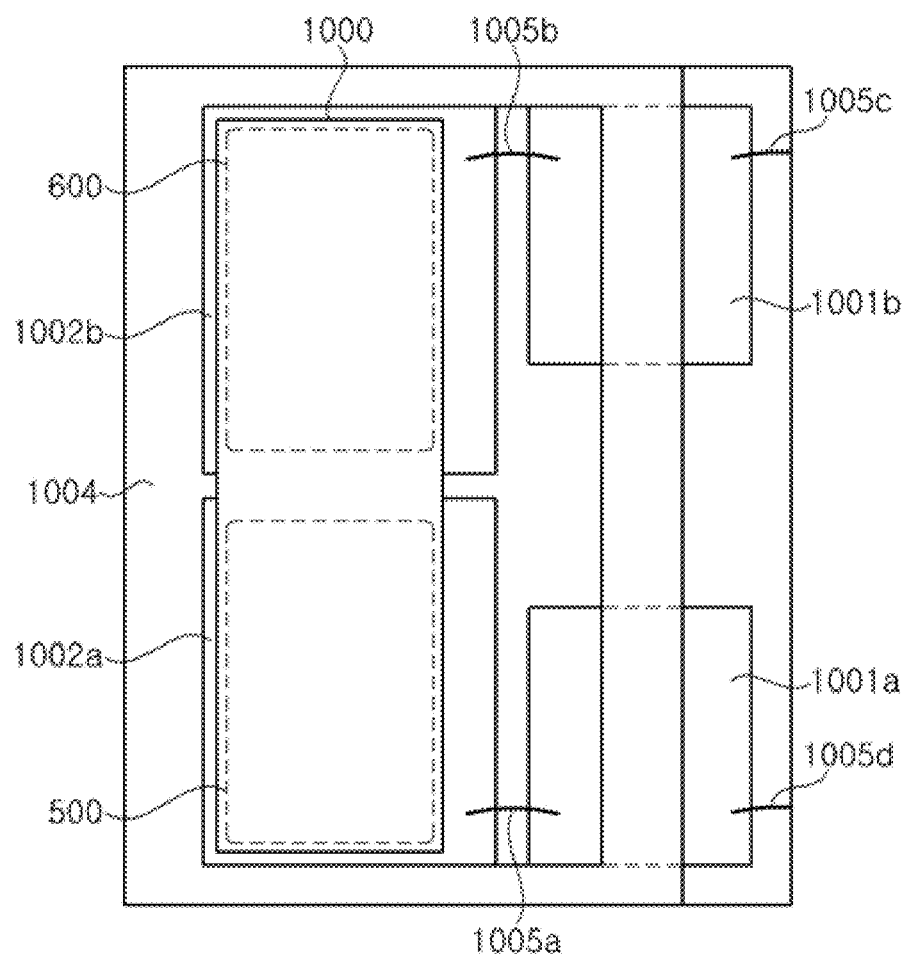
FIG. 39 is a schematic plan view of the module including the light emitting element according to the twelfth exemplary embodiment of the present disclosure.

FIG. 38 and FIG. 39 are a cross-sectional view and a plan view of a module including the light emitting element according to the twelfth exemplary embodiment of the present disclosure. The module may be applied to a headlamp for vehicles. The module may include the light emitting element 1000 described above, first and second electrode pads 500, 600, first and second conductive patterns 1001a, 1001b formed at a lower side of the light emitting element, first and second heat sinks 1002a, 1002b, a lower base 1003, an upper base 1004, a cavity 1006, and bonding wires 1005a, 1005b, 1005c, 1005d.

The first conductive pattern 1001a and the second conductive pattern 1001b are separated from each other on the lower base 1003. Some of the first conductive pattern 1001*a* and the second conductive pattern 1001*b* may be exposed from the cavity 1006 defined by the upper base 1004 so as to be freely connected to an external component. The upper base 1004 is disposed on the lower base 1003 and may be formed on the first and second conductive patterns 1001*a*, 1001*b* such that some of the first and second conductive patterns 1001*a*, 1001*b* are exposed. An inner wall of the upper base 1004, that is, a wall adjoining the cavity 1006, may be inclined. With this structure, the inner wall of the upper base 1004 reflects light emitted from the light emitting element 1000, thereby improving luminous efficacy of the module.

The first and second heat sinks 1002*a*, 1002*b* are disposed under the cavity 1004. The first and second heat sinks 1002*a*, 1002*b* are exposed from a lower surface of the lower base 1003 through the lower base 1003. The first and second electrode pads 500, 600 are connected to the first and second heat sinks 1002*a*, 1002*b*, respectively.

The bonding wires 1005*a*, 1005*b* connect the first and second heat sinks 1002*a*, 1002*b* to the first and second conductive patterns 1001*a*, 1001*b*, respectively. Thus, the first and second electrode pads 500, 600 are electrically connected to the first and second conductive patterns 1001*a*, 1001*b* through the first and second heat sinks 1002*a*, 1002*b* and the bonding wires 1005*a*, 1005*b*. The heat sink 1002*a*, 1002*b* may include a metal or metal alloy, particularly, a metal or metal alloy having high thermal conductivity. For example, the heat sinks 1002*a*, 1002*b* may include Cu, Al, and alloys of Cu and Al. An external voltage is applied to the first and second conductive patterns 1001*a*, 1001*b* through the bonding wires 1005*c*, 1005*d*, and then is applied to the first and second heat sinks 1002*a*, 1002*b* through the bonding wires 1005*a*, 1005*b*.

The cavity 1006 may be filled with a potting material, for example, silicone, and protect the light emitting element 1000 from external environments. Furthermore, phosphors may be disposed in the cavity 1006 or on the light emitting element in a predetermined pattern.

As such, the light emitting element according to the exemplary embodiments may be applied to the module according to the exemplary embodiment, particularly, a headlamp for vehicles, thereby improving reliability of the headlamp.

Figure 40:
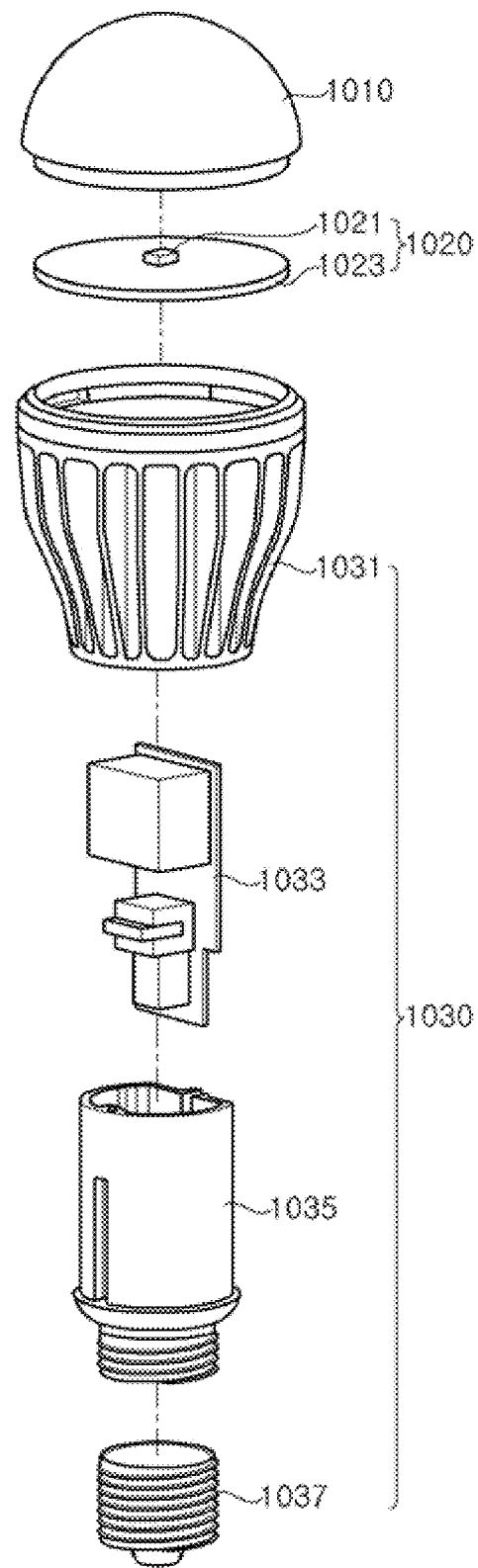
FIG. 40 is an exploded perspective view of a lighting apparatus to which a light emitting element according to one exemplary embodiment of the present disclosure is applied.

FIG. 40 is an exploded perspective view of a lighting apparatus to which a light emitting element according to one exemplary embodiment of the present disclosure is applied.

Referring to FIG. 40, the lighting apparatus according to this embodiment includes a diffusive cover 1010, a light emitting element module 1020, and a body 1030. The body 1030 may receive the light emitting element module 1020 and the diffusive cover 1010 may be disposed on the body 1030 to cover an upper side of the light emitting element module 1020.

The body 1030 may have any shape so long as the body can supply electric power to the light emitting element module 1020 while receiving and supporting the light emitting element module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting element module 1020, and may include at least one IC chip. The IC chip may regulate, change or control electric power supplied to the light emitting element module 1020. The power supply case 1035 may receive and support the power supply 1033. The power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and may serve as a passage through which power can be supplied from an external power source to the power supply 1033.

The light emitting element module 1020 includes a substrate 1023 and a light emitting element 1021 disposed on the substrate 1023. The light emitting element module 1020 may be disposed at an upper portion of the body case 1031 and electrically connected to the power supply 1033.

As the substrate 1023, any substrate capable of supporting the light emitting element 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting element 1021 may include at least one of the light emitting elements according to the exemplary embodiments described above.

The diffusive cover 1010 is disposed on the light emitting element 1021 and may be secured to the body case 1031 to cover the light emitting element 1021. The diffusive cover 1010 may be formed of a light-transmitting material and light orientation of the lighting apparatus may be adjusted through regulation of the shape and optical transmissivity of the diffusive cover 1010. Thus, the diffusive cover 1010 may be modified in various shapes depending on usage and applications of the lighting apparatus.

Figure 41A:
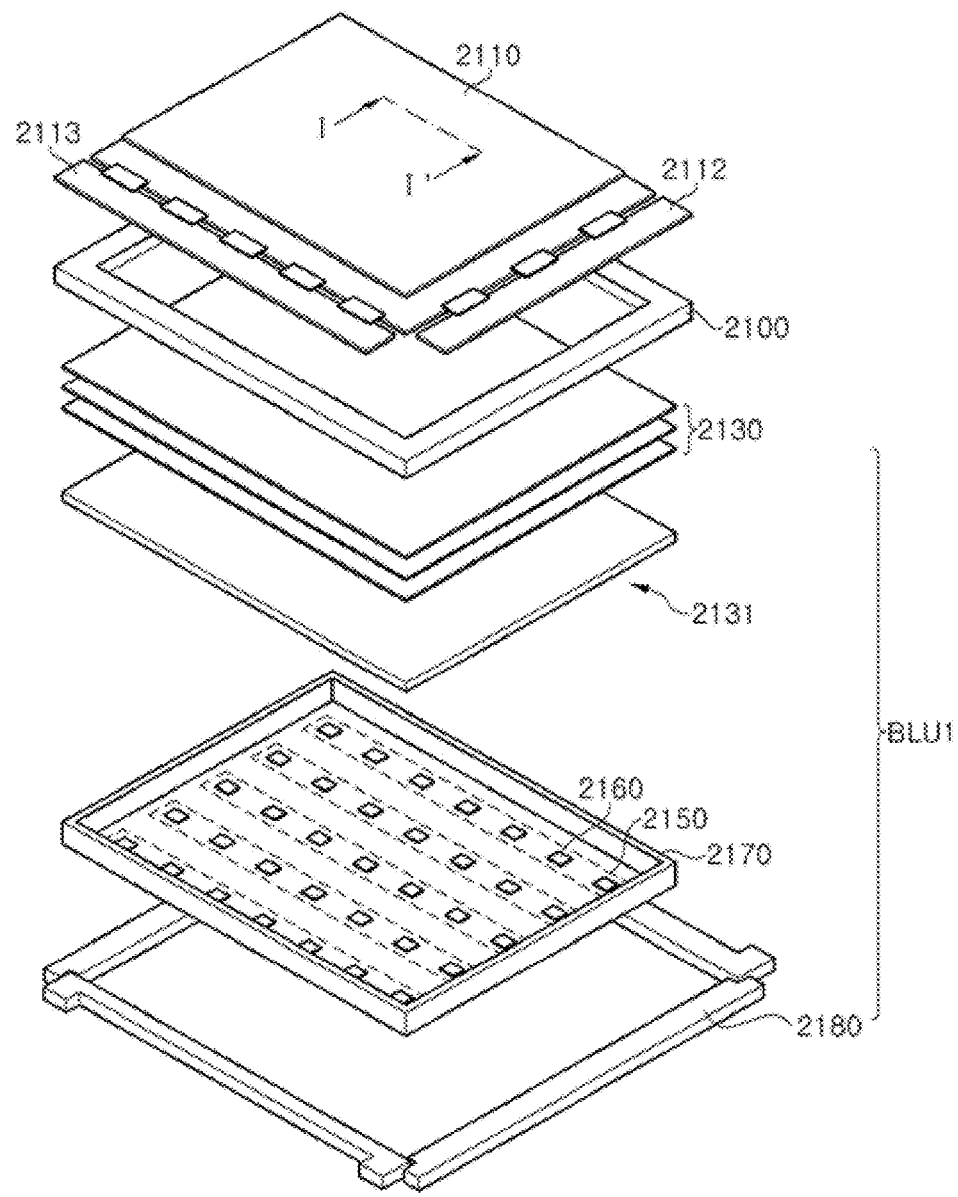
FIGS. 41A and 41B are cross-sectional views of one example of a display apparatus to which a light emitting element according to one exemplary embodiment of the present disclosure is applied.
Figure 41B:
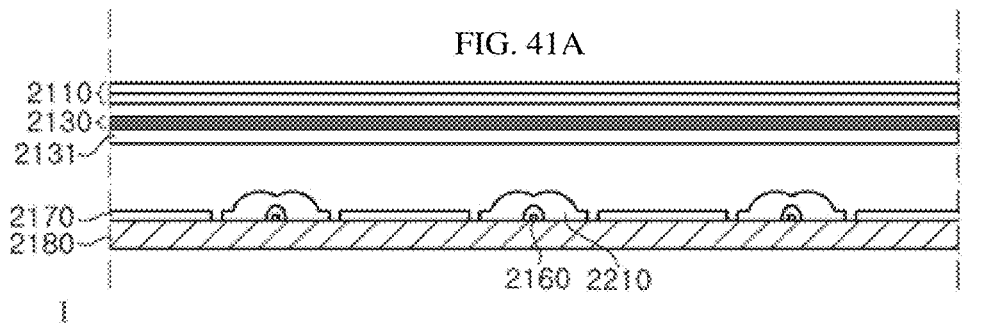

FIGS. 41A and 41B are cross-sectional views of one example of a display apparatus to which a light emitting element according to one exemplary embodiment of the present disclosure is applied.

The display according to this embodiment includes a display panel 2110, a backlight unit BLU1 supplying light to the display panel 2110, and a panel guide 2100 supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs 2112, 2113 may be formed on a thin film transistor substrate instead of being formed on separate PCBs.

The backlight unit BLU1 includes a light source module, which includes at least one substrate 2150 and a plurality of light emitting elements 2160. The backlight unit BLU1 may further include a bottom cover 2180, a reflective sheet 2170, a diffusive plate 2131, and optical sheets 2130.

The bottom cover 2180 may be open at an upper side thereof to receive the substrate 2150, the light emitting elements 2160, the reflective sheet 2170, the diffusive plate 2131, and the optical sheets 2130. In addition, the bottom cover 2180 may be coupled to the panel guide 2100. The substrate 2150 may be disposed under the reflective sheet 2170 to be surrounded by the reflective sheet 2170. Alternatively, when a reflective material is coated on a surface thereof, the substrate 2150 may be disposed on the reflective sheet 2170. Further, a plurality of substrates 2150 may be arranged parallel to one other, without being limited thereto. However, it should be understood that the light source module may include a single substrate.

The light emitting elements 2160 may include at least one of the light emitting elements according to the exemplary embodiments described above. The light emitting elements 2160 may be regularly arranged in a predetermined pattern on the substrate 2150. In addition, a lens 2210 may be disposed on each of the light emitting elements 2160 to improve uniformity of light emitted from the plurality of light emitting elements 2160.

The diffusive plate 2131 and the optical sheets 2130 are disposed on the light emitting element 2160. Light emitted from the light emitting element 2160 may be supplied in the form of sheet light to the display panel 2110 through the diffusive plate 2131 and the optical sheets 2130.

In this way, the light emitting elements according to the exemplary embodiments may be applied to direct type displays like the display according to this embodiment.

Figure 42A:
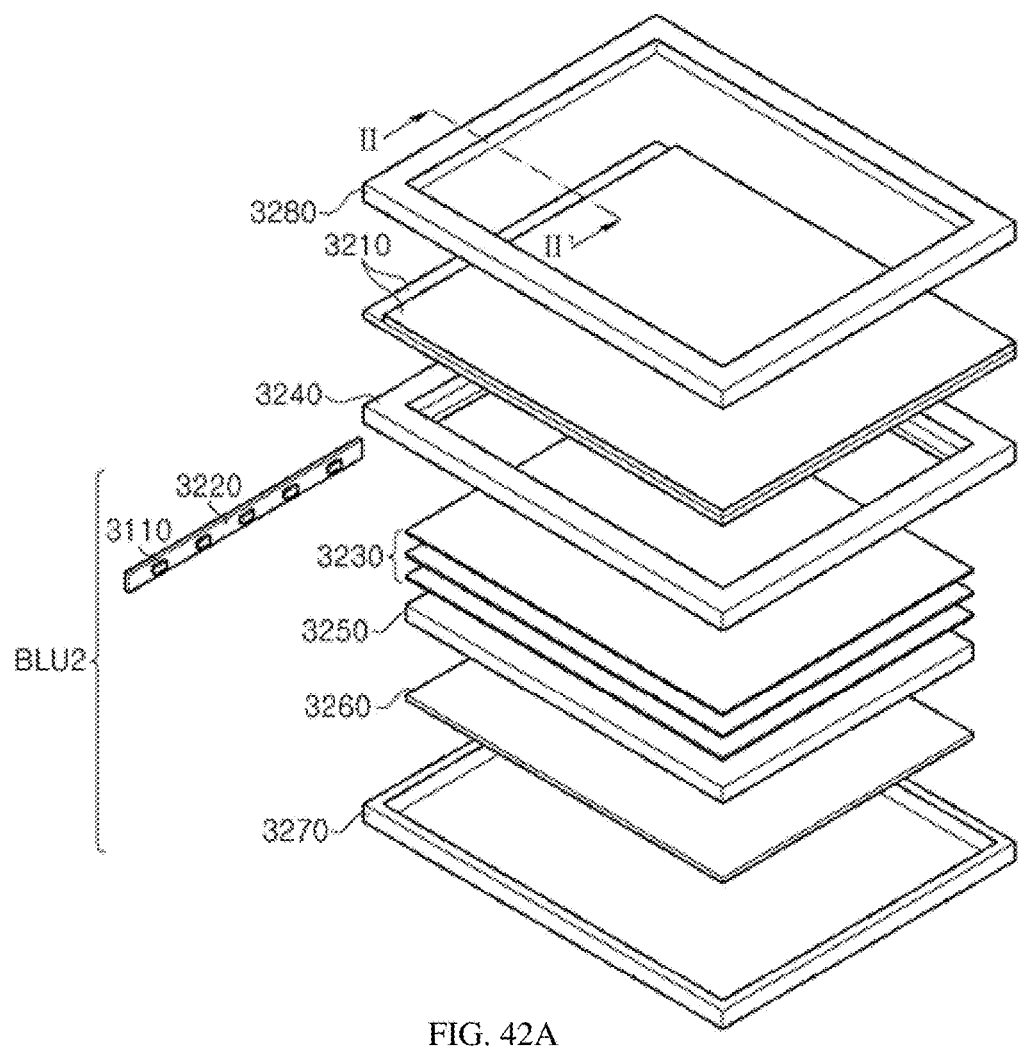
FIGS. 42A and 42B are cross-sectional views of another example of the display apparatus to which the light emitting element according to the exemplary embodiment of the present disclosure is applied.
Figure 42B:
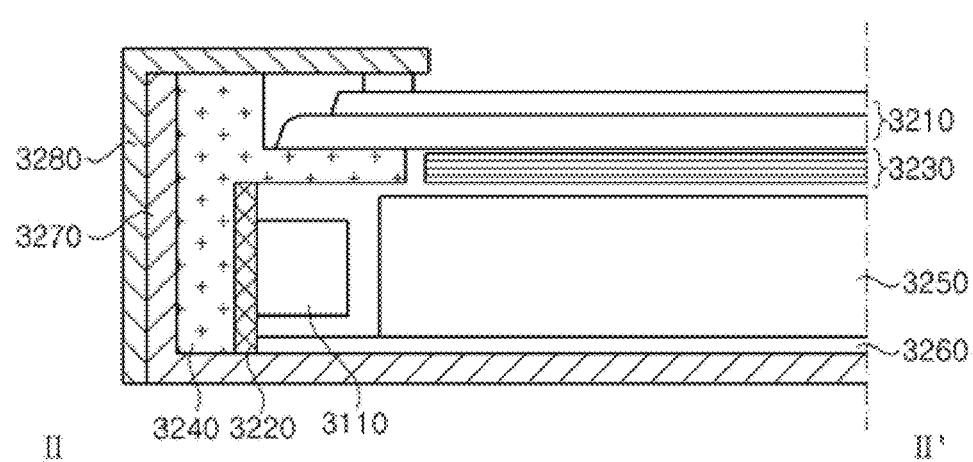

FIGS. 42A and 42B are cross-sectional views of another example of the display apparatus to which the light emitting element according to the exemplary embodiment of the present disclosure is applied.

The display according to this exemplary embodiment includes a display panel 3210 on which an image is displayed, and a backlight unit BLU2 disposed at a rear side of the display panel 3210 and emitting light thereto. Further, the display includes a frame 240 supporting the display panel 3210 and receiving the backlight unit BLU2, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit BLU2.

The backlight unit BLU2 supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit BLU2 according to this exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting elements 3110 arranged at constant intervals on one surface of the substrate 3220. As the substrate 3220, any substrate capable of supporting the light emitting elements 3110 and being electrically connected thereto may be used without limitation. For example, the substrate 3220 may include a printed circuit board. The light emitting elements 3110 may include at least one of the light emitting elements according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting elements 3110 into sheet light.

In this way, the light emitting elements according to the exemplary embodiments may be applied to edge type displays like the display according to this exemplary embodiment.

Figure 43:
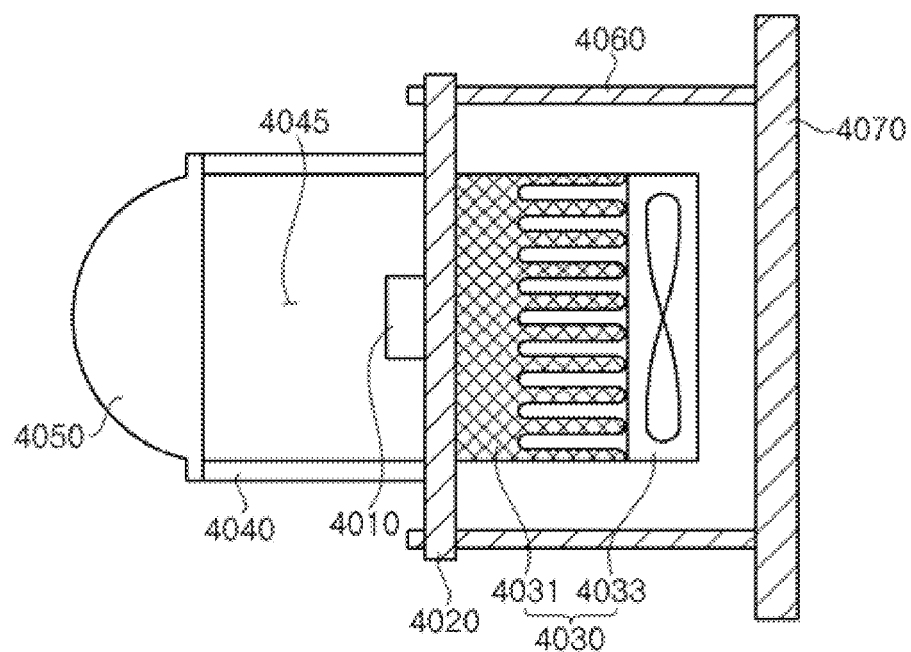
FIG. 43 is a cross-sectional view of a headlight to which a light emitting element according to one exemplary embodiment of the present disclosure is applied.

FIG. 43 is a cross-sectional view of a headlight to which a light emitting element according to one exemplary embodiment of the present disclosure is applied.

Referring to FIG. 43, the headlight according to this exemplary embodiment includes a lamp body 4070, a substrate 4020, a light emitting element 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting element 4010 may be used without limitation. For example, the substrate 4020 may include a substrate having a conductive pattern, such as a printed circuit board. The light emitting element 4010 is disposed on the substrate 4020 and may be supported and secured by the substrate 4020. In addition, the light emitting element 4010 may be electrically connected to an external power source through the conductive pattern of the substrate 4020. Further, the light emitting element 4010 may include at least one of the light emitting elements according to the exemplary embodiments described above.

The cover lens 4050 is disposed on a path of light emitted from the light emitting element 4010. For example, as shown in the drawing, the cover lens 4050 may be spaced apart from the light emitting element 4010 by the connection member 4040 and may be disposed in a direction of supplying light emitted from the light emitting element 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting element 4010, and thus may act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting element 4010.

In this way, the light emitting diodes according to the exemplary embodiment may be applied to headlights, particularly, headlights for vehicles, like the headlight according to this embodiment.

Although some exemplary embodiments are disclosed herein, it should be understood that these embodiments are not intended to be exclusive. For example, individual structures, elements or features of a particular embodiment are not limited to that particular embodiment and can be applied to other embodiments without departing from the spirit and scope of the present disclosure.

The invention claimed is:

1. A light emitting element comprising:
   a first light emitting cell;
   a second light emitting cell disposed coplanar with the first light emitting cell and electrically connected to the first light emitting cell, the first light emitting cell and the second light emitting cell positioned adjacent to each other along a first direction; and
   a plurality of electrode connections electrically connecting the first light emitting cell to the second light emitting cell, wherein the plurality of electrode connections extends from the first light emitting cell and is disposed on an upper surface of the second light emitting cell so as to cover a portion of the upper surface of the second light emitting cell, the plurality of electrode connections being disposed along one planar side of the second light emitting cell, the planar side of the second light emitting cell extending in a second direction, wherein the plurality of electrode connections is configured to provide physical contacts between electrodes of the first light emitting cell and the second light emitting cell at discrete, different portions along the planar side of the second light emitting cell, and wherein the physical contacts create concave shapes at discrete, different portions along the planar side of the second light emitting cell.

2. The light emitting element according to claim 1, wherein the first light emitting cell and the second light emitting cell are disposed such that one planar side of the first light emitting cell is adjacent to one planar side of the second light emitting cell.

3. The light emitting element according to claim 2, wherein the electrode connections are disposed at the one side of the second light emitting cell facing the one side of the first light emitting cell.

4. The light emitting element according to claim 1, wherein the first light emitting cell and the second light emitting cell are disposed such that one corner of the first light emitting cell is adjacent to one corner of the second light emitting cell, the corners of the first light emitting cell and the second light emitting cell having a planar shape, and the plurality of electrode connections extend from the first light emitting cell along the one side of the second light emitting cell.

5. The light emitting element according to claim 1, wherein each of the first and second light emitting cells comprises:
 a light emitting structure comprising a first conductive type semiconductor layer, a second conductive type semiconductor layer, and an active layer interposed between the first conductive type semiconductor layer and the second conductive type semiconductor layer;
 a first contact electrode and a second contact electrode disposed on the light emitting structure and forming ohmic contact with the first conductive type semiconductor layer and the second conductive type semiconductor layer, respectively; and
 an insulation layer partially covering the first contact electrode and the second contact electrode to insulate the first contact electrode and the second contact electrode.

6. The light emitting element according to claim 5, wherein the insulation layer comprises:
 a first insulation layer covering the second contact electrode and having a first opening and a second opening partially exposing the first conductive type semiconductor layer and the second contact electrode, respectively; and
 a second insulation layer covering the first contact electrode covering the first insulation layer, and having a third opening and a fourth opening partially exposing the first contact electrode and the second contact electrode, respectively.

7. The light emitting element according to claim 6, wherein the first insulation layer comprises a pre-insulation layer partially covering an upper surface or a side surface of the light emitting structure; and a main insulation layer covering the pre-insulation layer and the second contact electrode.

8. The light emitting element according to claim 5, wherein the first contact electrode of the first light emitting cell extends to an upper surface of the light emitting structure of the second light emitting cell and forms ohmic contact with the second contact electrode.

9. The light emitting element according to claim 5, wherein each of the first and second light emitting cells comprises a mesa comprising the second conductive type semiconductor layer and the active layer, and the first insulation layer comprises a pre-insulation layer partially covering an upper surface of the mesa.

10. The light emitting element according to claim 9, wherein the second contact electrode forms ohmic contact with the second conductive type semiconductor layer on the mesa.

11. The light emitting element according to claim 5, further comprising:
 a substrate disposed under the light emitting structure,
 wherein the substrate comprises a plurality of patterns formed on an upper surface thereof.

12. The light emitting element according to claim 11, wherein some patterns formed on the substrate and exposed instead of being covered by the light emitting structure have a smaller size than the remaining patterns covered by the light emitting structure.

* * * * *